United States Patent
Yamaguchi et al.

(10) Patent No.: US 7,653,115 B2
(45) Date of Patent: *Jan. 26, 2010

(54) SEMICONDUCTOR LASER DEVICE AND SOLID-STATE LASER DEVICE USING THE SAME

(75) Inventors: Satoshi Yamaguchi, Oita (JP); Naoya Hamada, Futtsu (JP)

(73) Assignees: Nippon Steel Corporation, Tokyo (JP); Nippon Bunri University School of Engineering, Oita (JP)

( * ) Notice: Subject to any disclaimer, the term of this patent is extended or adjusted under 35 U.S.C. 154(b) by 21 days.

This patent is subject to a terminal disclaimer.

(21) Appl. No.: 10/473,961

(22) PCT Filed: Mar. 12, 2002

(86) PCT No.: PCT/JP02/02314

§ 371 (c)(1),
(2), (4) Date: Sep. 30, 2003

(87) PCT Pub. No.: WO02/082163

PCT Pub. Date: Oct. 17, 2002

(65) Prior Publication Data

US 2004/0091013 A1    May 13, 2004

(30) Foreign Application Priority Data

Mar. 30, 2001 (JP) .............................. 2001-101454

(51) Int. Cl.
*H01S 3/08* (2006.01)
(52) U.S. Cl. ..................... 372/101; 372/98; 372/100; 359/834
(58) Field of Classification Search ................ 359/834; 372/98, 100, 101
See application file for complete search history.

(56) References Cited

U.S. PATENT DOCUMENTS 5,168,401 A    12/1992    Endriz ........................ 359/627

(Continued)

FOREIGN PATENT DOCUMENTS

EP    484276    10/1991

(Continued)

OTHER PUBLICATIONS

M.W. Beijersbergen et al., "Astigmatic laser mode converters and transfer of orbital angular momentum", Optics Communications 96 (1993), pp. 123-132 North-Holland, Technical Publication, Aug. 17, 1992.

*Primary Examiner*—Minsun Harvey
*Assistant Examiner*—Tod T Van Roy
(74) *Attorney, Agent, or Firm*—Baker Botts LLP

(57) ABSTRACT

A semiconductor laser device with the energy density increased at the focal point and a LD pumped solid-state laser device configured of the particular semiconductor laser device are provided. A stack array laser element for radiating a two-dimensional array of laser beams includes a plurality of parallel laser beam columns each aligned in the form of dotted lines. In front of the stack array laser element, each laser beam column collimated by being refracted in the direction substantially perpendicular to the direction of the dotted line is received, and radiated by turning at right angles to the direction of the laser beams from each emitter or emitter group. In this way, the laser beams are converted into a plurality of substantially ladder-shaped parallel laser beam columns. These parallel laser beam columns are compressed to form parallel laser beam columns in alignment. Each compressed one of parallel laser beam columns is turned at right angles and radiated. Thus, all the laser beams are converted into a plurality of aligned parallel laser beams, which are collimated and condensed at a focal point.

78 Claims, 38 Drawing Sheets

U.S. PATENT DOCUMENTS

| | | |
|---|---|---|
| 5,369,661 A | 11/1994 | Yamaguchi et al. |
| 5,513,201 A | 4/1996 | Yamaguchi et al. |
| 5,790,576 A * | 8/1998 | Waarts et al. ............ 372/50.23 |
| 5,808,323 A | 9/1998 | Spaeth et al. ................. 257/88 |
| 5,969,872 A | 10/1999 | Ben Oren et al. |
| 6,044,096 A * | 3/2000 | Wolak et al. .................. 372/36 |
| 6,115,185 A | 9/2000 | Du et al. |
| 6,124,973 A | 9/2000 | Du et al. ..................... 359/618 |
| 6,356,577 B1 * | 3/2002 | Miller ....................... 372/107 |
| 6,504,650 B1 * | 1/2003 | Alfrey ........................ 359/627 |
| 6,556,352 B2 * | 4/2003 | Wang et al. ................. 359/641 |
| 7,079,566 B2 * | 7/2006 | Kido et al. .................. 372/101 |
| 7,230,968 B2 * | 6/2007 | Imai et al. ................... 372/101 |

FOREIGN PATENT DOCUMENTS

| | | |
|---|---|---|
| JP | A 05-121803 | 5/1993 |
| JP | 675188 | 3/1994 |
| JP | A 07-98402 | 4/1995 |
| JP | A 07-287104 | 10/1995 |
| JP | A 07-287105 | 10/1995 |
| JP | A 00-284151 | 10/2000 |

\* cited by examiner

SEMICONDUCTOR LASER DEVICE AND SOLID-STATE LASER DEVICE USING THE SAME

CROSS-REFERENCE TO RELATED APPLICATION(S)

This application is a national stage application of PCT Application No. PCT/JP02/02314 which was filed on Mar. 12, 2002 and published on Oct. 17, 2002 as International Publication No. WO 02/082163 (the "International Application"). This application claims priority from the International Application pursuant to 35 U.S.C. § 365. The present application also claims priority under 35 U.S.C. § 119 from Japanese Patent Application No. 2001-101454, filed on Mar. 30, 2001, the entire disclosure of which is incorporated herein by reference.

FIELD OF THE PRESENT INVENTION

The present invention relates to a beam converter using a stack array laser diode and a laser device using the beam converter. The present invention further relates to a semiconductor laser condenser for condensing the semiconductor laser light into a minuscule spot and a semiconductor laser (laser diode—"LD") pumped solid-state laser device for optically exciting a solid-state laser device with the semiconductor laser light.

BACKGROUND INFORMATION

YAG (yttrium aluminum garnet) has been used as a laser for laser machining and medical applications. The YAG laser which is a solid-state laser, however, has a low electrical-to-optical conversion efficiency. This is due to the fact that the Xe lamp and the flash lamp of the conventional YAG laser used for exciting the solid-state laser medium is very low in luminous efficiency. Also, the luminous spectrum band of the above-mentioned lamp is so wide that only a small portion of the luminous energy can be used for the solid-state laser excitation. Normally, therefore, a bulky device and a large amount of cooling water are required.

On the other hand, the semiconductor laser ("LD") has a high luminous efficiency and is so compact that no bulky cooling unit is required. In recent years, the price of the high-power semiconductor laser has conspicuously decreased. This semiconductor laser can be desirably used also for the laser machining. The beam quality of the semiconductor laser, however, is generally so low and the output power level of the single-stripe semiconductor laser is limited. Therefore, the semiconductor laser is generally can be used directly for laser machining only in the limited fields of application.

A multi-stripe semiconductor laser, in which 10 to 100 stripes of junction for radiating the laser beams are linearly arranged to provide a dashed-line light source, is known as a high-power laser.

A linear-array semiconductor laser of about 50 W in CW (continuous wave oscillation) output with the junction of the semiconductor laser aligned one-dimensionally is available. In the multi-stripe array semiconductor laser, as shown in FIG. 1, for example, tens to several tens of stripes 100 μm to 200 μm wide with each facet making up an emitter are arranged at regular intervals within a plane 1 cm wide.

Several layers of this linear array semiconductor are stacked into a two-dimensional array as shown in FIG. 1, thereby making it possible to easily increase the output. This two-dimensional array semiconductor laser is referred to as the stack array semiconductor laser.

As described above, one semiconductor laser device provides a light source with line segments arranged in a two-dimensional array for emitting laser beams in the number of n multiplied by ten to several tens, where n is the number of stacked layers. Also, a high-power semiconductor laser such as the quasi-CW semiconductor laser provides a light source, in which substantially continuous linear light sources in the number of stacked layers are arranged comprising a multiplicity of closely-arranged emitters in which each emitted light beam is mixed with a light beam immediately after emission from an adjoining emitter.

In order to use a multi-stripe array semiconductor laser in laser machining and medical applications, certain ways should be devised to concentrate high-level energy in a narrow area. Each striped light beam is emitted from a flat light source, and the beam divergent angle has a component φ perpendicular to the junction which is as large as about 40 to 50 degrees, while the component θ parallel to the junction is about 10 degrees. The width of the light source includes the vertical portion as small as not more than 1 μm and the horizontal portion as wide as 100 μm to 200 μm as described above.

The above-mentioned characteristics of the semiconductor laser are such that in the case where the light emitted from the semiconductor laser is focused using a lens, the vertical component can be focused easily, while the horizontal component is not easily focused into a small spot due to a large width and a smaller divergent angle than the vertical component.

The light emitted from a stack array laser diode can be focused into a linear line by use of a cylindrical lens for each linear array, but cannot be easily focused in a dot spot.

A comparatively efficient focusing can be achieved, on the other hand, by a method in which micro lenses are arranged in one-to-one correspondence with stripes, whereby each beam from stripe is collimated and focused thereby to superimpose a plurality of beams. The spot diameter of the reduced beam is the product of the width of the light source and the magnification (f2/f1) determined by the ratio of the distance between the focusing lens and the beam spot (i.e. the focal length f2 of the focusing lens) to the distance between the semiconductor laser stripes and the micro lens (i.e. the focal length f1 of the micro lens).

Thus, the long diameter ω1 (horizontal component) of the beam spot is equal to the product (ω0·f2/f1) of the width of the stripe (ω0: 100 μm to 200 μm) and the aforementioned magnification. As to the vertical component, on the other hand, a spot diameter does not become large by multiplying the same ratio (f2/f1) due to a very small width of the light source (not more than 1 μm). Considering the transverse focusing of the stripe, therefore, the micro lens is desirably arranged as distant from the stripe as possible to secure a small beam spot and a high light intensity.

Due to a large divergence angle of the vertical component of the stripe light beam and hence a large radiation energy leaking out of the lens aperture, however, it is difficult to arrange the micro lens as described above. In an alternative idea, therefore, the vertical and horizontal components are focused by different cylindrical lenses, so that the lens for focusing the vertical component is arranged in one-to-one correspondence with each linear array semiconductor laser in proximity to the stripes, while the lens for focusing the horizontal component is arranged in one-to-one relation with each equivalent stripe group of the stack layer distant from the stripes.

As an example, a stack array LD is considered in which 12 stripes each 1 μm thick and 200 μm wide are spaced 800 μm apart, and the linear arrays are stacked in several layers. The horizontal component of the emitted beam from the stripe has a beam divergent angle of 10 degrees. Therefore, the beam emitted from the adjoining stripes are superposed with each other at the distance of 3.4 mm from the light-emitting facet of the stripe. In the case where a lens is placed after the superposition, part of the light beams is converted into a light ray at an angle to the lens axis and is focused at a point different from the focal point of the focusing lens, thereby reducing the system efficiency.

In order to collimate the light radiated from each stripe group using a micro cylindrical lens array, therefore, a lens (having a focal length f1 of not larger than 3.4 mm) is required to be placed at a position as near as not more than 3.4 mm. The diameter of the focused spot is unavoidably large, if determined as the product of the stripe width and the magnification (f2/f1) dependent on the combination with the focal length f2 of the focusing lens.

In conventional arrangement and methods, as described above, the laser beam emitting from the stack array LD providing a light source comprising two-dimensional array of line segments cannot be easily concentrated with high density in a small area.

Also, according to the end surface excitation method using the optical excitation from the direction of the optical axis of the LD pumped solid-state laser, a highly efficient single transversal-mode oscillation can be realized by matching the space excited by the semiconductor laser output light with the oscillation mode volume of the solid-state laser.

In the stack array semiconductor laser oscillation element with the junction of the semiconductor laser arranged two-dimensionally, the output of about 1 kW is obtained and sufficiently usable for the laser machining. If this stack array laser beam is directly focused using an optical system and can be reduced to a sufficiently small spot, the output of the semiconductor laser should be usable for the laser machining.

In the case where the light emitted from the stack array semiconductor laser source is focused using a lens, however, the vertical component can be focused with comparative ease, whereas the horizontal component is difficult to focus to a minuscule spot due to the large width of the light source.

An attempt to use the stack array semiconductor laser as an excitation source for the solid-state laser leads to the result that the end surface excitation method having a high excitation efficiency cannot be employed because a plurality of beams cannot be focused to a single spot using a conventional lens system due to the fact that the array width is about 1 cm. Therefore, only the side pumping method is utilized.

SUMMARY OF THE PRESENT INVENTION

In view of the problem described above, one of the objects of the present invention is to provide a semiconductor laser device using a stack array semiconductor laser with an increased energy density at the focal point.

Another object of the present invention is to provide a novel beam converter comprising a semiconductor laser device using a stack array semiconductor laser in which the energy density can be increased by minimizing the focal spot size of the semiconductor laser device.

Still another object of the present invention is to provide a highly efficient and high power LD pumped solid-state laser device using the semiconductor laser device described above.

In order to achieve the objects described above, an exemplary embodiment of a semiconductor laser device according to according to the present invention is provided. This laser device has a stack array laser diode which includes a plurality of thin emitters aligned along the long axis thereof two-dimensionally for radiating laser beams. The device also has a first collimator is provided for parallelizing (collimating) the laser beams radiated from each emitter or an emitter group including a plurality of the emitters, along the direction perpendicular to the long axis of the emitters for each stack layer, and a first beam converter for converting the laser beams parallelized in one direction into laser beams turned substantially at right angles to the long axis of one or the plurality of the emitters and outputting the laser beams parallelized in ladder form for each layer. Further, this device includes a beam compressor for shortening the intervals of the ladder steps of the laser beams parallelized in ladder form and thus converting the laser beams into those compressed for each layer, a second beam converter for turning each compressed laser beam group substantially at right angles to the long axis thereof and outputting by converting all the laser beams into those aligned in parallel in the form of one ladder, a second collimator for parallelizing the laser beams output from the second beam converter in the direction corresponding to the long axis of the emitters, and a focusing element for focusing the laser beams parallelized in the two directions at a focal point.

In order to achieve the objects described above, the first beam converter according to the present invention includes a plurality of optical elements for receiving the light beams radiated in the form of slits from a light source and emitting while turning the slits substantially at right angles along the optical axis in the cross section of the light beams, and the plurality of the optical elements are arranged in a two-dimensional array with the light-receiving surface and the light-emitting surface of each optical element adjoining each other at positions corresponding to the radiation surface of the stack array laser diode.

For example, the beam converter according to the present invention can be so configured that the direction of the laser beams radiated from each linear emitter or each linear emitter group of a stack array semiconductor laser is turned substantially at right angles along the optical axis.

In order to achieve at least some of the objects described above, the beam compressor according to the present invention can be so configured that a plurality of columns of parallel laser beams radiated in the form of slits at large intervals are received and converted into columns of aligned parallel laser beams compressed into the form of closer parallel slits.

In order to achieve at least some of the objects described above, the second beam converter according to the present invention can be so configured such that the parallel laser beams compressed into the form of close aligned slits at smaller intervals and radiated from the beam compressor are received and turned in the direction substantially at right angles along the optical axis in the cross section of the compressed laser beams by a plurality of optical elements, which are linearly arranged with the light-receiving surface and the light-emitting surface thereof arranged adjacently to each other in correspondence with the radiation surface of the beam compressor.

For example, the laser beams radiated from one or a plurality of linear emitters of a stack array semiconductor laser through the first beam converter, the beam compressor and the second beam converter are turned twice each substantially at right angles along the optical axis in the direction corresponding to the slits, and thus converted into laser beams in which all the emitters or all the emitter groups are converted into a single column of parallel emitters.

In order to achieve still another object of the present invention described above, a further exemplary embodiment of the LD pumped solid-state laser device according to the present invention has an end surface by way of which the exciting light beams of the solid-state laser device are incident at the focal point of the laser beams output from the semiconductor laser device.

DETAILED DESCRIPTION

The present invention is explained in detail below with reference to the accompanying drawings.

Figure 1:
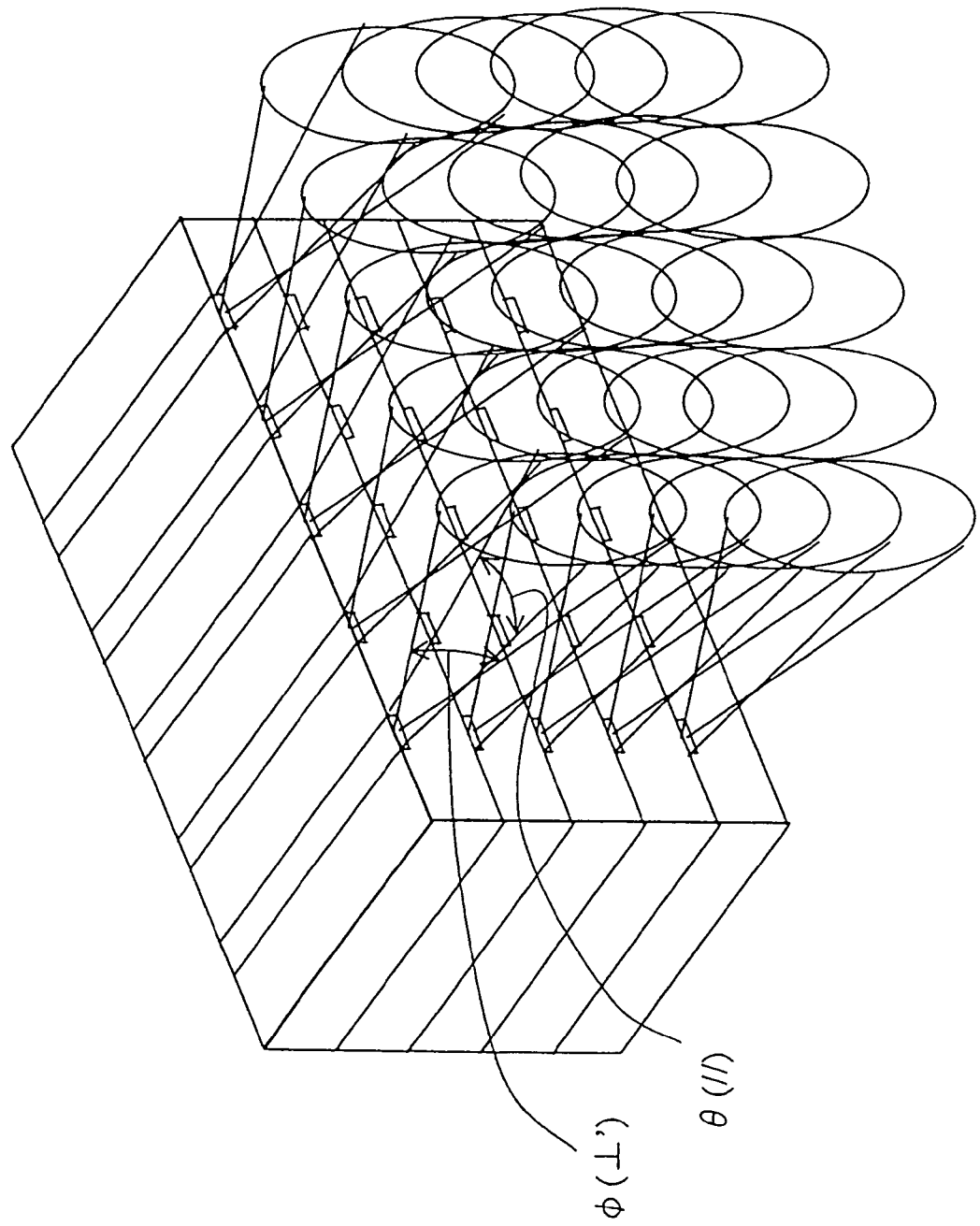
FIG. 1 is a diagram for explaining a stack array laser diode and the directivity of the laser beam.
Figure 2:
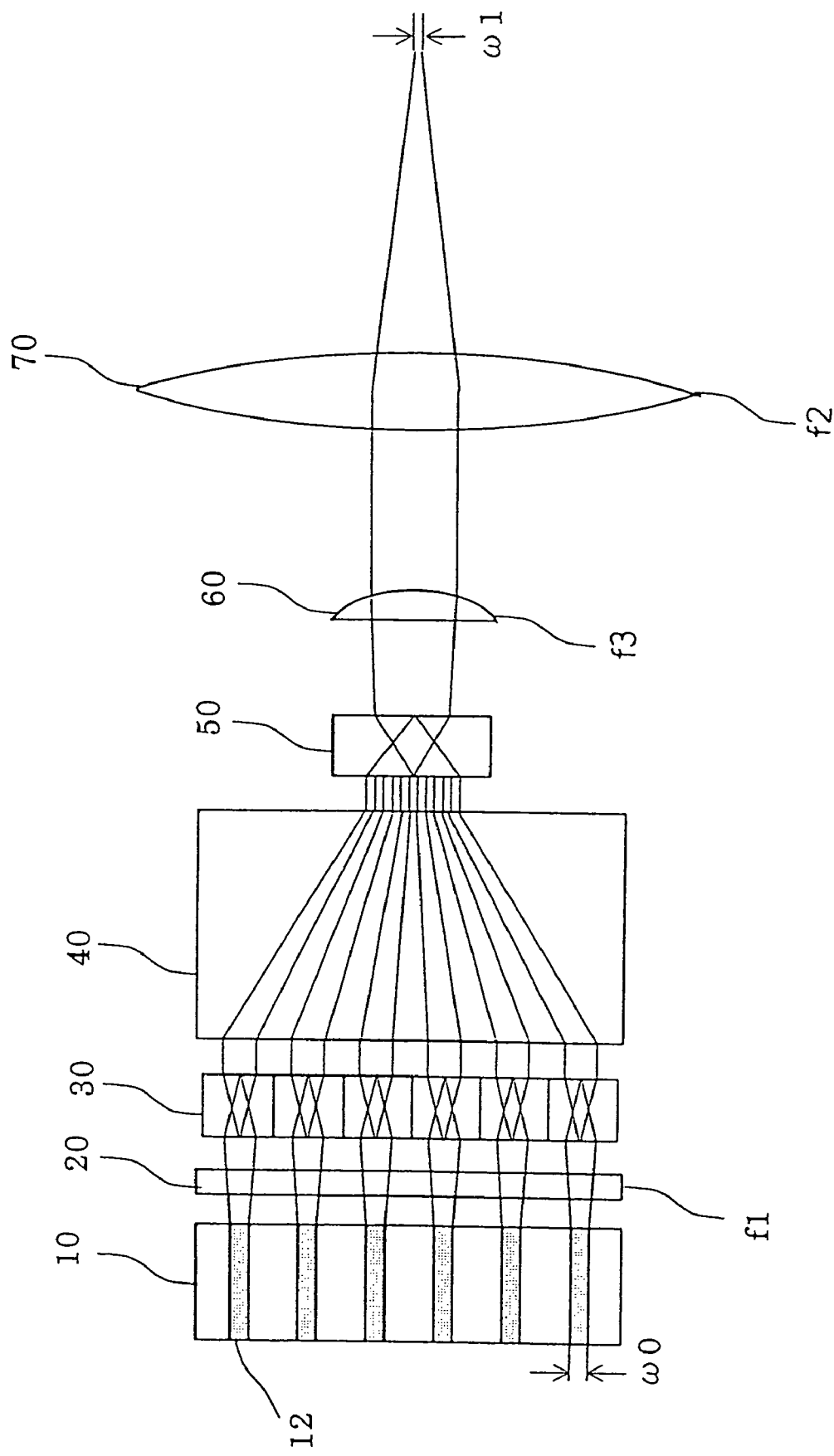
FIG. 2 is a plane view showing an exemplary embodiment of a semiconductor laser device according to the present invention.
Figure 3:
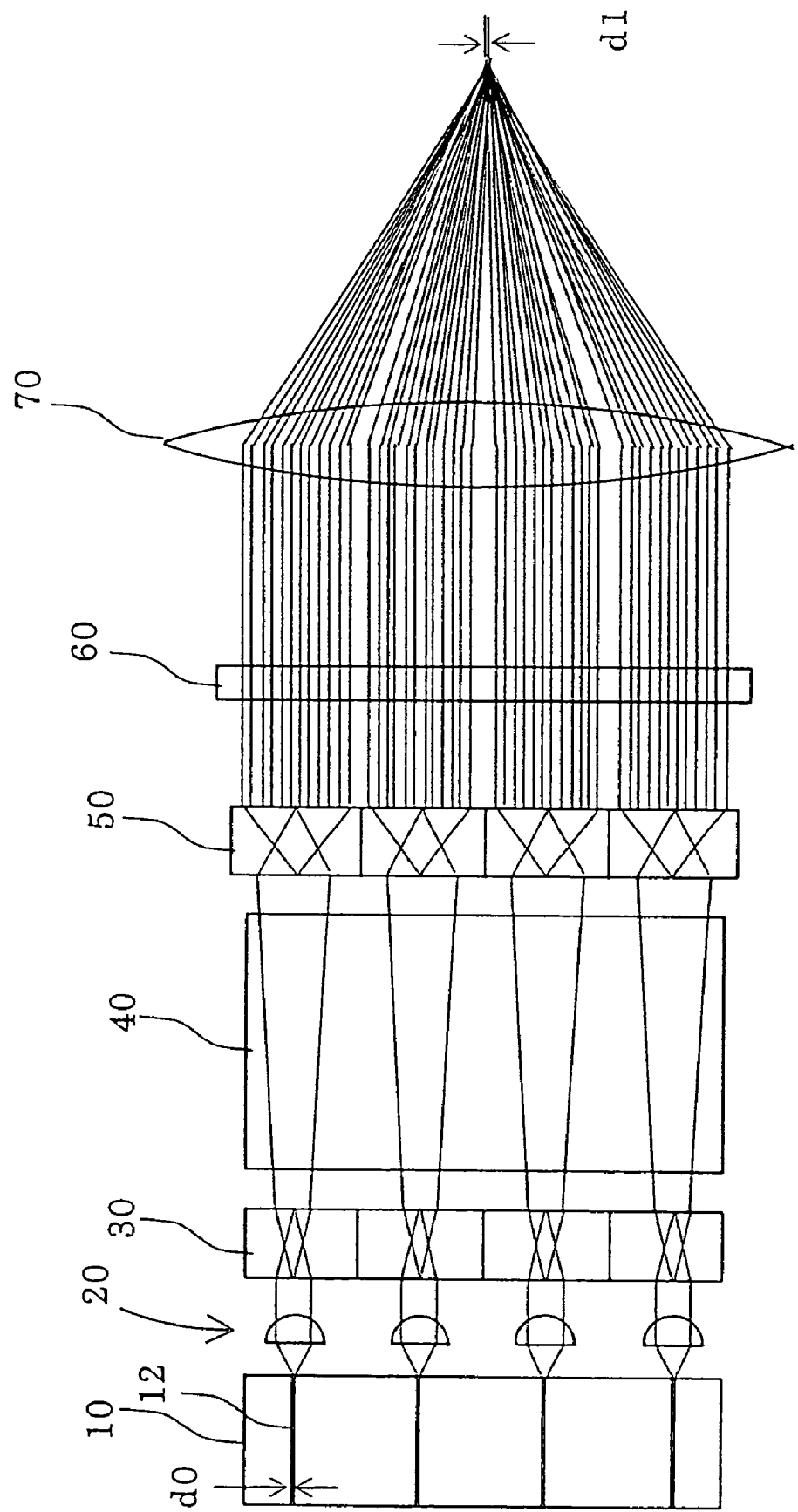
FIG. 3 is an elevation of the semiconductor laser device shown in FIG. 2.

FIG. 2 is a plane view of a semiconductor laser device according to the present invention, and FIG. 3 an elevation thereof.

A stack array semiconductor laser 10 includes a plurality of linear array semiconductor lasers stacked (in four layers in the drawing) to the height of 5 mm to 40 mm, each linear array semiconductor laser having laser-radiating 10 to 100 (only six are shown in the drawings for the sake of convenience) junction stripes 12 which are aligned over the width of about 10 mm.

Each junction stripe 12 is 100 µm to 200 µm wide and 0.1 µm to 1 µm thick, for example. The laser beams are radiated from an end surface of each junction stripe at a radiation angle of 40 to 50 degrees along the thickness and 10 degrees along the width, thereby providing a light source of the stack array semiconductor laser 10. The junction stripes are arranged in alignment at the end portion of the linear array semiconductors, and therefore the stack array semiconductor laser provides a light source with line segments aligned in a two-dimensional array.

A first cylindrical lens array 20 has the ability to converge the laser beams emitted from the stack array semiconductor laser 10, along the thickness of the junction stripes and parallelize the light components dispersed in the direction perpendicular to the junction stripes. The first cylindrical lens array 20 has an equal thickness along the width thereof, so that the laser beams proceed there through substantially linearly and therefore, the radiation angle of the laser beams along the width remains almost the same at about 10 degrees.

A first beam converter 30 so operates that the cross section of the laser beams output from the first cylindrical lens array 20 is rotated by about 90 degrees with respect to the incident light. The first beam converter 30 includes a plurality of optical elements arranged in a two-dimensional array in one-to-one correspondence with the junction stripes 12 of the stack array semiconductor laser 10.

The laser beams which are dispersed at an angle of about 10 degrees along the width and parallelized along the thickness by the first cylindrical lens array 20 (FIG. 3) are rotated by about 90 degrees, for each junction stripe, by the first beam converter 30, and thus converted into laser beams having the radiation angle of about 10 degrees along the thickness and parallel along the width (FIG. 2). Alternatively, the optical elements may each correspond to a stripe group including a plurality of junction stripes.

The laser beams converted by being rotated by about 90 degrees are arranged in parallel in the same number as the junction stripes or the junction stripe groups, as the case may be. Therefore, the light beams radiated from the stack array semiconductor laser 10 are arranged substantially in the same manner as if the junction stripes are arranged in parallel like a ladder and a plurality of the ladders each having parallel ladder steps are further arranged in parallel two-dimensionally.

The beam compressor 40 compresses the laser beams by shortening the intervals between the ladder steps of the parallel laser beams. The laser beams thus compressed are further aligned along the height of the stack array semiconductor laser.

The cross sections of the compressed laser beams output from the beam compressor 40 are collectively rotated by about 90 degrees with respect to the incident light by the second beam converter 50. The second beam converter 50 includes a plurality of optical elements aligned along the height of the stack array semiconductor laser in one-to-one correspondence with the compressed laser beams from the compression optical system 40.

As a result, the laser beams of all the laser beam groups emitted from the junction stripes come to make up a group of parallel laser beams in alignment. Each of the parallel laser beams in alignment, as described above, may alternatively correspond to a group of stripes including a plurality of junction stripes instead of a single stripe.

A second cylindrical lens 60 is arranged in parallel to the height of the stack array semiconductor laser. The laser beams radiated from the stack array semiconductor laser 10 and passed through the cylindrical lens array 20, the first beam converter 30, the beam compressor 40 and the second beam converter 50 have, for each junction stripe, a parallel component perpendicular to the junction stripes and have a radiation angle of 10 degrees along the width of the junction stripes. In view of this arrangement of the parallel laser beams, the laser beams have a radiation angle of about 10 degrees, as a whole, along the direction parallel to the junction of the semiconductor laser. The second cylindrical lens 60 receives these laser beams and parallelizes them along the width. Thus, the laser beams become parallel in two directions.

The laser beams now completely parallelized through the second cylindrical lens are focused at a small beam spot by a focusing lens 70. f1 can be the focal length of the first cylindrical lens 20, f3 the focal length of the second cylindrical lens 60, f2 the focal length of the focusing lens 70, ω0 the width of each junction stripe and d0 the thickness thereof. The width ω1 and the thickness d1 of the beam spot of the laser from each junction stripe are determined as follows:

$$d1 = d0 \cdot f2/f1$$

$$\omega1 = \omega0 \cdot f2/f3$$

To obtain a sharp spot, therefore, the larger the values f1 and f3, the better. When considering that ω0 is 100 µm to 200 µm and d0 is 0.1 µm to 1 µm, the magnitude of f1, as compared with f3, is out of the question. In the case where ω0 is 200 µm, the spacing at which the stripes are arranged is 800 µm, the radiation angle along the long axis of the junction stripes is 10 degrees and the spacing at which the stack layers are arranged is 4 mm, for example, the laser beams from adjacent stripes are superposed along each long axis at the distance of 3.4 mm from the end surface of the stripes from which the laser beams are emitted.

If the output energy is to be efficiently used without resorting to the present invention, therefore, both the first and second cylindrical lenses are required to be arranged at the distance of not more than 3.4 mm from the stripe surface. For the laser beams to be parallelized, therefore, both f1 and f3 are preferred to be 3.4 mm at most.

Assume that the first cylindrical lens having a proper value of f1 smaller than 3.4 mm and the first beam converter are placed at the distance of not larger than 3.4 mm from the end surface of the stripes from which the laser beams are emitted, and the laser beams are rotated by the first beam converter. Then, the laser beams are parallelized and not superposed with each other along the direction parallel to the junction.

Instead, the laser beams come to expand at an angle of about 10 degrees in the direction perpendicular to the junction. As a result, the laser beams of adjacent stack layers are superposed at the position on the light path 21.7 mm from the stripe surface. In view of this, assume that the beam compressor and the second beam converter are placed at the position of not more than 21.7 mm and the laser beams are rotated by the second beam converter. Then, the laser beams become parallel and are not superposed with each other in the direction perpendicular to the junction. The laser beams thus come to expand at an angle of about 10 degrees in the direction parallel to the junction.

In order to convert this radiated light into parallel light beams by the second cylindrical lens, the focal length f3 is required to be sufficiently large. Specifically, an appropriate value f3 including but not limited to 3.4 mm or 21.7 mm can be selected. In the case where the same value as the focal length f2 of the focusing lens is selected, for example, the width ω1 of the beam spot is given as 200 μm.

In this manner, with the laser device according to the present invention, the width ω1 and the thickness d1 of the beam spot can be reduced to a sufficiently small value, so that a high intensity laser can be produced in which the output of the linear array laser diode is efficiently utilized. The laser device according to the present invention, therefore, can find applications in the laser beam machining or the medical fields as a laser surgical knife.

Figure 4:
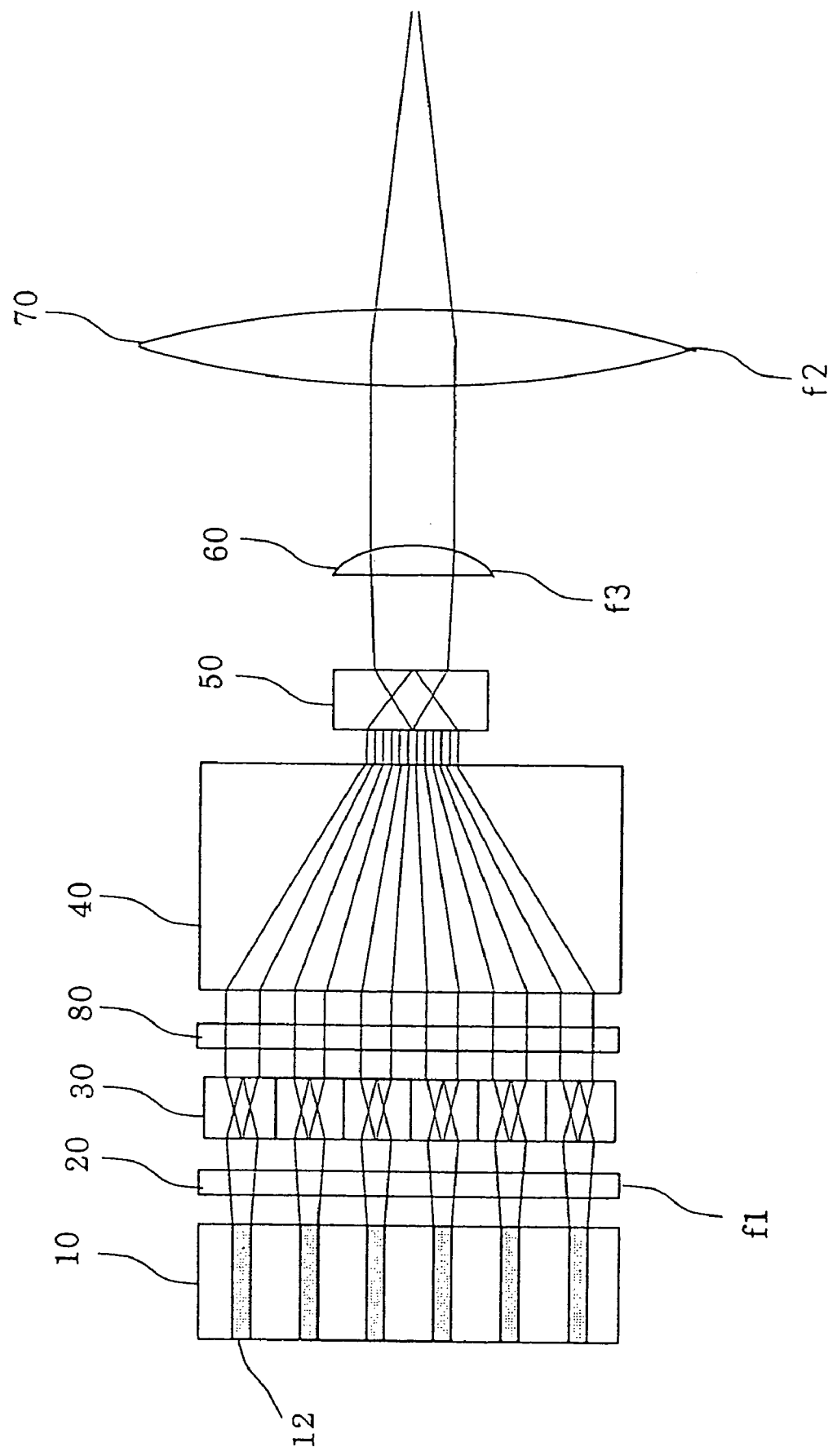
FIG. 4 is a plane view of the semiconductor laser device according to the present invention using a fourth condenser between the first beam converter and the beam compressor.
Figure 5:
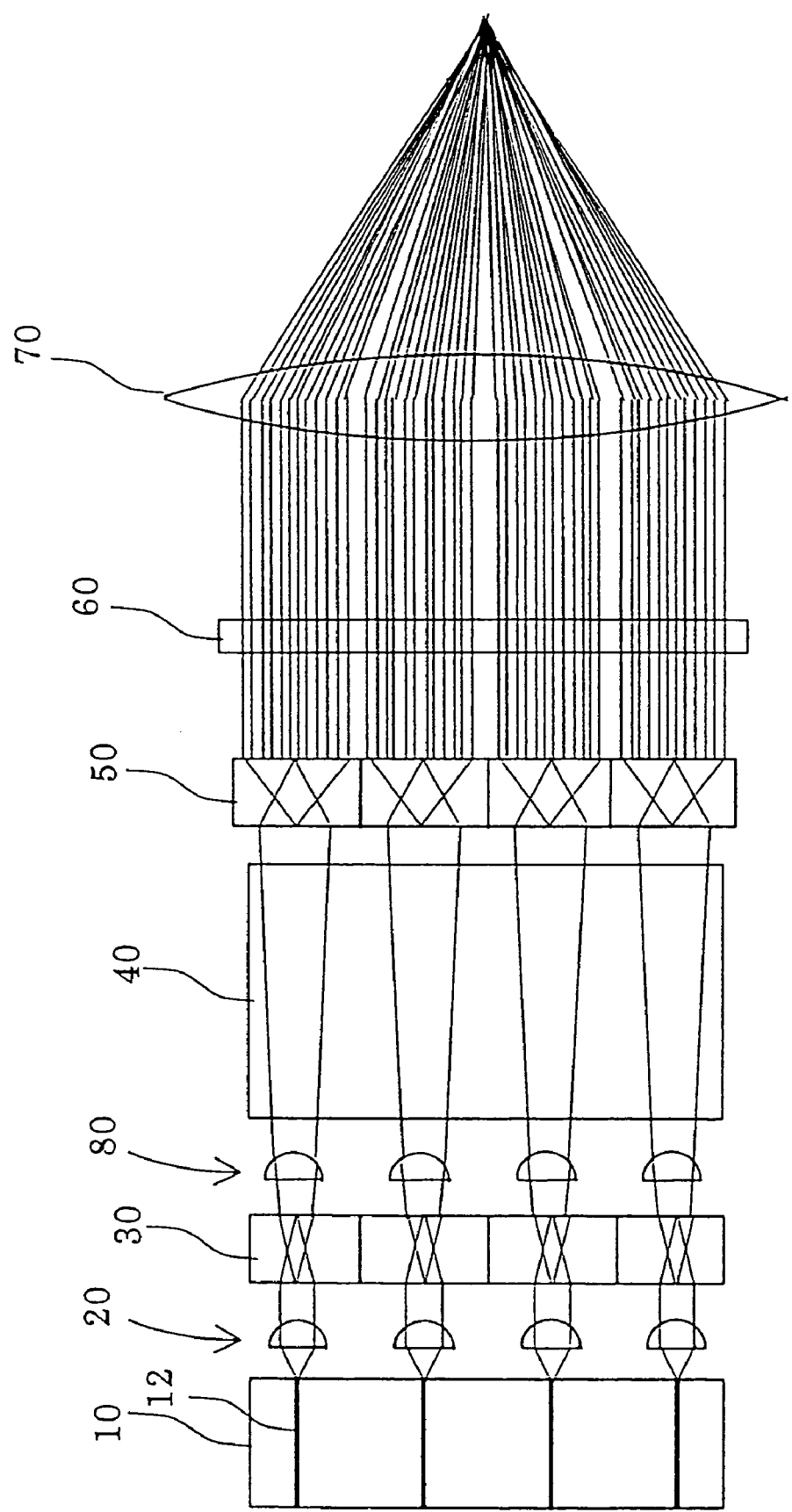
FIG. 5 is an elevation of the semiconductor laser device shown in FIG. 4.

FIG. 4 is a plane view showing a semiconductor laser device according to the present invention in which a second cylindrical lens array is inserted between the first beam converter and the beam compressor, and FIG. 5 is an elevation thereof. The second cylindrical lens array 80 has a focusing power in the direction parallel to the junction, and a complex optical system combined with the cylindrical lens 60 parallelizes the laser beams radiated from the stack array semiconductor laser 10 and dispersed along the width of the junction stripes. By inserting the second cylindrical lens array, the light path from the stripe surface to the position where the adjacent stack layers are superposed can be lengthened. Thus, the beam compressor can be arranged in a space having a sufficient margin.

This cylindrical lens array 80 is inserted for the sole purpose of securing a margin of the interval between the first beam converter and the beam compressor, and not intended to collimate the laser beams by correcting the dispersion angle in the direction along the junction stripe array. This is due to the fact that, as described above, the focusing diameter ω1 in this direction is inversely proportional to the focal length f3 of the cylindrical lens (the composite focal length of the lenses 60 and 80 in this case), and therefore the value f3 is desirably as large as possible.

Even in the case where the cylindrical lens array 80 is inserted, therefore, it is still preferable to install the cylindrical lens 60.

Figure 6:
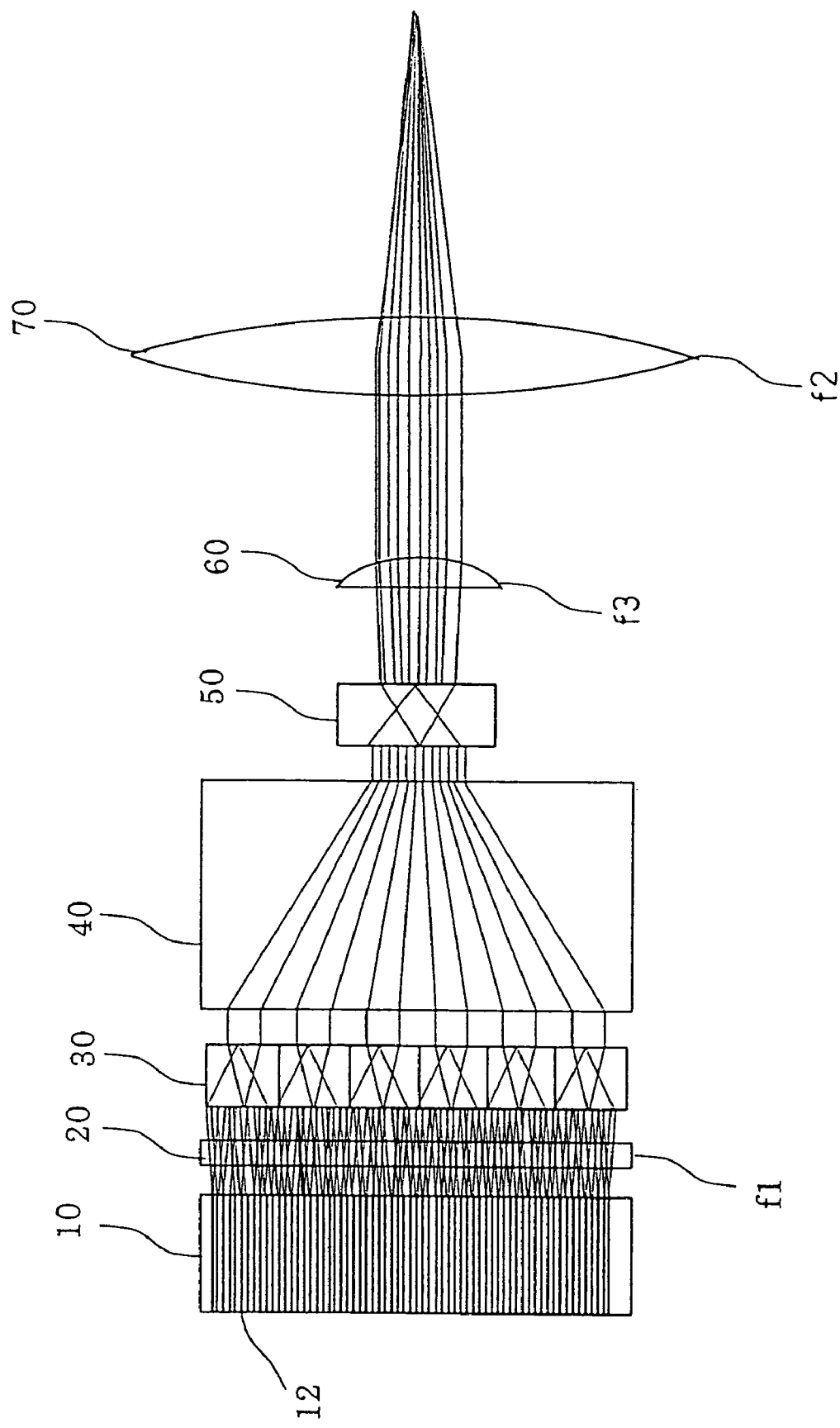
FIG. 6 is a plane view of a semiconductor laser device using a semiconductor laser of a dense emitter structure.
Figure 7:
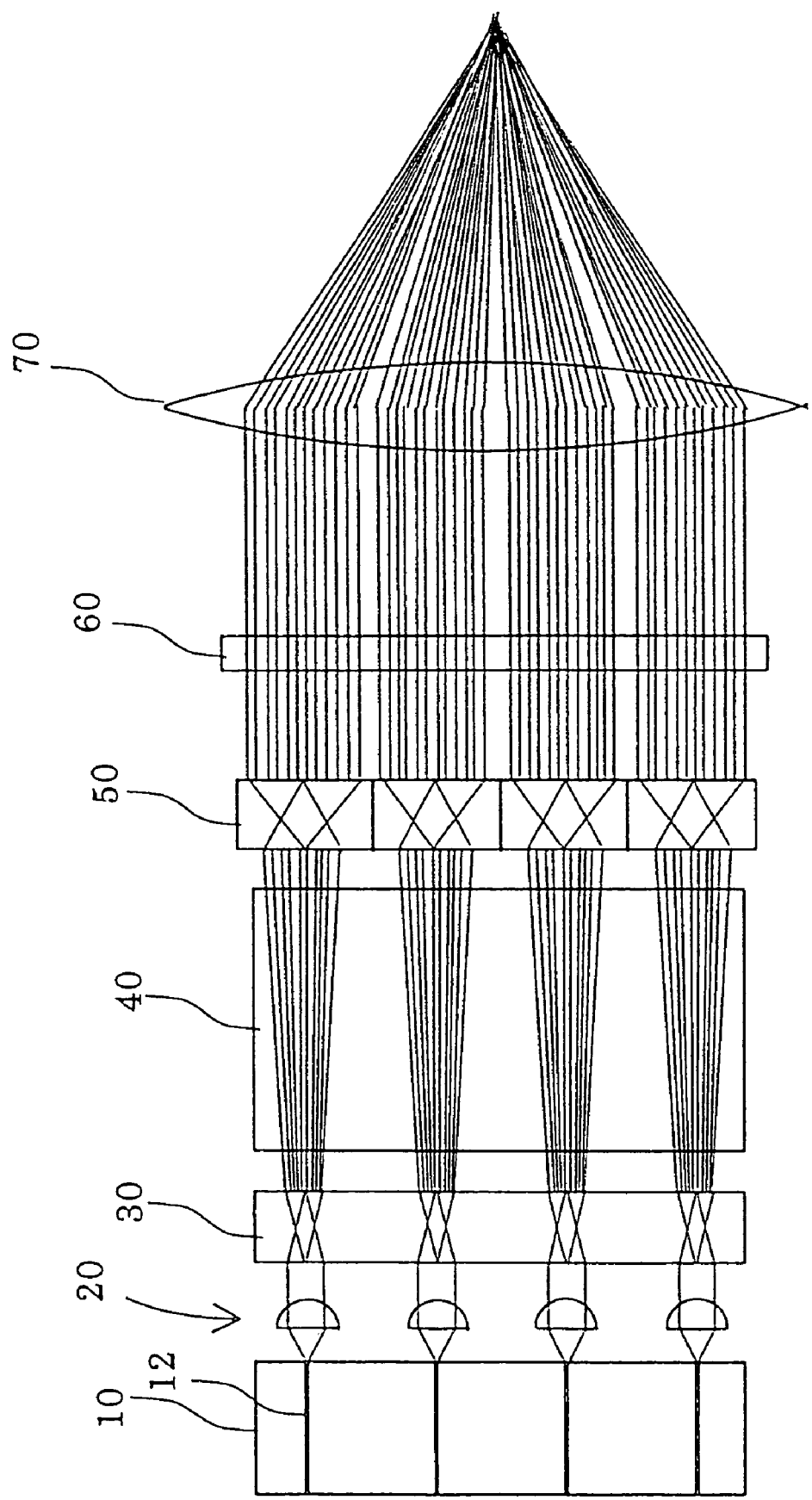
FIG. 7 is an elevation of the semiconductor laser device shown in FIG. 6.

FIG. 6 is a plan view of an exemplary embodiment of a semiconductor laser device according to the present invention in which a quasi-continuous wave laser diode (Quasi-CW-LD) or the like having the light emitting portion of a high spatial density is used as a stack array laser diode. FIG. 7 is an elevation of this semiconductor laser device. The stack array laser diode 10 has a multiplicity of junction stripes in high density thereby to form a substantially inseparable linear light emitting portion.

The first beam converter 30 includes an appropriate number of aligned optical elements of a size corresponding to a predetermined number of stripes without regard to the size of the junction stripes. The position and the operation of the first cylindrical lens array 20, the first beam converter 30, the beam compressor 40, the second beam converter 50, the second cylindrical lens 60 and the focusing lens 70 are at least approximately identical to those explained with reference to FIGS. 2 and 3.

In the case where a laser diode having the junction stripes of a small width or a short interval is used as described above, the fabrication of the beam converter becomes difficult if the optical elements of the first beam converter are arranged in one-to-one correspondence with the junction stripes. According to this exemplary embodiment, each optical element is arranged in correspondence with an junction stripe group having an appropriate number of junction stripes. Also, the light emitting portion of the laser diode is regarded as one stripe instead of a dotted line and appropriately divided and turned by the optical elements. In this way, the laser diode is substantially considered to have been modified to the one which emits the light in ladder form.

Figure 8:
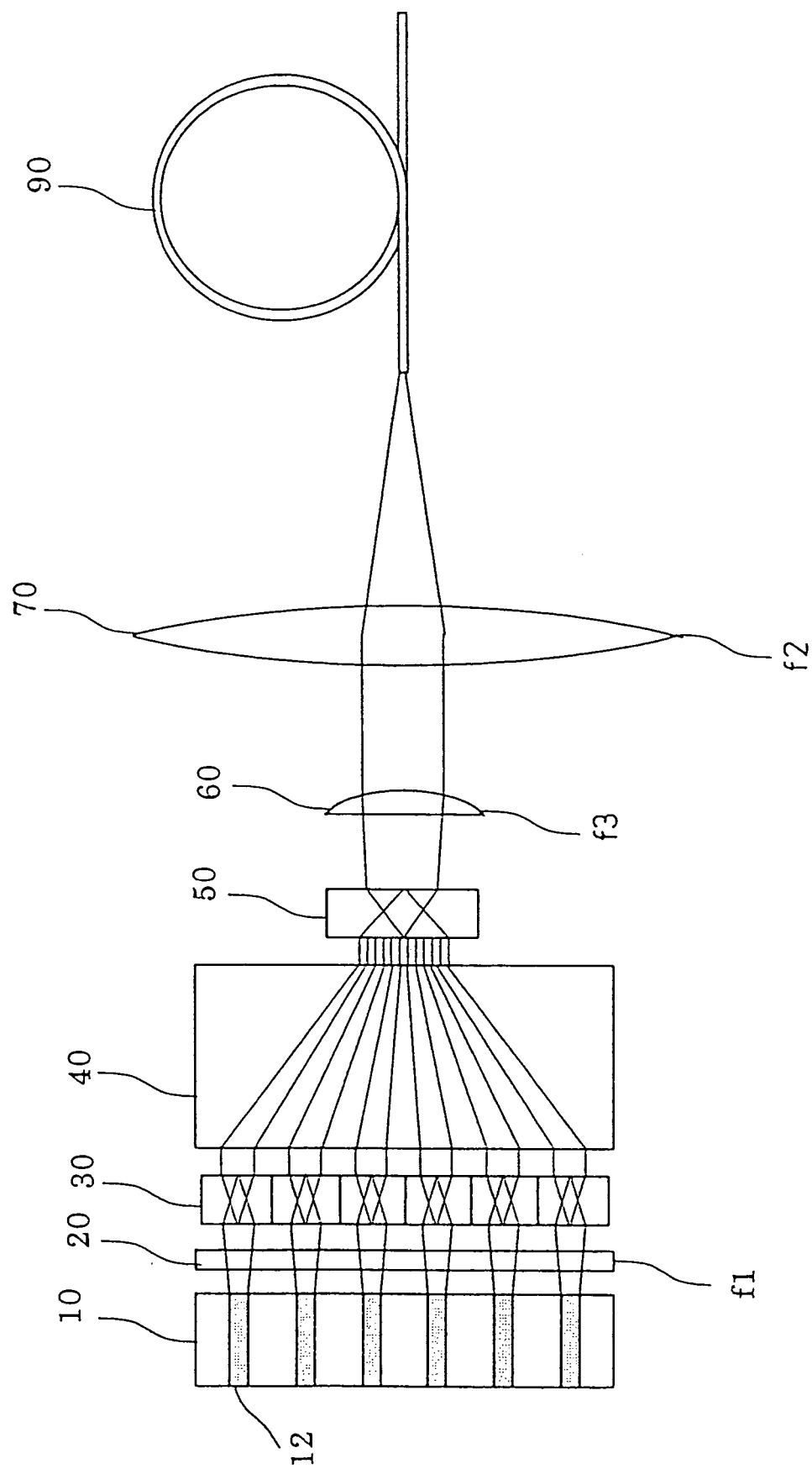
FIG. 8 is a plane view of a semiconductor laser device using an optical fiber according to the present invention.
Figure 9:
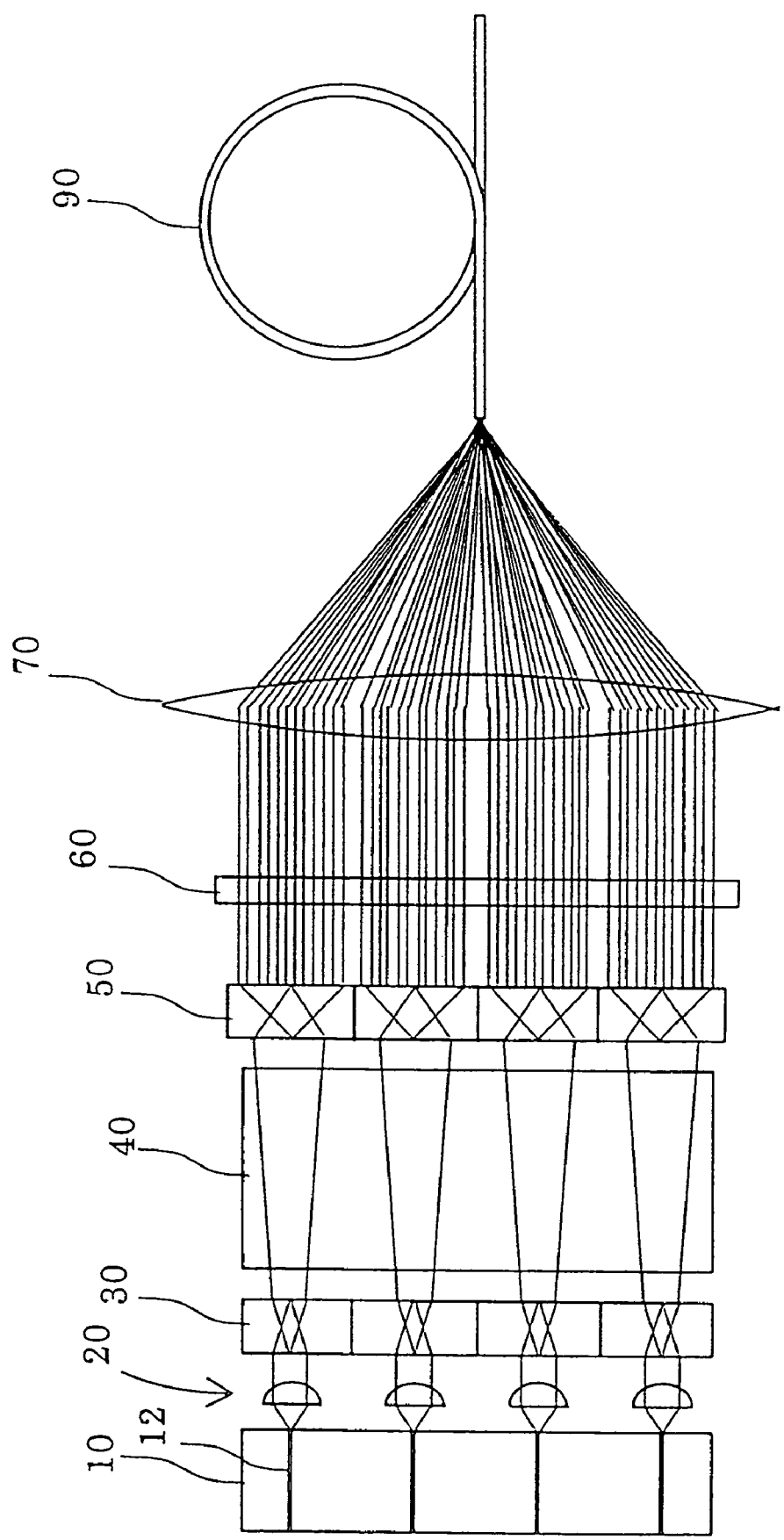
FIG. 9 is an elevation of the semiconductor laser device shown in FIG. 8.

FIG. 8 is a plane view of a laser device according to the present invention using an optical fiber 90, and FIG. 9 an elevation thereof. The light-receiving surface of the optical fiber 90 is arranged at the position of the laser spot formed by the laser device, and the laser energy emitted from the laser 10 is received and transferred to the other end surface of the optical fiber 90.

The length and flexibility of the optical fiber 90 makes possible a convenient laser device which can be operated with the light emitting portion thereof easily located at a target point. The efficiency of 60% is achieved by a laser device, for example, so configured that the stack array laser diode 10 having an output of 800 W is used as a light source, and a laser spot smaller than the cross section of the core 400 μm in diameter of the optical fiber 90 is formed on the plane of incidence of the optical fiber.

Figure 10:
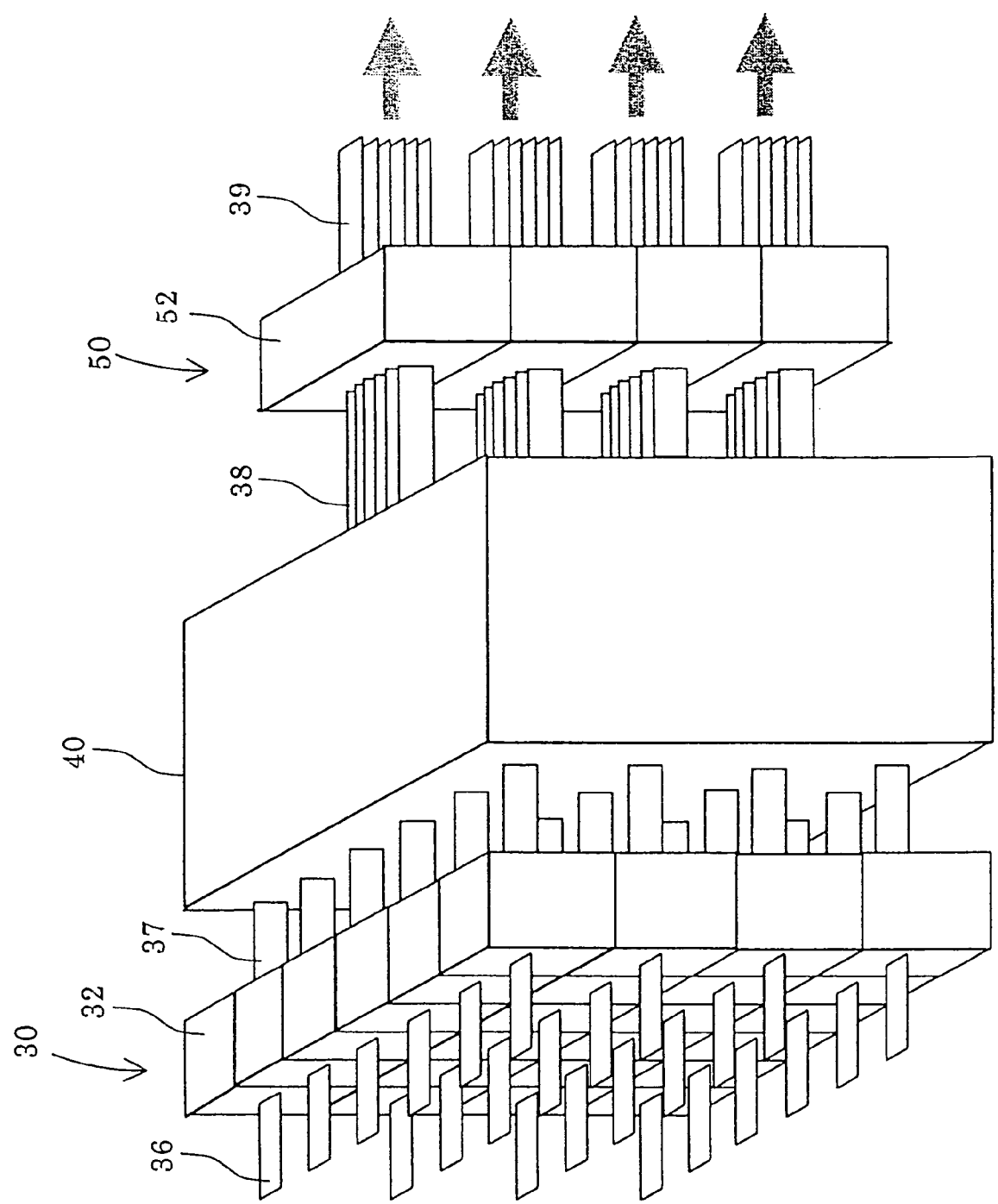
FIG. 10 is a block diagram for explaining a first beam converter, a beam compressor and a second beam converter according to the present invention.

FIG. 10 is a block diagram for explaining an optical system including the first beam converter 30, the beam compressor 40 and the second beam converter 50 according to the present invention. The first beam converter 30, as shown in FIG. 10, is formed by coupling an appropriate number of optical elements 32 in a two-dimensional array. The width and height of the first beam converter correspond to the light emitting surface of the stack array laser diode.

The optical elements 32 each have a light-receiving surface, in the direction perpendicular to the surface, the laser beam 36 with the axial direction of the junction stripe along the width of the first beam converter, and an output surface, in the direction perpendicular to the surface, the laser beam 37 with the light path thereof converted by being twisted along the optical axis in the optical element. Each optical element 32 receives the laser beam 36 having the long axis of the stripes parallel to the radiation from the junction stripes arranged at repetitive intervals of 800 μm and turns the cross section of the laser beam by about 90 degrees thereby to convert the stripe axis of the laser beam into vertical direction.

The optical elements 32 used for the first beam converter 30 are generally arranged in one-to-one correspondence with the junction stripes 12 of the stack array laser diode 10 used with the laser device having the first beam converter built therein. In the case of using a stack array laser diode including a stack of four layers, with 4 mm intervals, of 12 junction stripes arranged at repetitive intervals of 800 μm, therefore, the first beam converter is so configured that 12 optical elements are arranged at repetitive intervals of 800 μm and four layers of 12 optical elements are stacked at intervals of 4 mm.

In the case where a plurality of junction stripes are arranged in high density as shown in the example of FIG. 6, however, the laser beams are regarded to be radiated from a single continuous stripe, and the laser beams received by the first beam converter are divided into portions at appropriate intervals. Thus, each column of the laser beams is turned by about 90 degrees, thereby providing a linear array laser diode having a ladder-shaped light emitting portion having substantially the same width as the interval of the ladder steps. Further, these linear array laser diodes may be stacked into and regarded as a stack array laser diode. This purpose can be achieved by arranging an appropriate number of optical elements two-dimensionally in parallel without regard to the number of the junction stripes.

The laser device is structured so conveniently that the plane of incidence and the exit plane of the first beam converter 30 are arranged on a single plane over the entire first beam converter in keeping with the fact that the radiation surface of the stack array laser diode is flat.

The optical elements can be formed based on various principles as disclosed in U.S. Pat. No. 5,513,201, the entire disclosure of which is incorporated herein by reference in its entirety.

Figure 11:
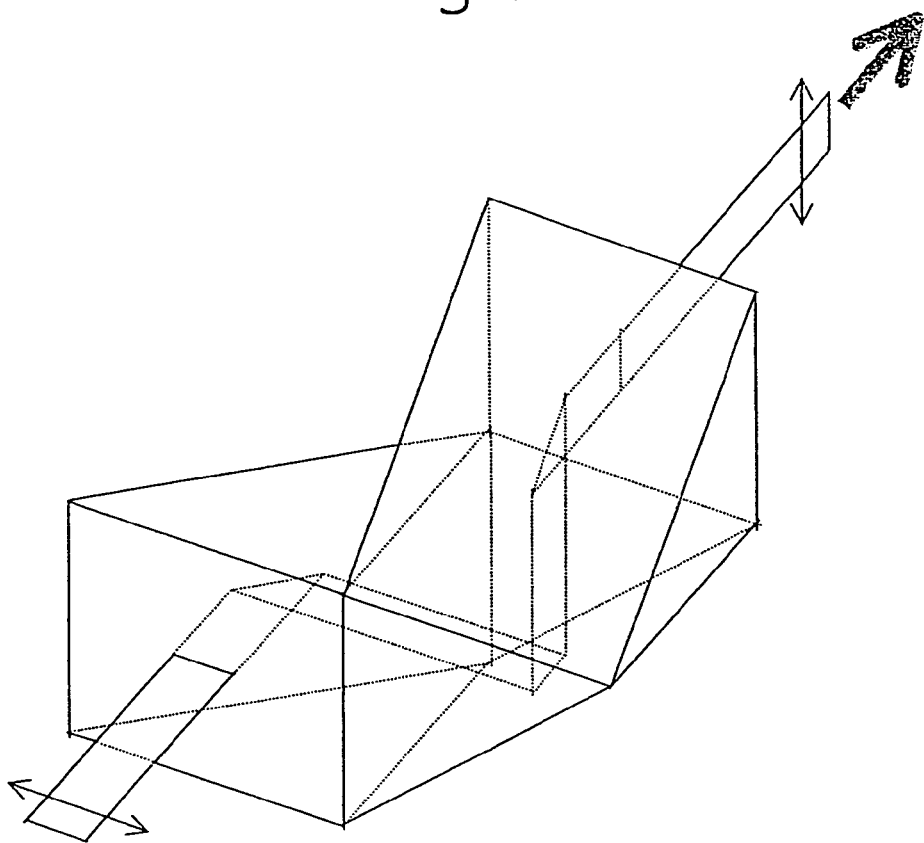
FIG. 11 is a diagram for explaining the principle of beam conversion by three reflections, with reference to three rectangular prisms.
Figure 12:
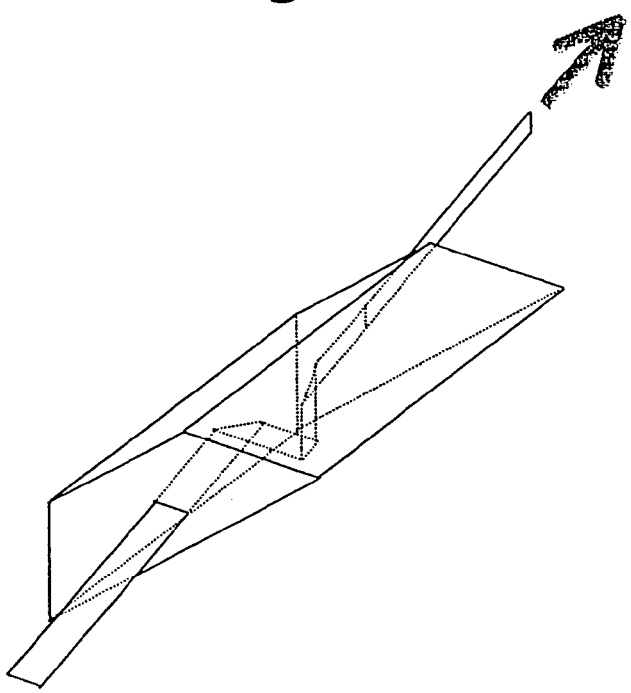
FIG. 12 is a perspective view showing an optical element in the shape of an oblique prism and the beam conversion using the optical element.

First, the optical elements are formed based on the twist by three reflections. This can be easily understood by inferring three rectangular prisms. Specifically, as shown in FIG. 11, three rectangular prisms are combined. When a horizontally flat laser beam is applied to the first rectangular prism, a vertically flat laser beam twisted by 90 degrees is formed by the three total reflections in the first, second and third prisms, and exits from the third rectangular prism. The same functions as the three rectangular prisms can be exhibited by a single prism element shown in FIG. 12.

Figure 13:
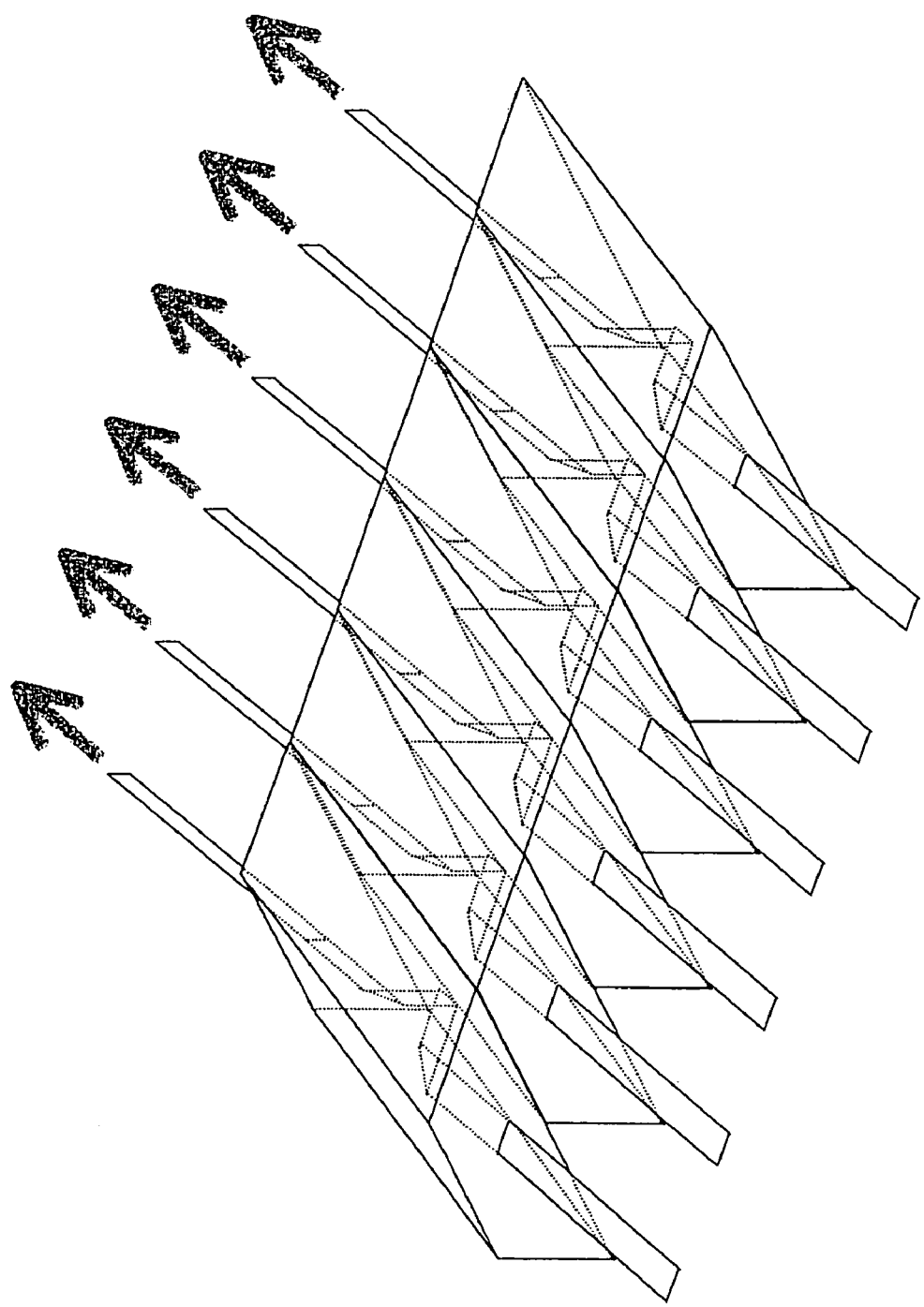
FIG. 13 is a perspective view showing a beam converter obtained by arranging the optical elements of FIG. 12 arranged in parallel and the beam conversion by the beam converter.
Figure 14:
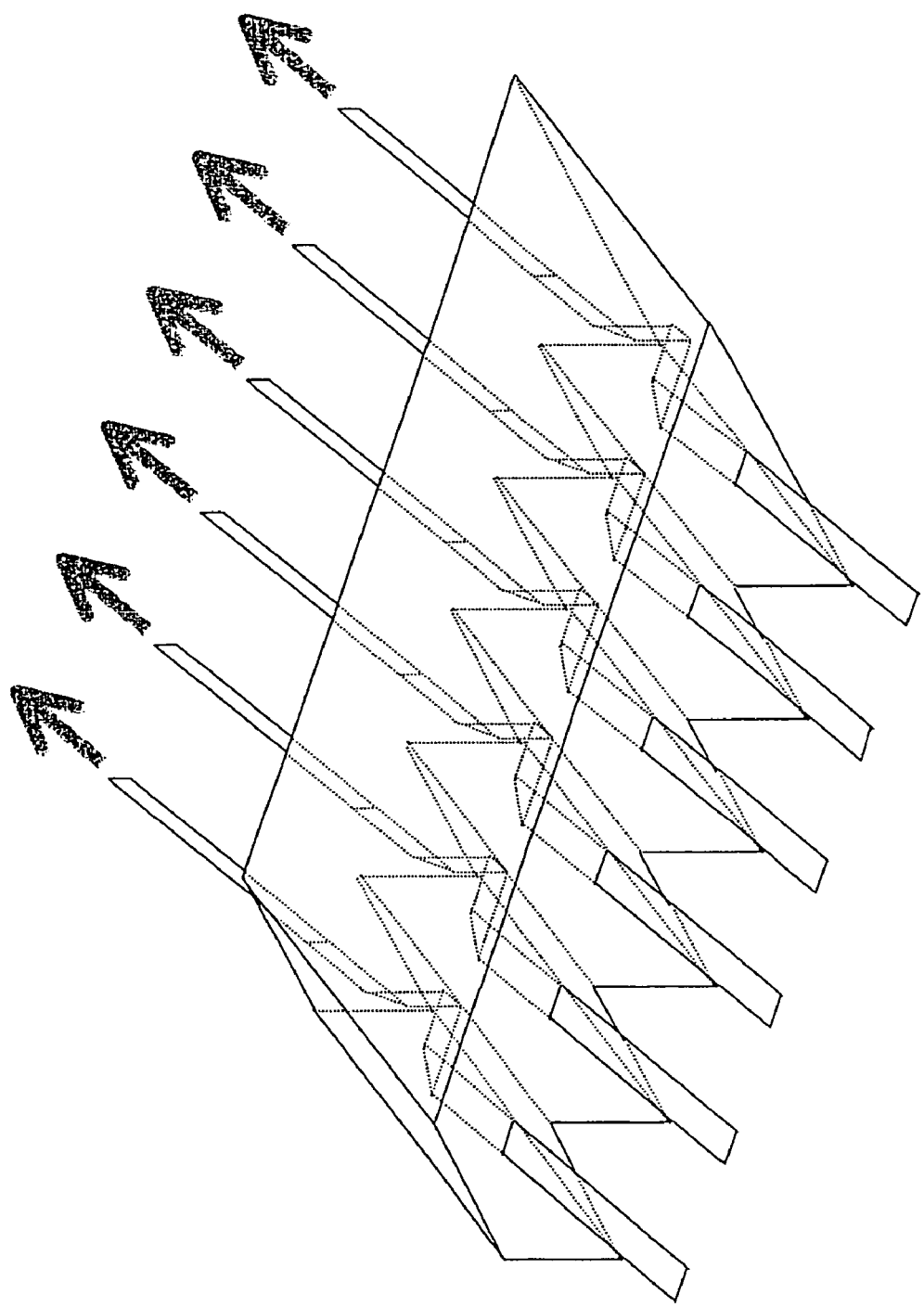
FIG. 14 is a perspective view showing an integrated beam converter equivalent to the beam converter shown in FIG. 13, and the beam conversion by the same beam converter.
Figure 15:
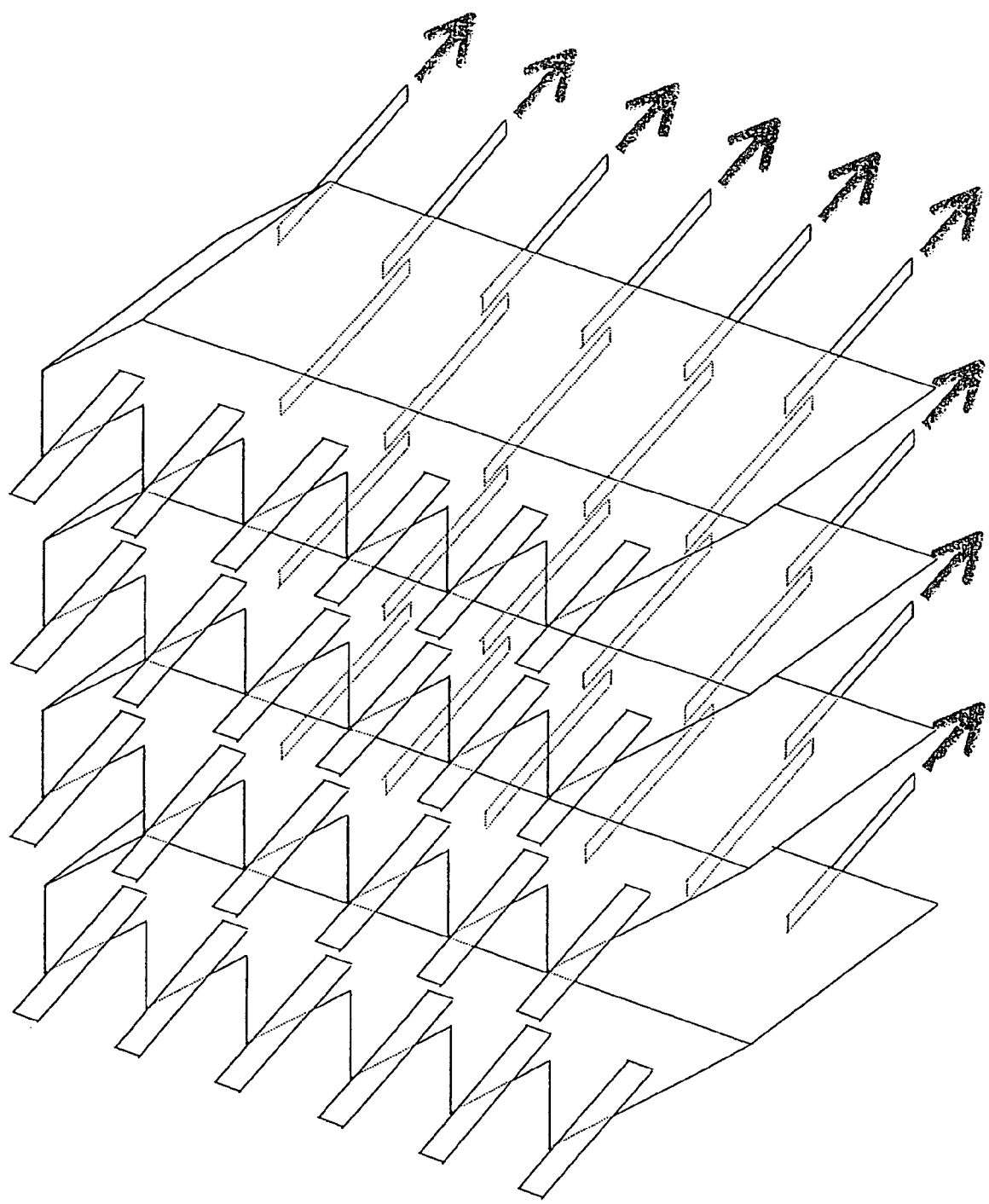
FIG. 15 is a perspective view of a first beam converter obtained by the stacking beam converter shown in FIG. 14 and the beam conversion by the same beam converter.

These prism elements are arranged in a one-dimensional prism array as shown in FIG. 13. Then, laser beams aligned as dashed line segments enter the prism array and exits by being converted into laser beams arranged in parallel in the form of ladder. This prism array can be formed from a single glass substrate in monolithic fashion as shown in FIG. 14. These prism arrays are vertically stacked to form a two-dimensional array of prism elements, as shown in FIG. 15. In this way, the laser beams in the form of parallel dashed line segments are converted into and exit as laser beams in the form of parallel ladders.

The three reflections are not necessarily at right angles as in the rectangular prism, but such that the laser beams in the form of parallel dashed line segments are incident and exit by being converted into laser beams in the form of parallel ladders.

The optical elements used on the reflection surface may not be prisms but reflectors appropriately arranged.

In the case where a beam converter is formed of reflectors, a mirror array is formed in such a manner that all the total reflection surfaces of the prism array are regarded as a reflection surface. The materials that can be used for the beam converter include metal, glass plated with metal, glass with a reflecting coating, plastics and silicon. A fine optical element can be fabricated by application of the fabrication process using a precision die, the LIGA process or the silicon semiconductor fabrication process. In the case where silicon crystal is used, the machining is facilitated by making the reflector surface of a cleavage plane.

Figure 16:
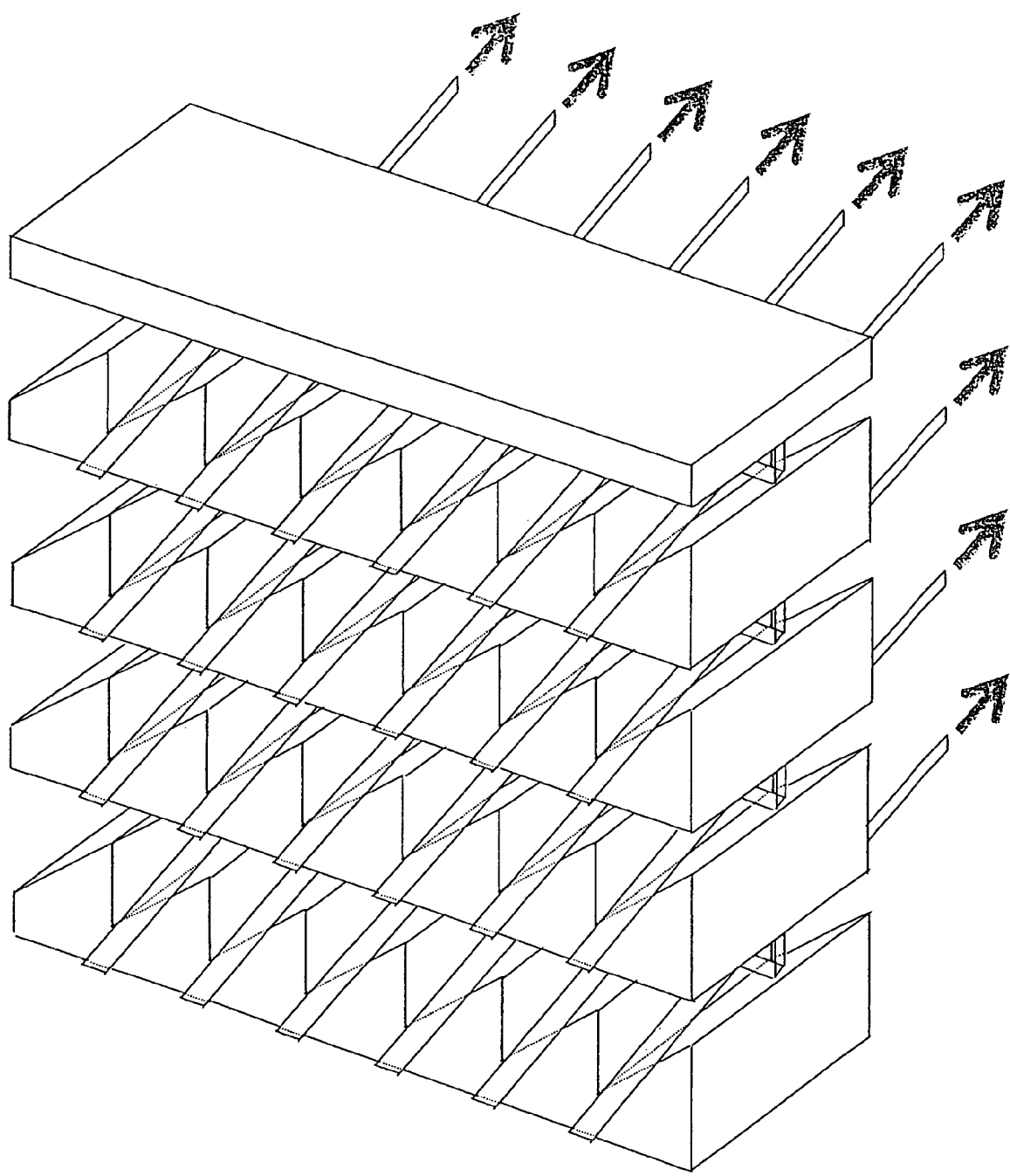
FIG. 16 is a perspective view showing a first beam converter obtained by stacking mirror arrays and the beam conversion by the same beam converter.

The use of a one-dimensional mirror array makes it possible to convert the incident laser beams in the form of aligned dashed line segments into laser beams which exit as parallel laser beams in the form of ladder. These mirror arrays are stacked vertically to form a two-dimensional array of mirror elements as shown in FIG. 16. Then, the laser beams in the form of parallel dashed line segments enter and exit by being converted into laser beams in the form parallel ladders.

Figure 17:
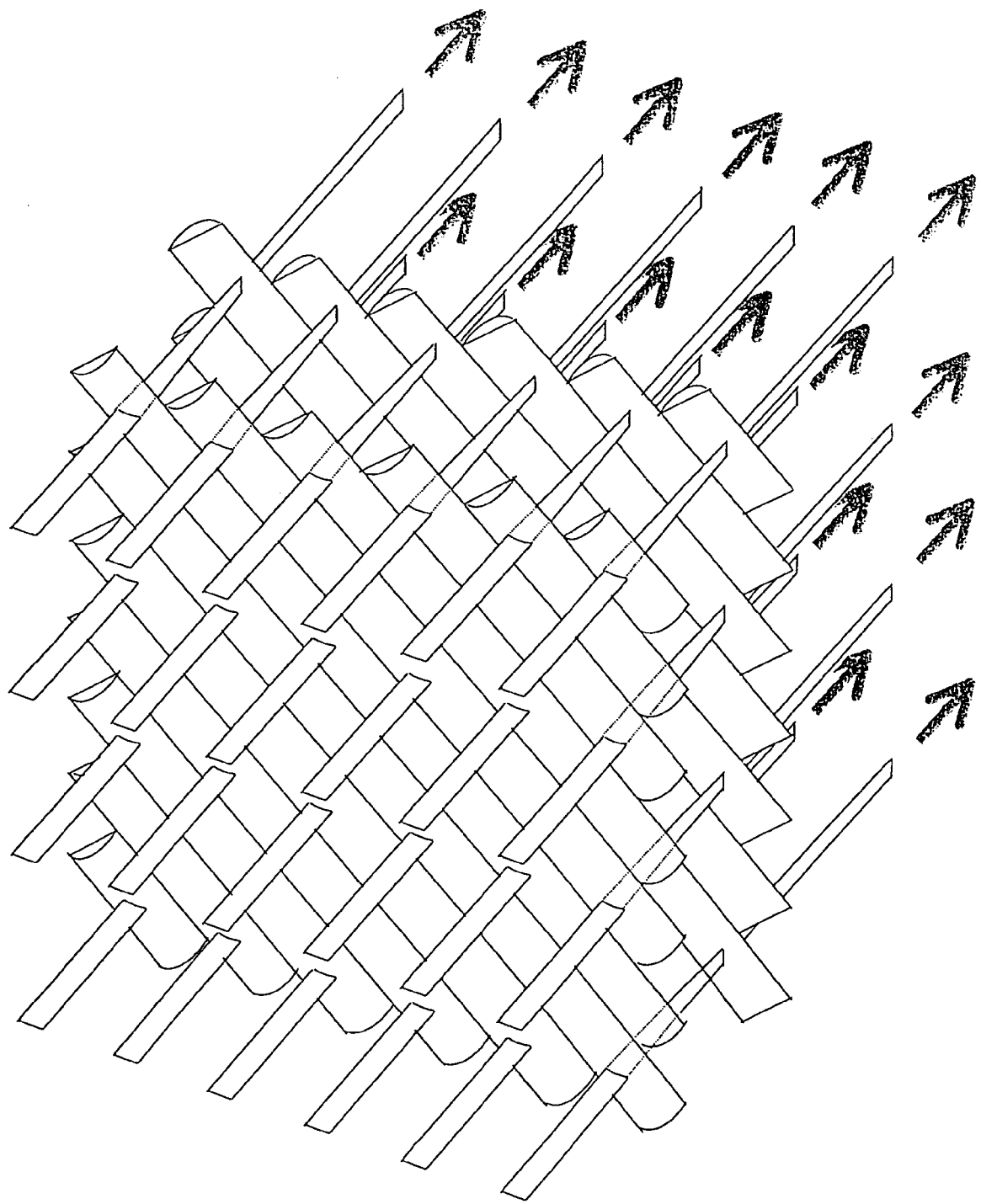
FIG. 17 is a perspective view showing a first beam converter with cylindrical lenses arranged in parallel and the beam conversion by the same converter.

FIG. 17 is a diagram showing the first beam converter having cylindrical lenses arranged in parallel. In this first beam converter, the cylindrical lenses are arranged in parallel to each other with the axes thereof inclined by 45 degrees, and arranged in appropriately spaced opposed relation with each other. The flat light beams entering the plane of incidence horizontally are subjected to different refracting power at different entrance points by the cylindrical lenses inclined by 45 degrees, thereby turning the flat axes thereof. Further, the laser beams with the flat axes of the cylindrical lenses inclined by 45 degrees exit from the exit plane with the flat axes turned by about 90 degrees.

The use of the first beam converter changes the striped light beams from the stack array laser diode substantially to an arrangement in the form of parallel ladders. In the case where the arrangement of the cylindrical lenses inclined by 45 degrees fails to match with the arrangement of the stripes of an adjacent linear array LD layer, the cylindrical lens array is displaced by being divided into areas corresponding to the linear array LD layer to attain the matching with the stripes.

Figure 18:
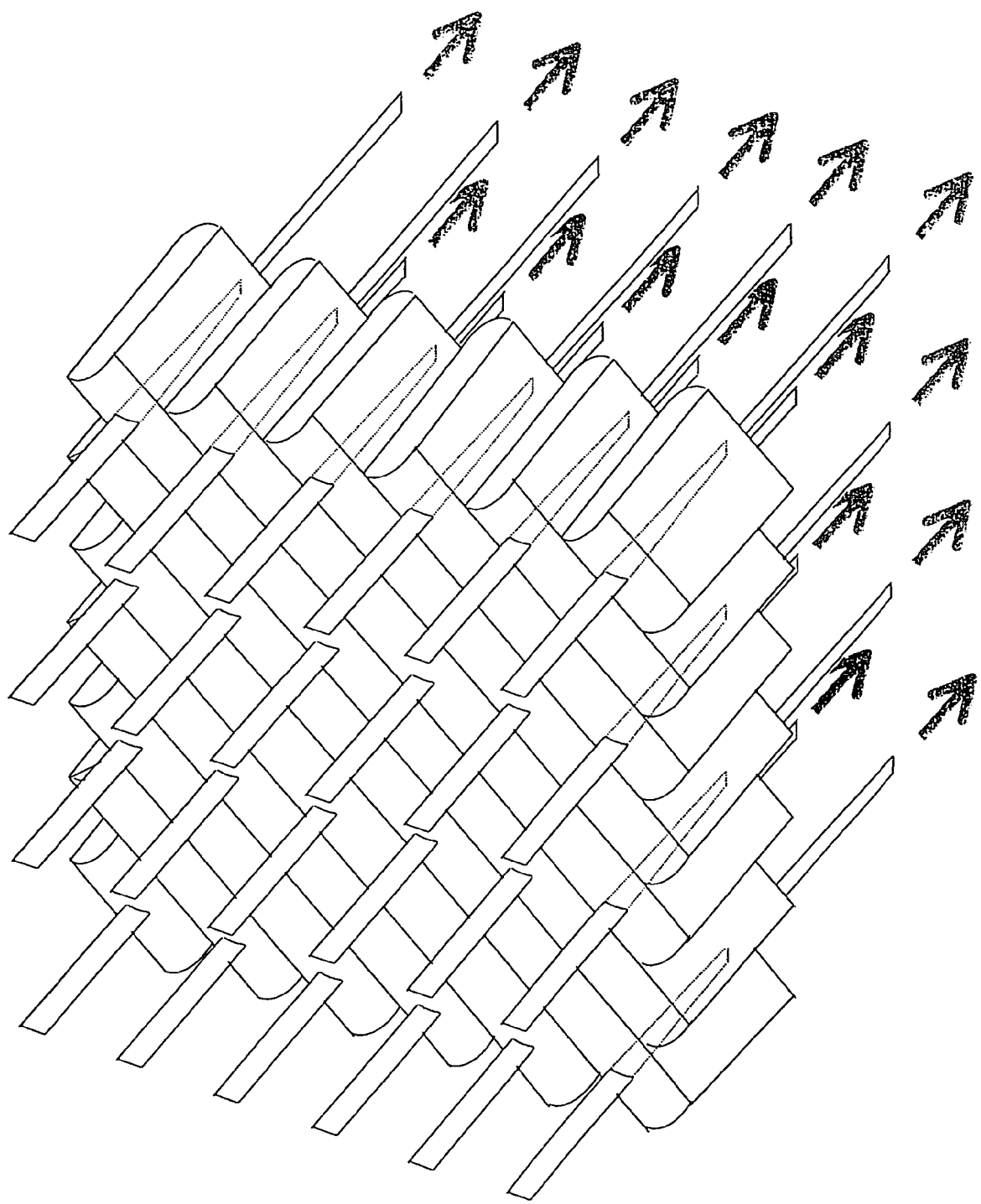
FIG. 18 is a perspective view showing a first beam converter including parallel optical elements having an incident surface and exit surface with cylindrical surfaces, and the beam conversion by the same converter.

FIG. 18 shows the first beam converter including a plurality of mutually-coupled optical elements of optical glass having cylindrical planes of incidence and exit planes and parallel side surfaces with a solid interior. This optical element is also a sort of cylindrical lens. The optical elements are inclined by 45 degrees from the horizontal surface. As the flat light beams entering the plane of incidence horizontally, the flat axes thereof are turned under different refracting power generated by the cylindrical planes of incidence inclined by 45 degrees. Further, the laser beams leave the exit planes with the flat axes turned by 90 degrees by the cylindrical exit planes inclined by 45 degrees. As the result of using the first beam converter, the striped light beams from the stack array laser diode are changed substantially to an arrangement of ladders in parallel.

In the case matching with the intervals of the striped light beams, the side surface are not necessarily parallel, and a cylindrical lens having a round section can also be used. In the case where the arrangement of the cylindrical lenses inclined by 45 degrees fails to match the arrangement of stripes in the adjacent linear array LD layer, as in the foregoing case, the cylindrical lens array is cut into areas displaced to correspond to the linear array LD layer to attain the matching with the stripes.

Figure 19:
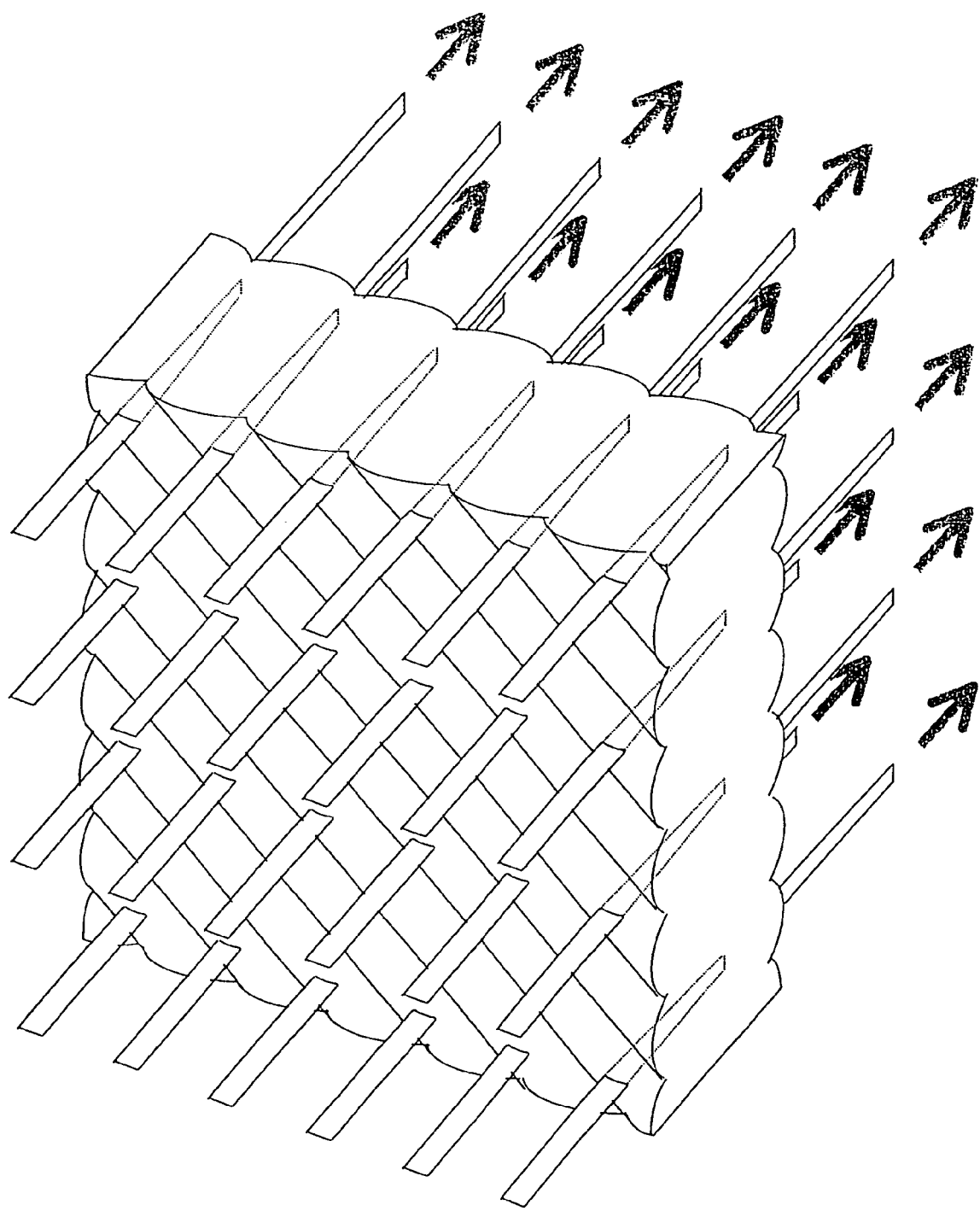
FIG. 19 is a perspective view showing a first beam converter fabricated of a block of optical glass, and the beam conversion by the same converter.

FIG. 19 shows the first beam converter fabricated from a block of optical glass. This beam converter has a plurality of cylindrical surfaces inclined by 45 degrees in the same direction on the incidence plane and the exit plane of the optical glass having a rectangular cross section, and has the same functions as the beam converter shown in FIG. 18. In the case where the arrangement of the cylindrical surfaces inclined by 45 degrees fails to match with the stripes of the adjacent linear array LD layer, the cylindrical surface array is cut into areas displaced to correspond to the linear array LD layer and match the stripes.

Figure 20:
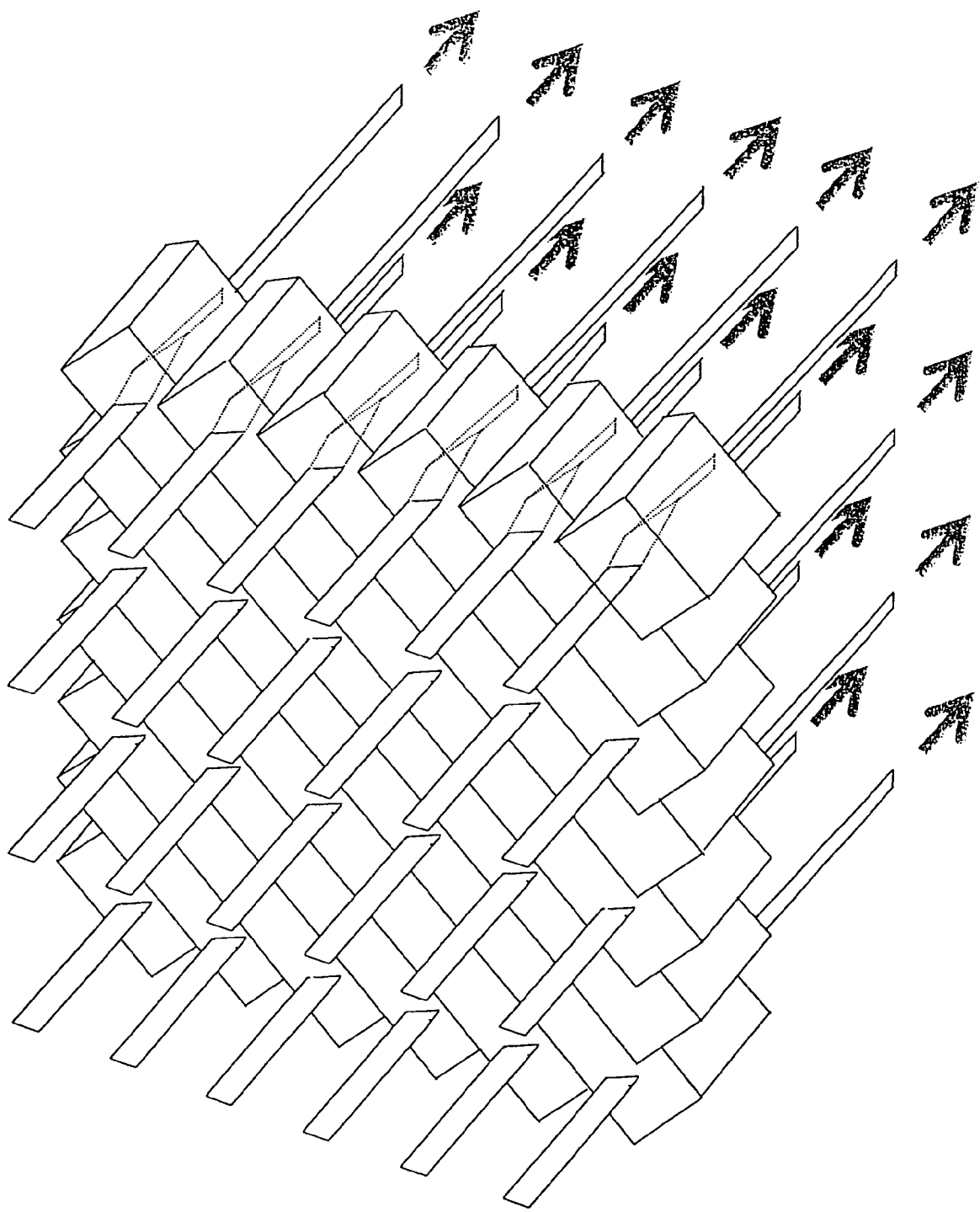
FIG. 20 is a perspective view showing a first beam converter with dove prisms arranged in parallel, and the beam conversion by the same converter.

FIG. 20 shows the first beam converter having a plurality of dove prisms. The optical elements are inclined by 45 degrees to the horizontal surface. The flat laser beams entering the incidence plane horizontally are reflected at different points on the bottom surface depending on the incidence point, and therefore form vertical flat light beams exiting from the exit plane. Thus, the laser beams exits with the flat axis thereof turned by about 90 degrees. By use of the first beam converter, the striped light beams from the stack array laser diode are changed substantially to an arrangement of parallel ladders. In the case of jointing the adjacent dove prisms, the bottom surface of the dove prism is preferably subjected to the reflection coating as required.

Figure 21:
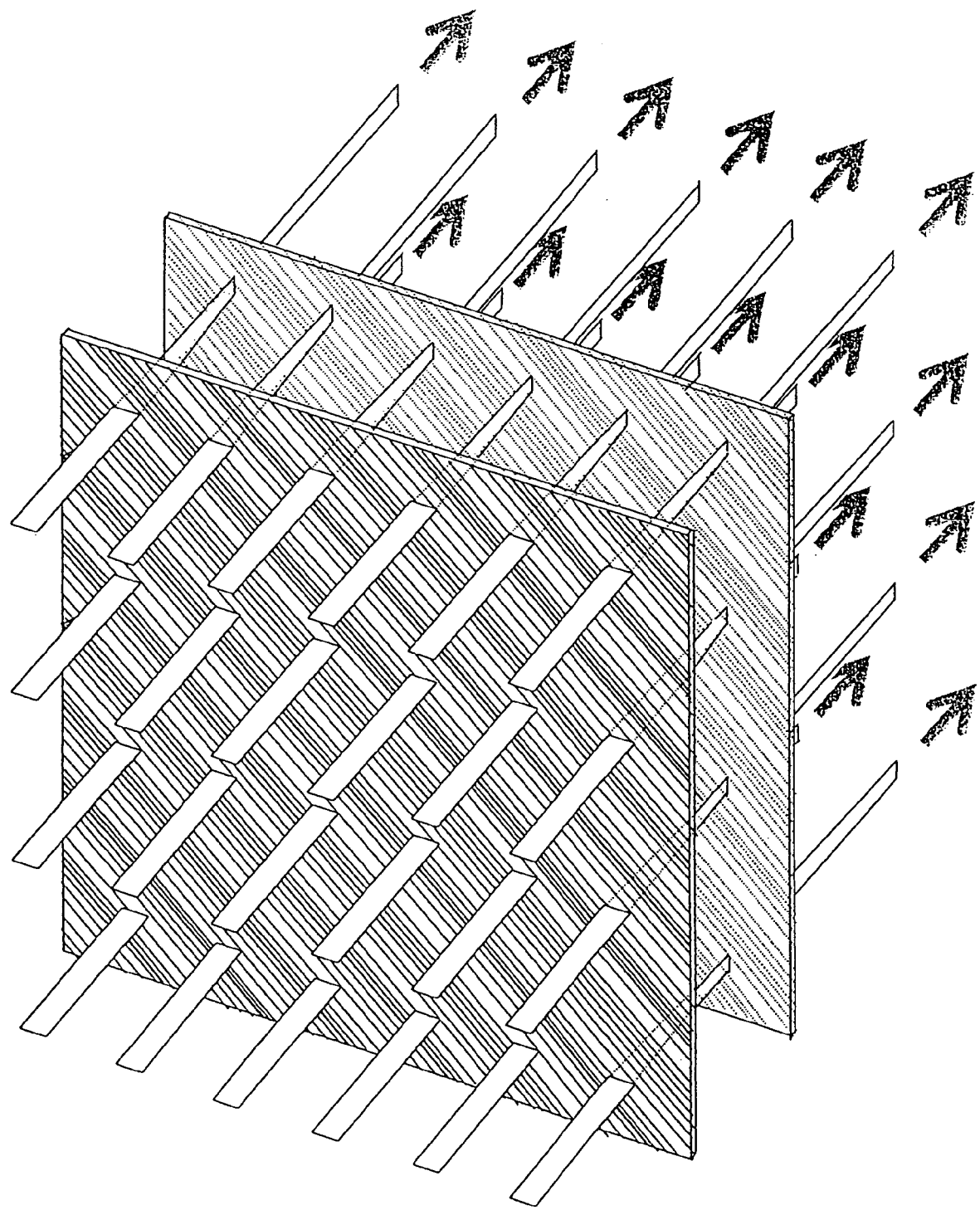
FIG. 21 is a perspective view showing a first beam converter with binary optics arranged in parallel, and the beam conversion by the same converter.

The beam converter may use optical elements which utilize diffraction. FIG. 21 is a diagram showing an optical element using the binary optics. This optical element is configured of a transparent plate formed with a multiplicity of stepped grooves of varying depths symmetric about and in the direction perpendicular to the center axis inclined by 45 degrees diagonally on the transparent plate. The depth of each groove is changed in such a manner as to increase the diffraction angle progressively outward of the center utilizing the diffraction. The stepped surface of the exit plane is formed in symmetry with respect to the stepped surface of the plane of incidence. The parallel flat laser beams entering the plane of incidence have the flat axes thereof turned under the effect of different refracting power at different incidence points on the stepped surface with the center axis inclined by 45 degrees. The laser beams leave the stepped surface of the exit plane with flat axes similarly inclined by 45 degrees. In this way, the laser beams leave the exit plane after being turned by a total of 90 degrees. This binary optics device is formed of optical glass or plastics, and may alternatively be fabricated also by use of a die as well as by the semiconductor fabrication process.

Figure 22:
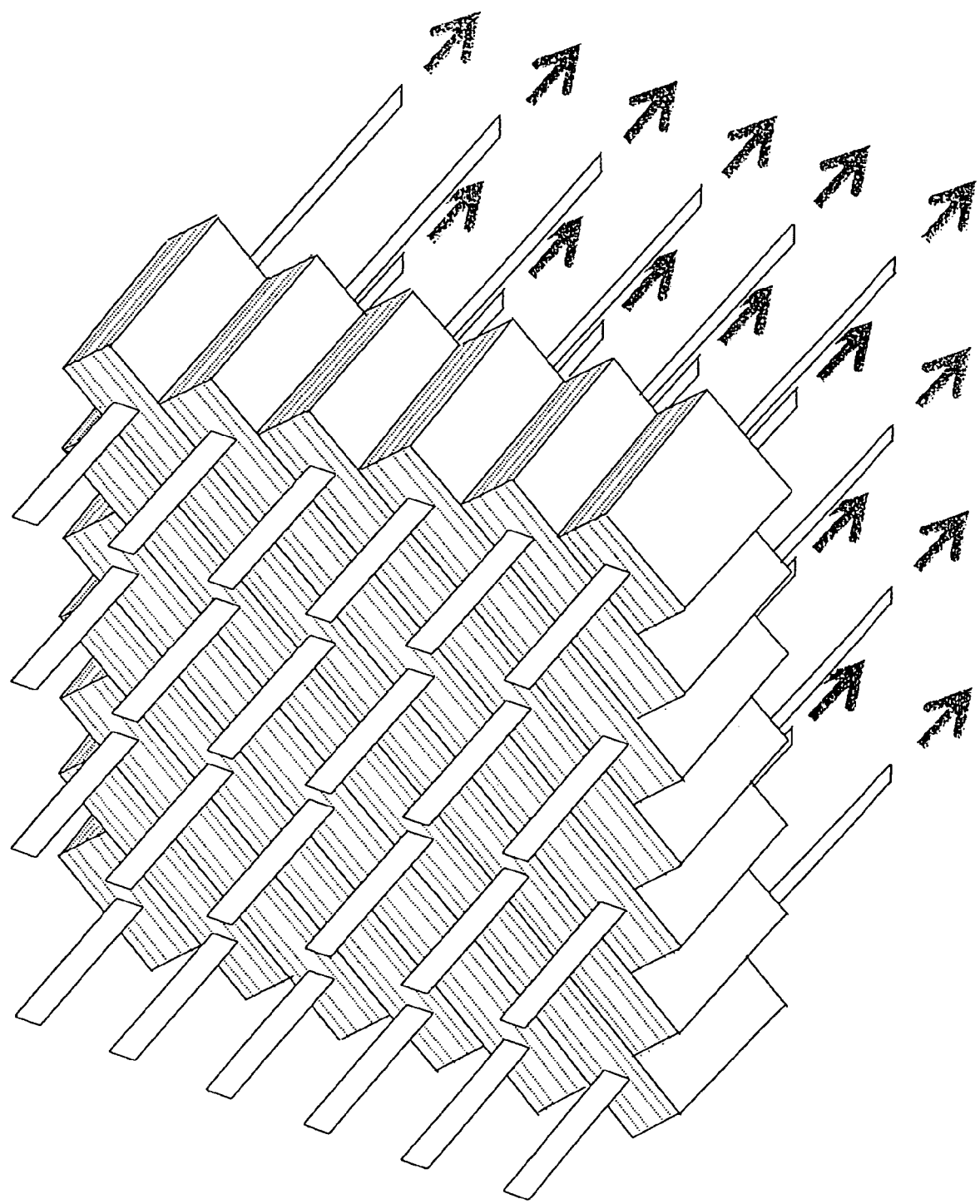
FIG. 22 is a perspective view showing a first beam converter with one-dimensional graded index lenses arranged in parallel, and the beam conversion by the same converter.

FIG. 22 shows the first beam converter including a plurality of mutually-coupled one-dimensional graded index lenses of optical glass material of which the refractive index is highest on the center surface and decreases toward the side surface. The one-dimensional graded index lens is inclined by 45 degrees to the horizontal surface. The flat laser beams entering the plane of incidence horizontally have the flat axes thereof turned by about 90 degrees under the refracting power progressively greater toward the center surface and inclined by 45 degrees, and then leave the exit surface.

Figure 23:
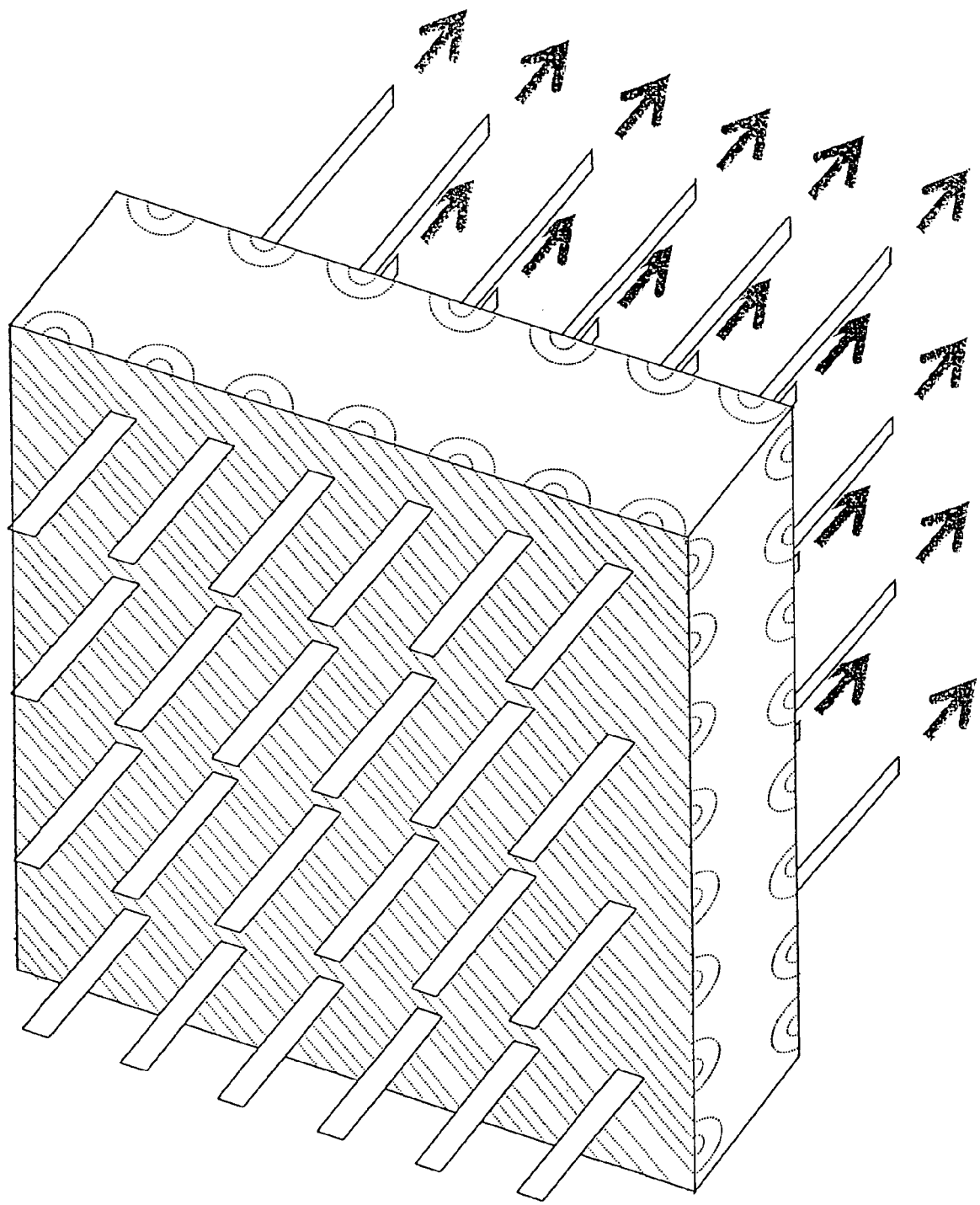
FIG. 23 is a perspective view showing a first beam converter with truncated cylindrical graded index lens elements arranged in parallel, and the beam conversion by the same converter.

FIG. 23 shows the first beam converter including a plurality of pairs of semicylindrical graded index lens elements arranged in opposed relation with each other in the same direction on the two sides of an optical glass plate. The center axis of each semicylindrical lens element is inclined by 45 degrees to the horizontal surface. The refractive index is highest at the center of the semicircle and decreases outward. The two surfaces of the optical glass plate make up the plane of incidence and the exit plane. The flat light beams incident in parallel to the plane of incidence is subjected to different refracting power at different incidence points by the graded index lens elements inclined by 45 degrees, and are emitted from the exit plane with the flat axes thereof turned by about 90 degrees.

Figure 24:
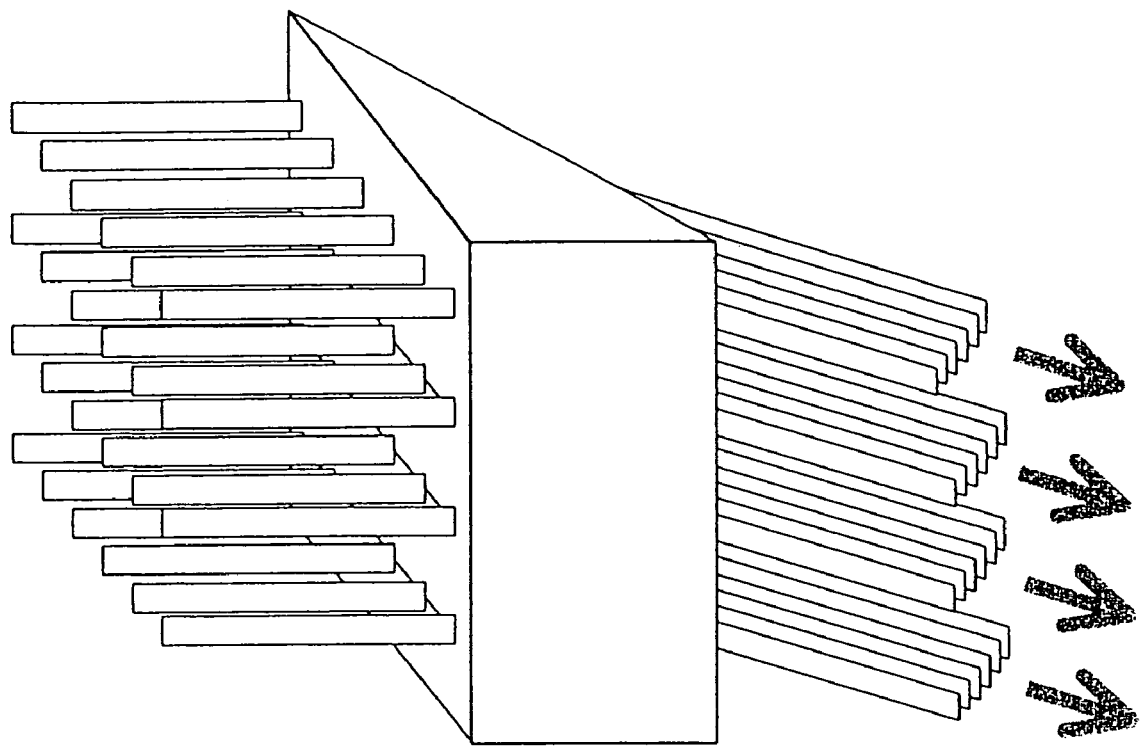
FIG. 24 is a perspective view showing a beam compressor formed of an anamorphic prism, and the beam compression by the same compressor.
Figure 25:
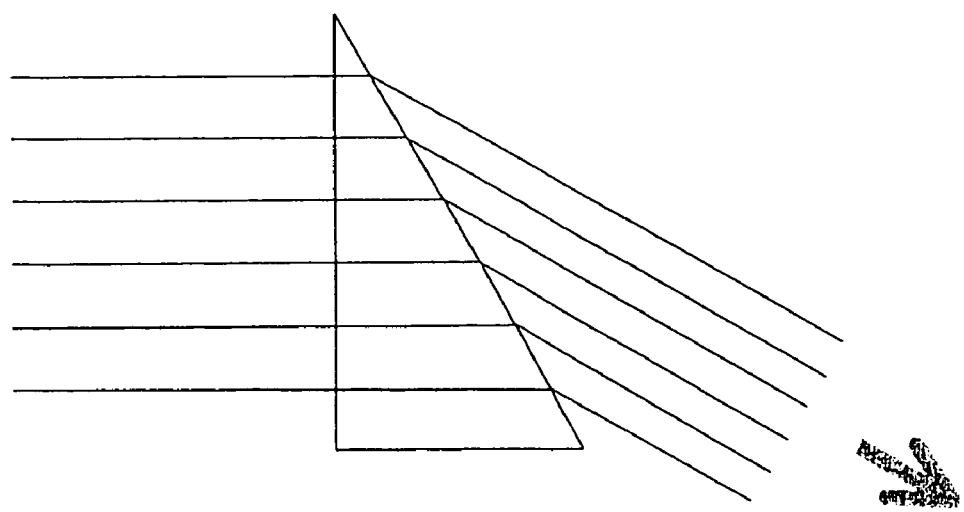
FIG. 25 is a plane view showing the beam compressor of FIG. 24 and the beam compression by the same compressor.

FIG. 24 is a perspective view showing a beam compressor using an anamorphic prism, and FIG. 25 a plan view thereof. Parallel light beams having a predetermined interval which enter the anamorphic prism are converted into narrow interval beams by the refraction effect and exit from the anamorphic prism.

Figure 26:
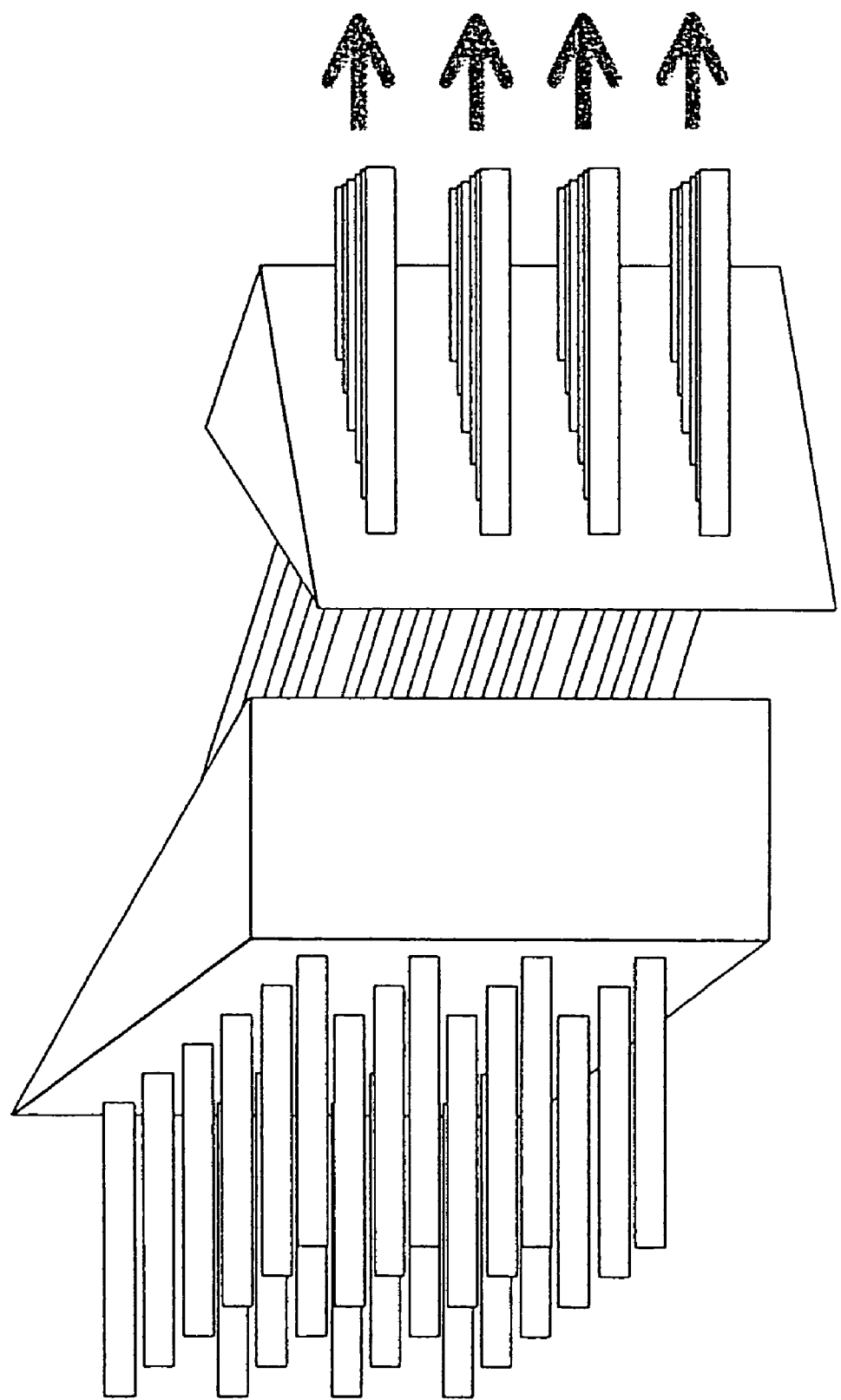
FIG. 26 is a perspective view showing a beam compressor including an anamorphic prism pair having two anamorphic prisms, and the beam compression by the same compressor.
Figure 27:
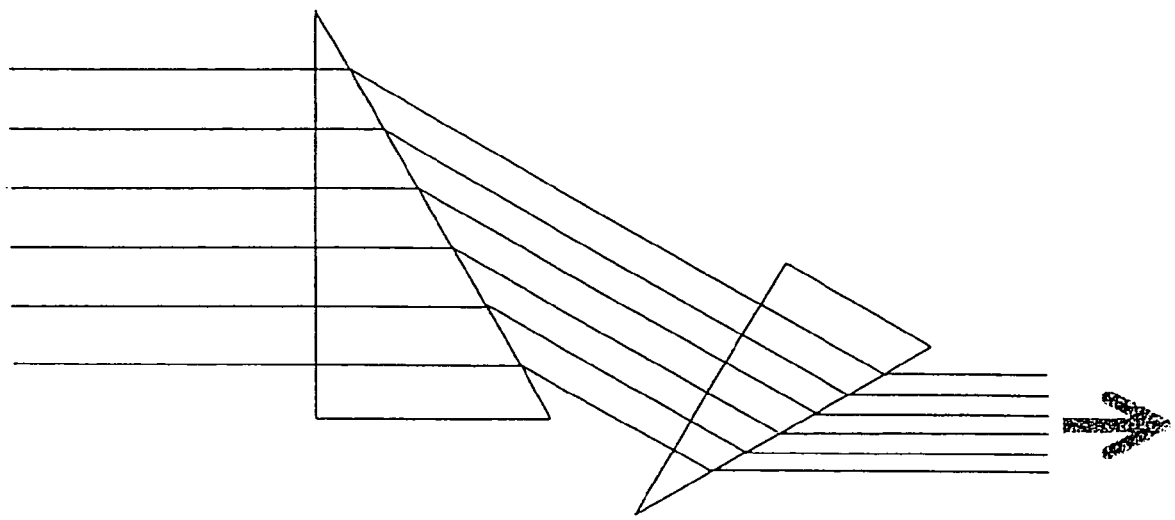
FIG. 27 is a plane view showing the beam compressor of FIG. 26 and the beam compression by the same compressor.

As shown in the perspective view of FIG. 26 and the plan view of FIG. 27, another anamorphic prism is added to make an anamorphic prism pair. Due to two refraction effects, the interval of the beams is further reduced. Moreover, the axes of the exit beams move in parallel with the axes of the incident beams while the directions thereof remain unchanged.

A plurality of the two-dimensionally arranged laser beams emitted from the first beam converter as parallel laser beam columns in the form of parallel ladders are compressed by an anamorphic prism, whereby each laser beam column is compressed and converted into another laser beam column with shorter intervals of ladder steps. As a result, these compressed laser beam columns are converted into an array of columns.

Further, assume that another anamorphic prism pair is prepared to use a total of four anamorphic prisms. Then, the exit light axes can be placed at a position substantially forward of the incident light axes. Of course, a single anamorphic prism may be used as long as the change in the direction of the optical axes is not undesirable.

The second beam converter 50, as shown in FIG. 10, is formed by connecting as many optical elements 52 as the stack layers of the stack array laser diode in a one-dimensional array. The optical elements 52 used for the second beam converter 50 corresponds in one-to-one relation with the compressed laser beam columns emitted from the beam compressor 40. The optical elements 52 twist the laser beams by 90 degrees on the same principle as the optical elements 32 used for the first beam converter 30. Thus, the laser beam groups formed by aligning the compressed parallel laser beam columns exit from the beam compressor and enters the second beam converter. The compressed parallel laser beam columns are twisted by 90 degrees, with the result that all the laser beam elements are aligned in a single parallel arrangement.

The optical elements can be formed based on the various principles used for the first beam converter.

Figure 28:
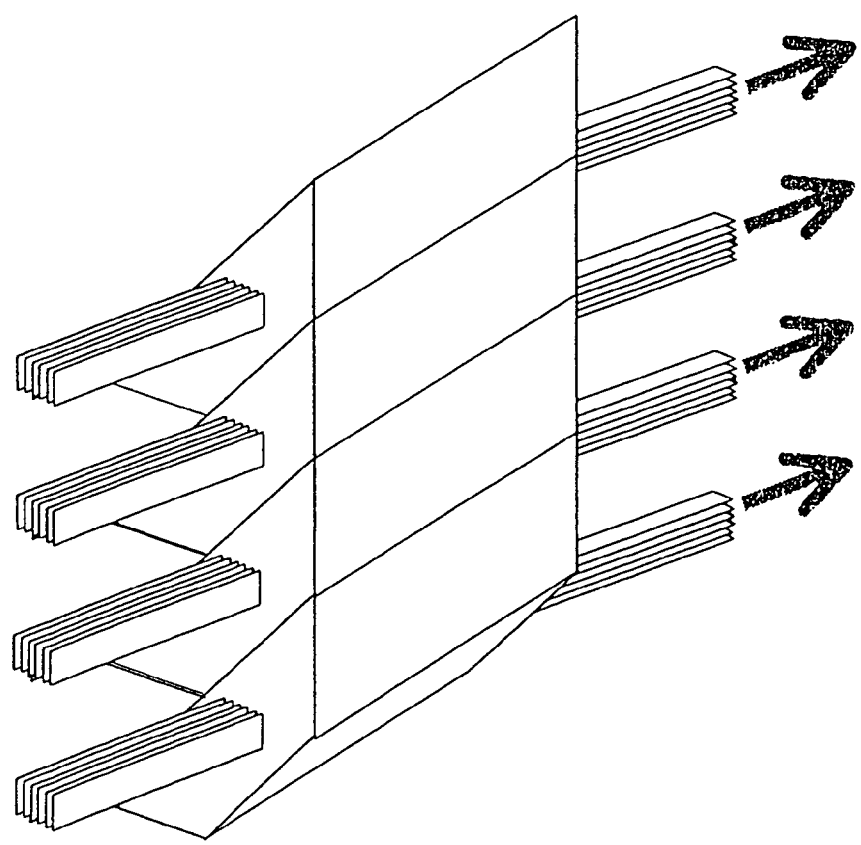
FIG. 28 is a perspective view showing a second beam converter obtained by arranging optical elements in the shape of an oblique prism arranged in parallel, and the beam conversion by the same beam converter.
Figure 29:
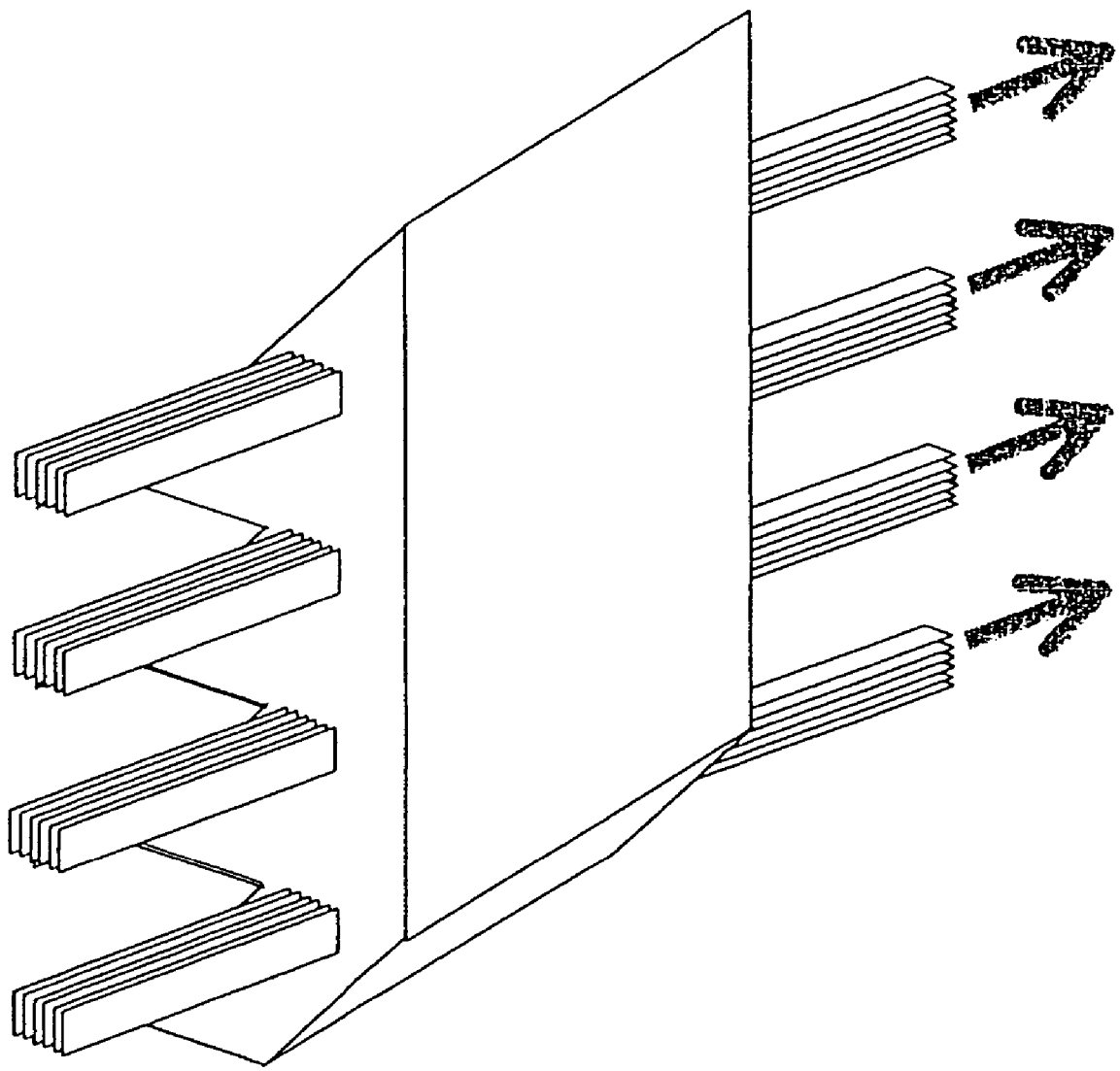
FIG. 29 is a perspective view showing an integrated second beam converter equivalent to the beam converter shown in FIG. 28, and the beam conversion by the same converter.

The first principle is to twist the beams through three reflections. As shown in FIG. 28, prism elements are arranged in one-dimensional array, in which the vertical flat laser beam columns arranged horizontally in parallel enter and exit as flat laser beam columns aligned vertically. In this way, the compressed parallel laser beams in the form of aligned parallel laser beam columns enter and all the laser beam elements exit by being converted into a single parallel alignment. This one-dimensional array can also be formed in monolithic fashion from a single glass substrate as shown in FIG. 29.

The three reflections are not necessarily at right angles as in the rectangular prism. As in the case of the first beam converter, the purpose is served if the compressed parallel laser beam columns which are aligned enter so that all the laser beam elements are converted into a parallel alignment.

Also, the optical elements of which the reflection surfaces are used are not necessarily prisms but may be reflectors appropriately arranged.

Figure 30:
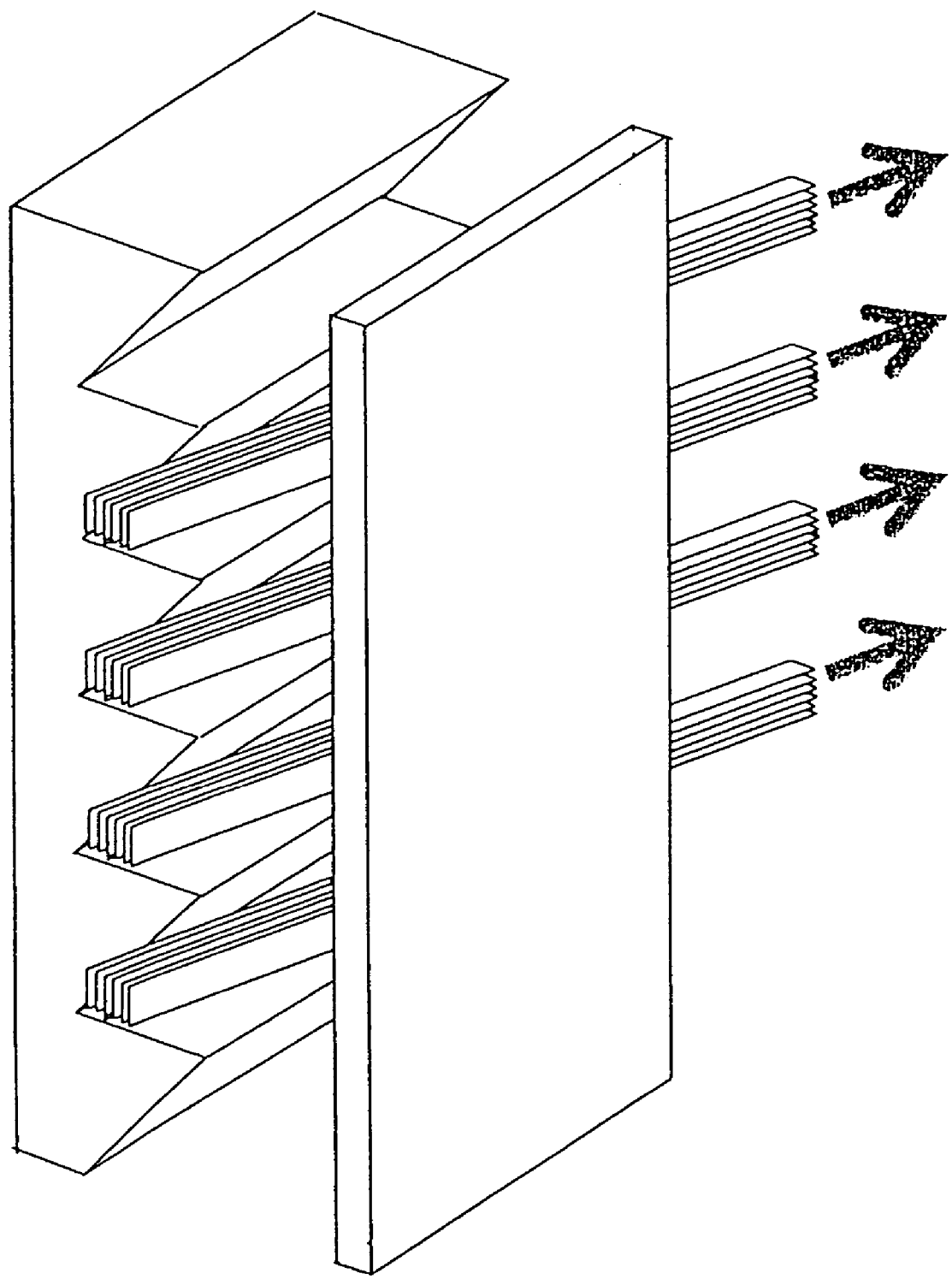
FIG. 30 is a perspective view showing a second beam converter with mirror elements arranged in parallel, and the beam conversion by the same converter.

As shown in FIG. 30, mirror elements are arranged in one-dimensional array in such a manner that the horizontally flat laser beams are twisted by 90 degrees through three reflections and converted into and exit as a vertical parallel arrangement. In this way, the compressed parallel laser beam columns aligned enter and exit by being converted into a single alignment of all the laser beam elements in parallel.

Figure 31:
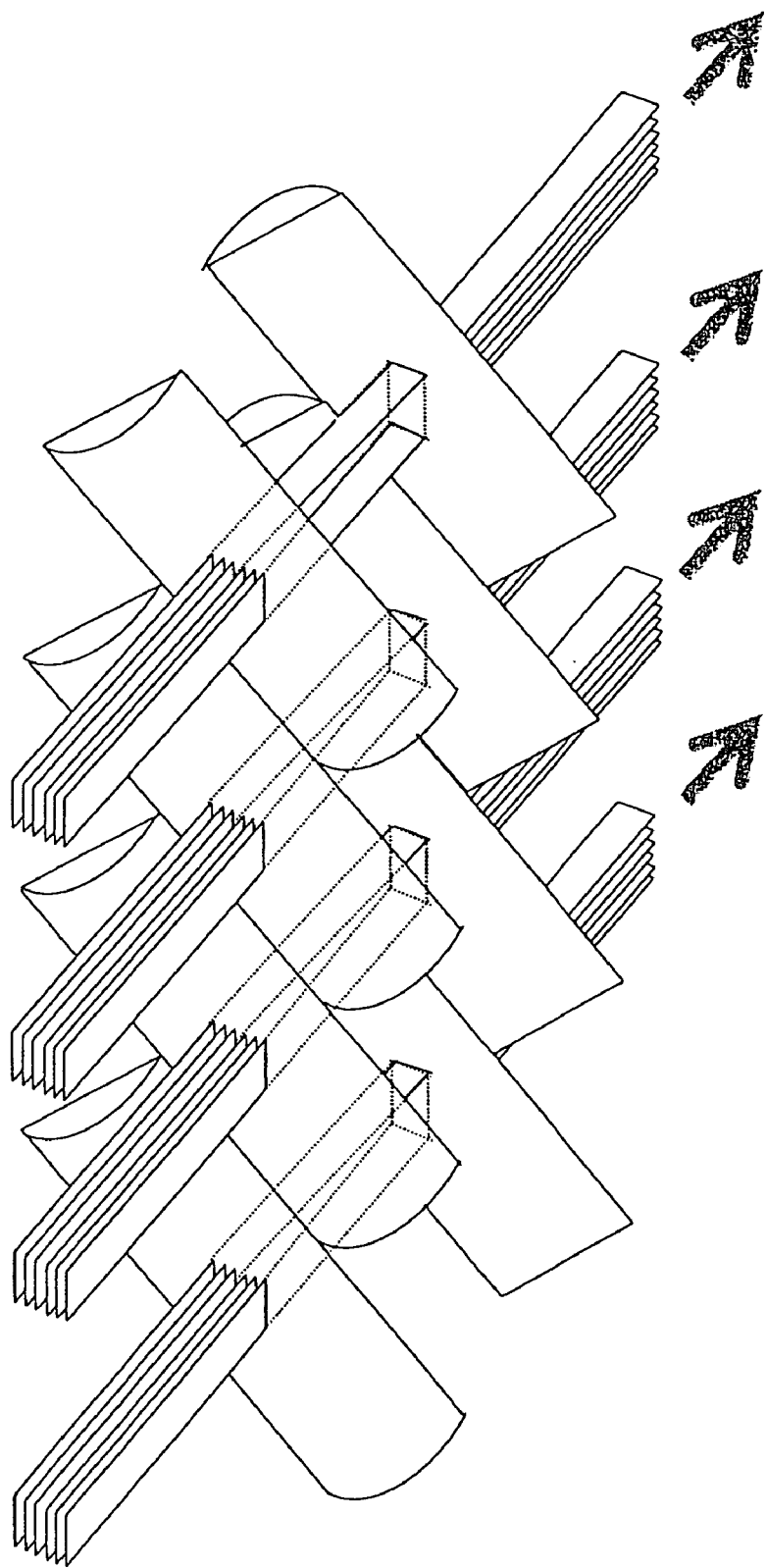
FIG. 31 is a perspective view showing a second beam converter with cylindrical lenses arranged in parallel, and the beam conversion by the same converter.

FIG. 31 is a diagram showing a second beam converter with cylindrical lenses arranged in parallel. In this beam converter, the cylindrical lenses with the axes thereof inclined by 45 degrees are arranged in parallel in appropriately spaced opposed relation with each other.

The compressed parallel laser beam columns entering in parallel to the plane of incidence have the cross section thereof turned under the effect of different refracting power at different incidence points by the cylindrical lenses inclined by 45 degrees. Further, the cross section of each beam of the beam columns is turned by the cylindrical lenses which are turned by 45 degrees from the exit plane. Thus, the beam columns with the cross section turned by a total of about 90 degrees exit by way of the exit plane.

As the result of using the second beam converter, the parallel laser beam columns compressed by the beam compressor and aligned are converted into a form in which all the laser beams are aligned substantially in parallel like a ladder. In the process, the intervals of all the ladder steps need not be the same.

Figure 32:
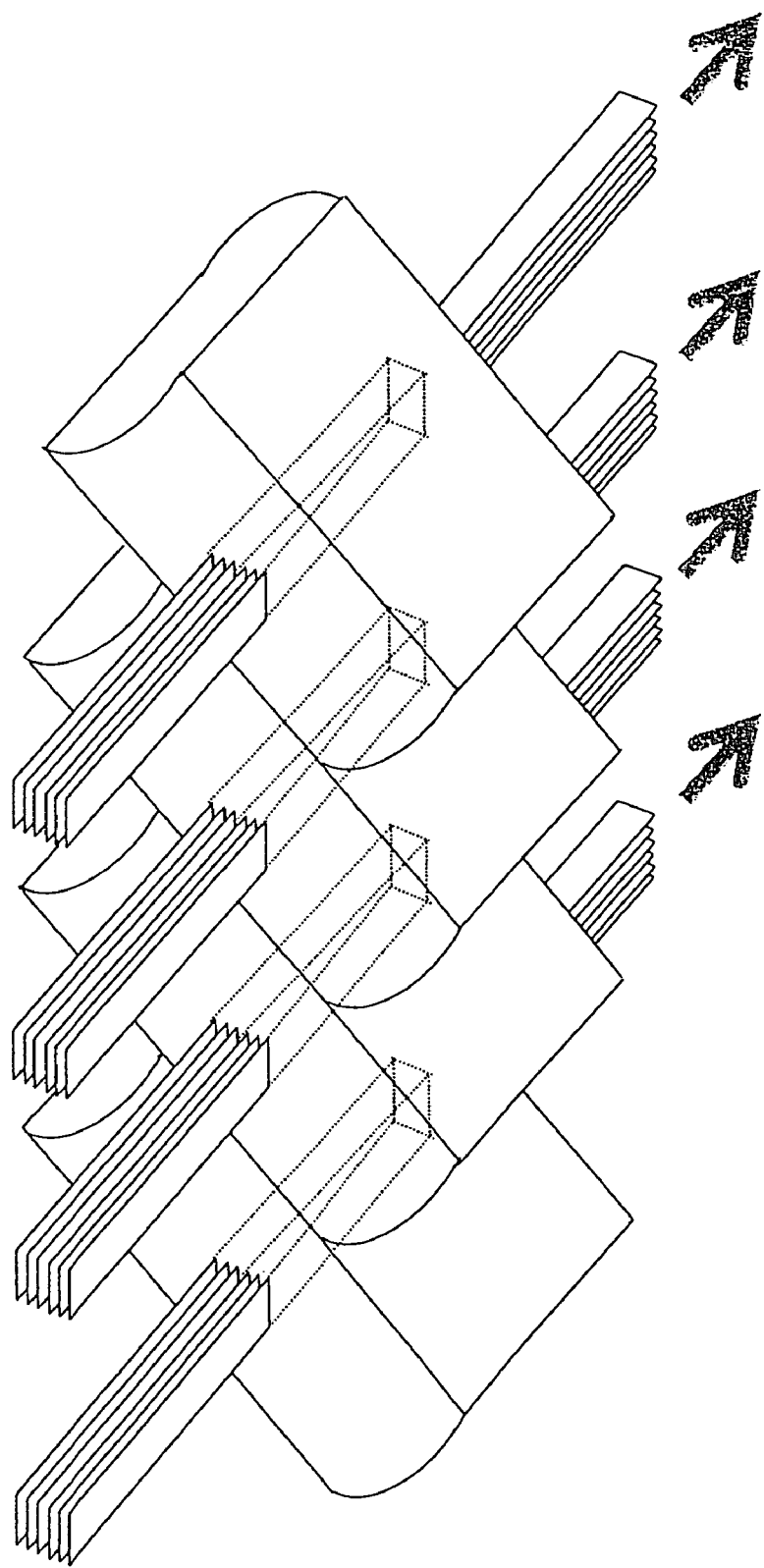
FIG. 32 is a perspective view showing a second beam converter with parallel optical elements having the plane of incidence and the exit plane with cylindrical surfaces, and the beam conversion by the same converter.

FIG. 32 shows a beam converter including a plurality of mutually-coupled optical elements of optical glass. In these optical elements, the plane of incidence and the exit plane have a cylindrical surface, and the side surfaces are parallel with a solid interior. The optical elements are inclined by 45 degrees to the horizontal surface. The compressed parallel laser beam columns entering in parallel to the plane of incidence have the cross section thereof turned under different refracting power generated on the cylindrical surface of the plane of incidence inclined by 45 degrees. Further, the cross section of the beam columns is turned by the cylindrical surface of the exit plane inclined by 45 degrees. In this way, the laser beams turned by a total of about 90 degrees exit from the exit plane.

By the use of the second beam converter, the parallel laser beam columns compressed by the beam compressor are aligned. Thus, substantially all the laser beams are converted into a single parallel arrangement in ladder form. In the process, the intervals of all the ladder steps need not be equal. As long as the intervals between the adjacent compressed parallel laser beam columns are matched, the side surfaces need not be parallel. Thus, a cylindrical lens with a round cross section can be also used.

Figure 33:
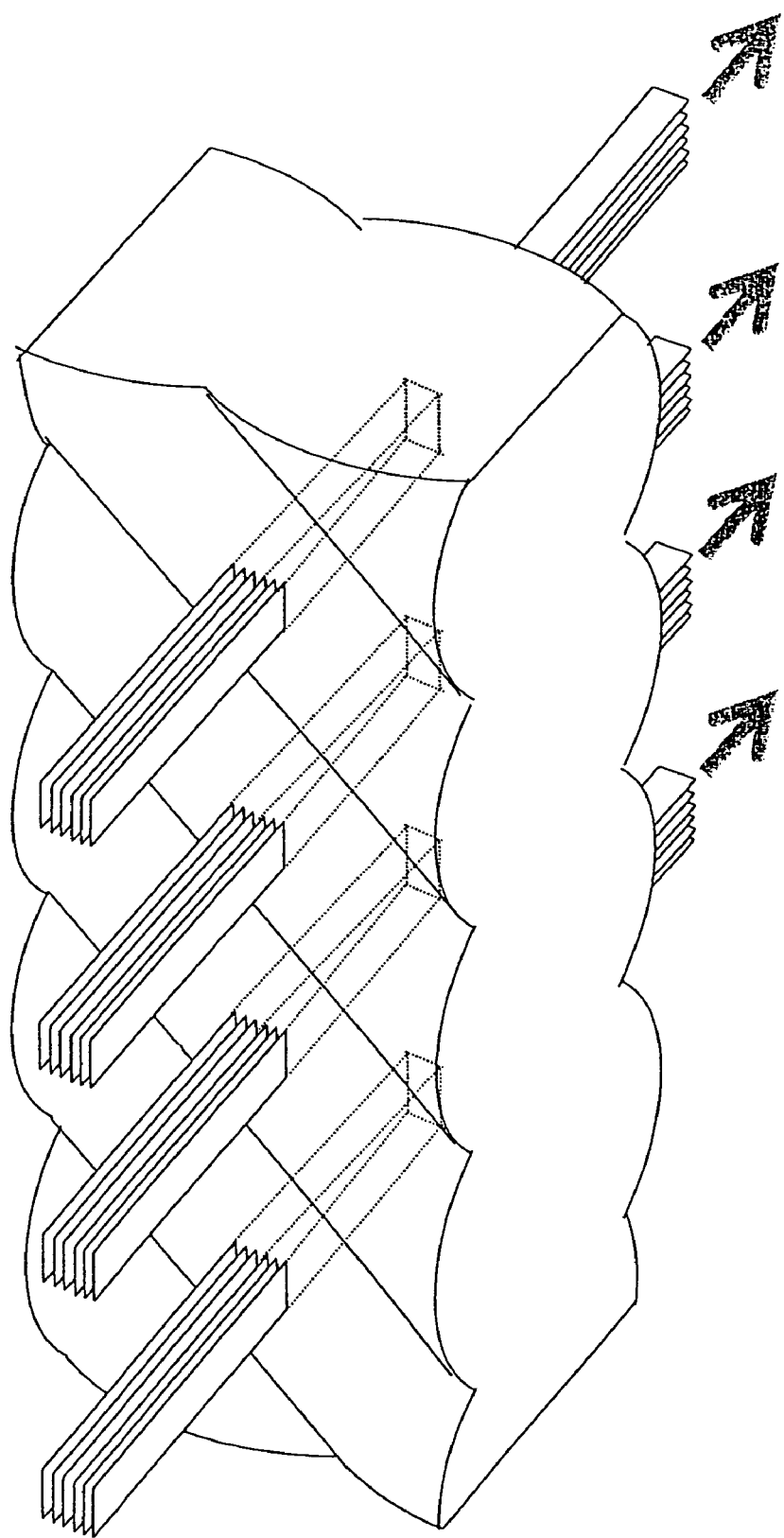
FIG. 33 is a perspective view showing a second beam converter fabricated of blocks of optical glass, and the beam conversion by the same converter.

FIG. 33 shows a second beam converter fabricated from an optical glass block. In this beam converter, a plurality of cylindrical surfaces inclined by 45 degrees in the same direction are formed on the plane of incidence and the exit plane of optical glass having a rectangular cross section. This beam converter has the same functions as the beam converter shown in FIG. 32.

Figure 34:
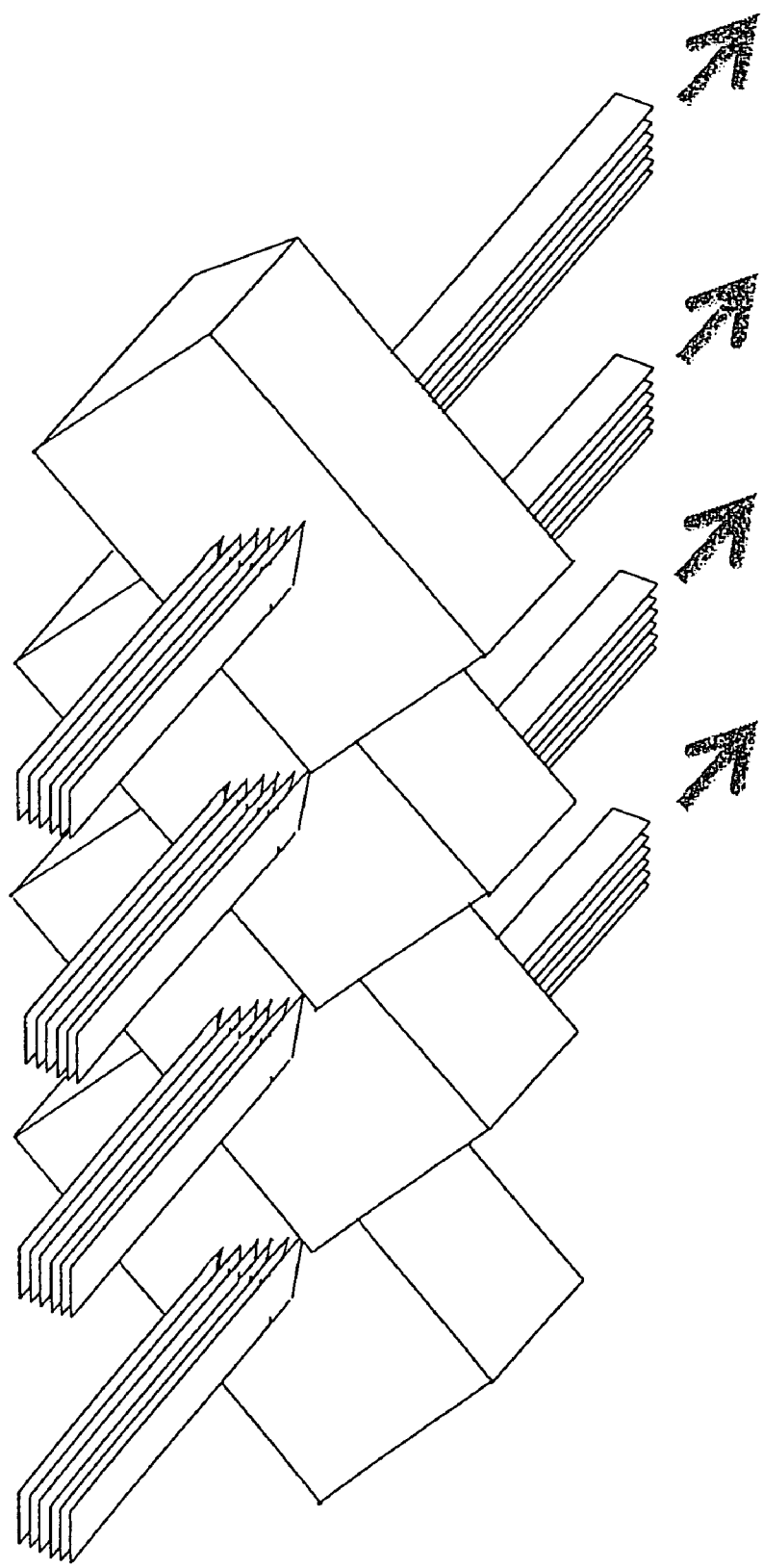
FIG. 34 is a perspective view showing a second beam converter with dove prisms arranged in parallel, and the beam conversion by the same converter.

FIG. 34 shows a second beam converter utilizing dove prisms. The compressed parallel laser beam columns entering the plane of incidence horizontally are refracted by the plane of incidence of the dove prisms inclined by 45 degrees, and reflected at different positions on the bottom surface due to the different points of incidence. The laser beam columns are refracted and exit from the exit plane, therefore, with the cross section thereof turned by about 90 degrees. In the case where adjacent dove prisms are coupled to each other, the bottom surface of the dove prisms may be reflection coated as required.

Figure 35:
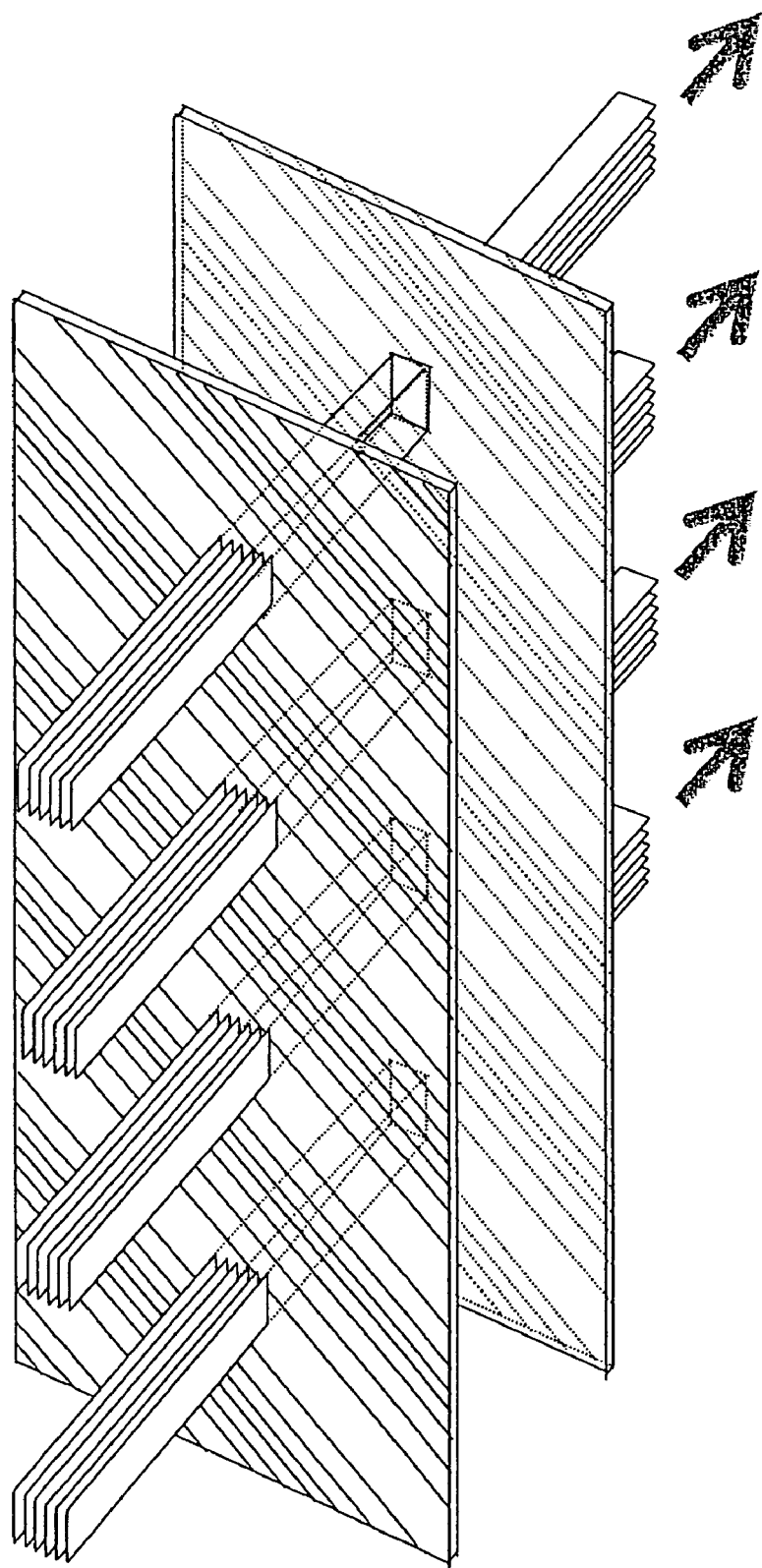
FIG. 35 is a perspective view showing a second beam converter with binary optics arranged in parallel, and the beam conversion by the same converter.

FIG. 35 shows a second beam converter utilizing the binary optics. In this beam converter, a plurality of stepped surfaces with the center axis inclined by 45 degrees in the same direction are formed on the plane of incidence and the exit plane. The compressed parallel laser beam columns entering by way of the plane of incidence horizontally are turned under the effect of different refracting power generated on the stepped surface of the plane of incidence inclined by 45 degrees, and after being again turned by the stepped surface of the exit plane inclined by 45 degrees, exit from the exit surface with the cross sections thereof turned by 90 degrees.

Figure 36:
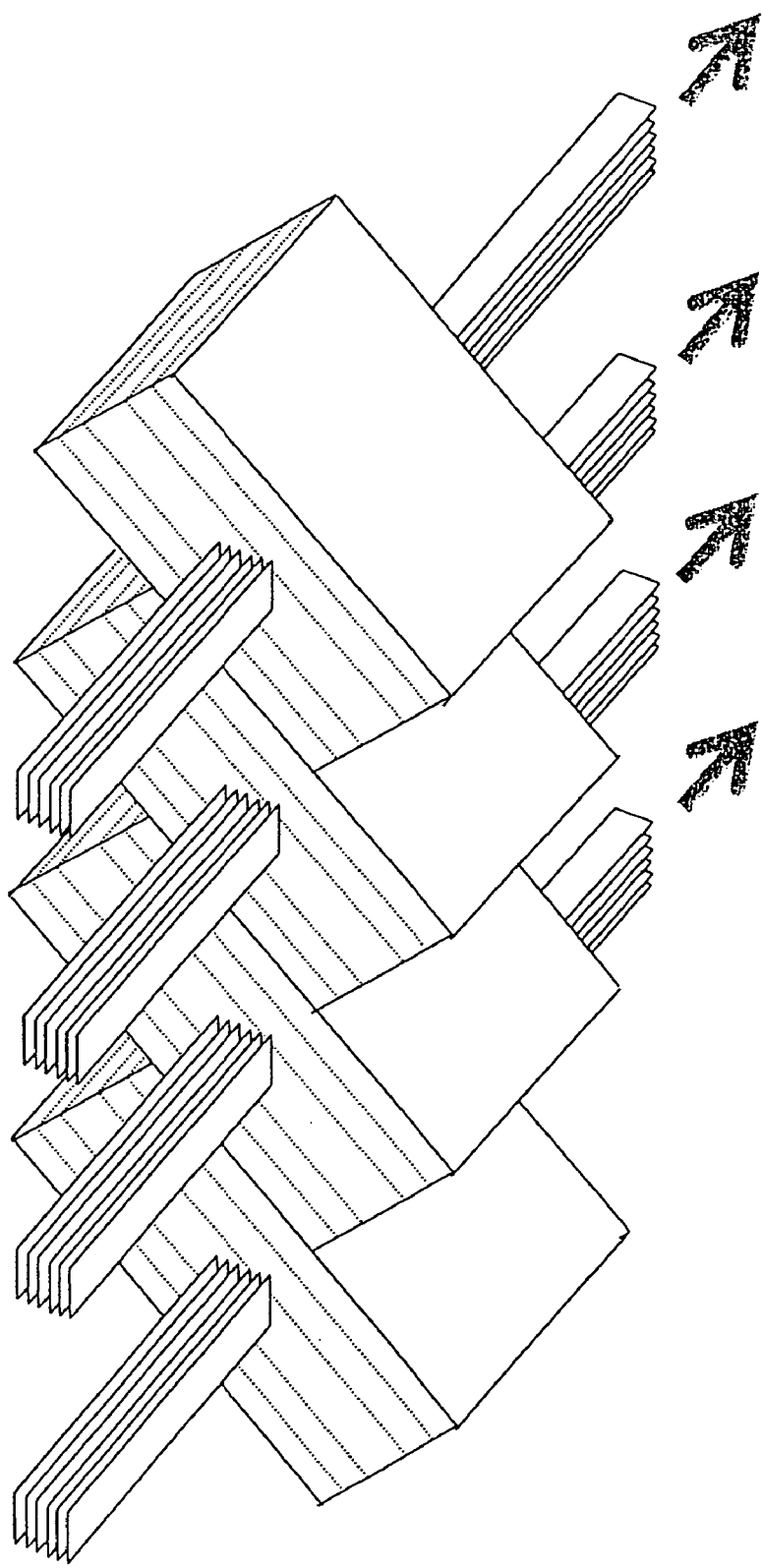
FIG. 36 is a perspective view showing a second beam converter with one-dimensional graded index lens elements arranged in parallel, and the beam conversion by the same converter.

FIG. 36 shows a second beam converter using one-dimensional graded index lenses. This beam converter comprises a plurality of one-dimensional graded index lenses of an optical glass material coupled to each other at 45 degrees, in each of which the refractive index is highest at the central surface and becomes lower, the closer to the side surface. The compressed parallel laser beam columns entering the plane of incidence horizontally are turned under the effect of different refracting power at different points of incidence in the one-dimensional graded index lenses inclined by 45 degrees, and exit from the exit plane with the cross section thereof turned by 90 degrees.

Figure 37:
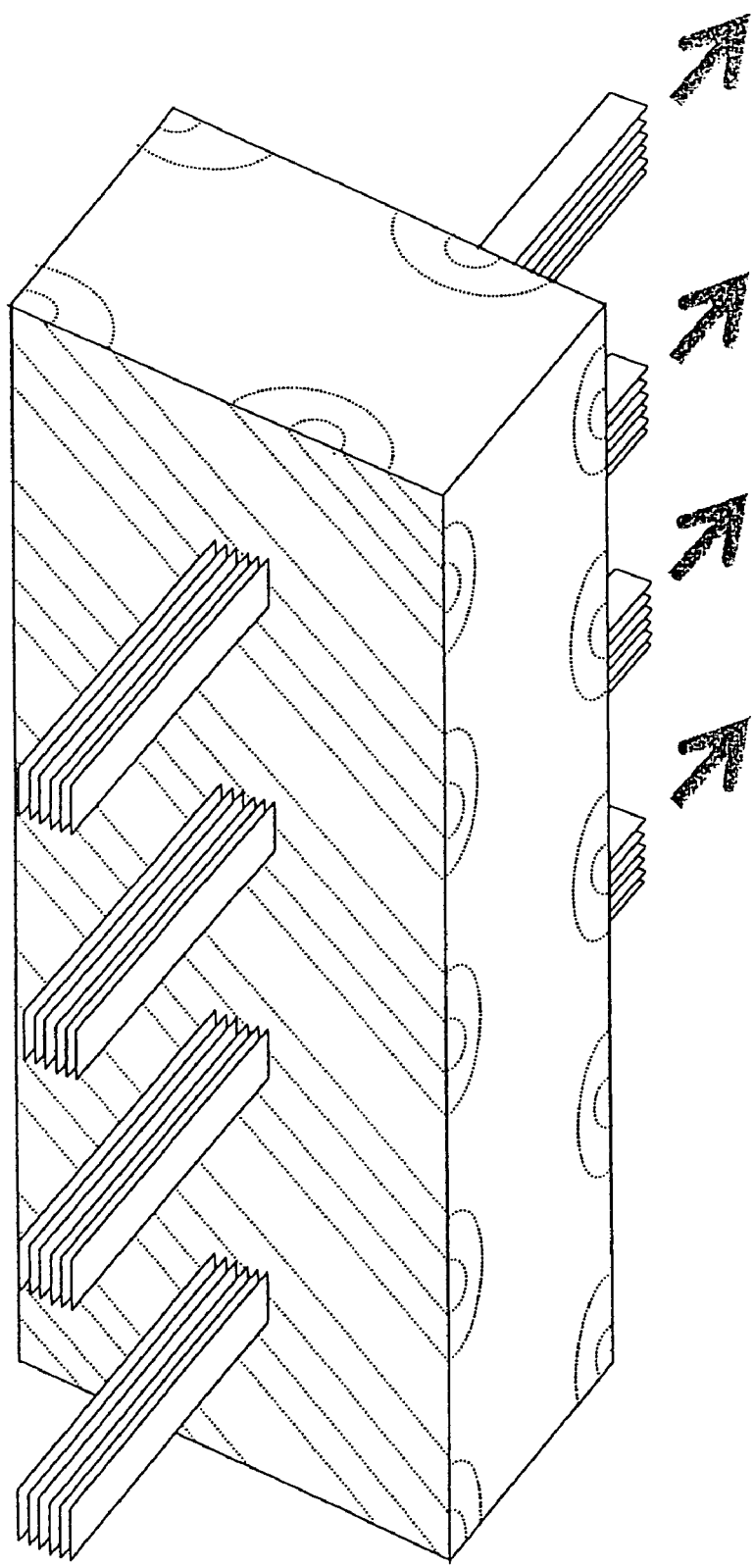
FIG. 37 is a perspective view showing a second beam converter with truncated cylindrical graded index lens elements arranged in parallel, and the beam conversion by the same converter.

FIG. 37 shows a second beam converter using graded index lens elements arranged in opposed relation to each other. This beam converter comprises a plurality of pairs of substantially semicylindrical graded index lens elements arranged in opposed relation with each other are formed in the same direction on the two surfaces of an optical glass plate. The center axis of each semicylinder is inclined by 45 degrees with respect to the horizontal surface, in such a manner that the refractive index is highest at the center of the semicircle and decreases outward. The compressed parallel laser beam columns entering the plane of incidence horizontally are turned under the effect of different refracting power at different points of incidence by the graded index lens elements inclined by 45 degrees, and exit by way of the exit plane with the cross section thereof turned by 90 degrees.

Figure 38:
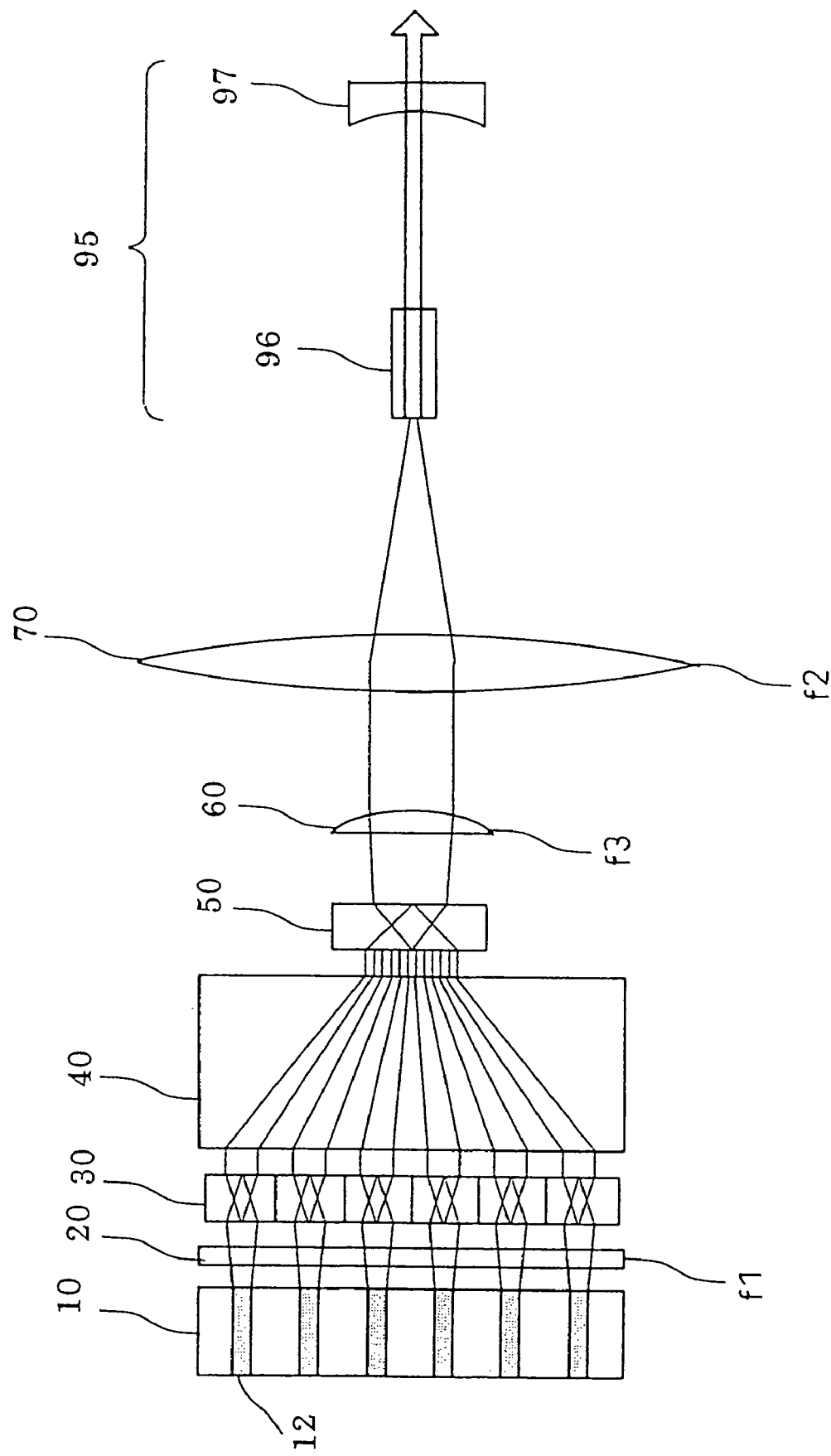
FIG. 38 is a plane view of a block diagram for explaining the LD pumped solid-state laser device according to the present invention.
Figure 39:
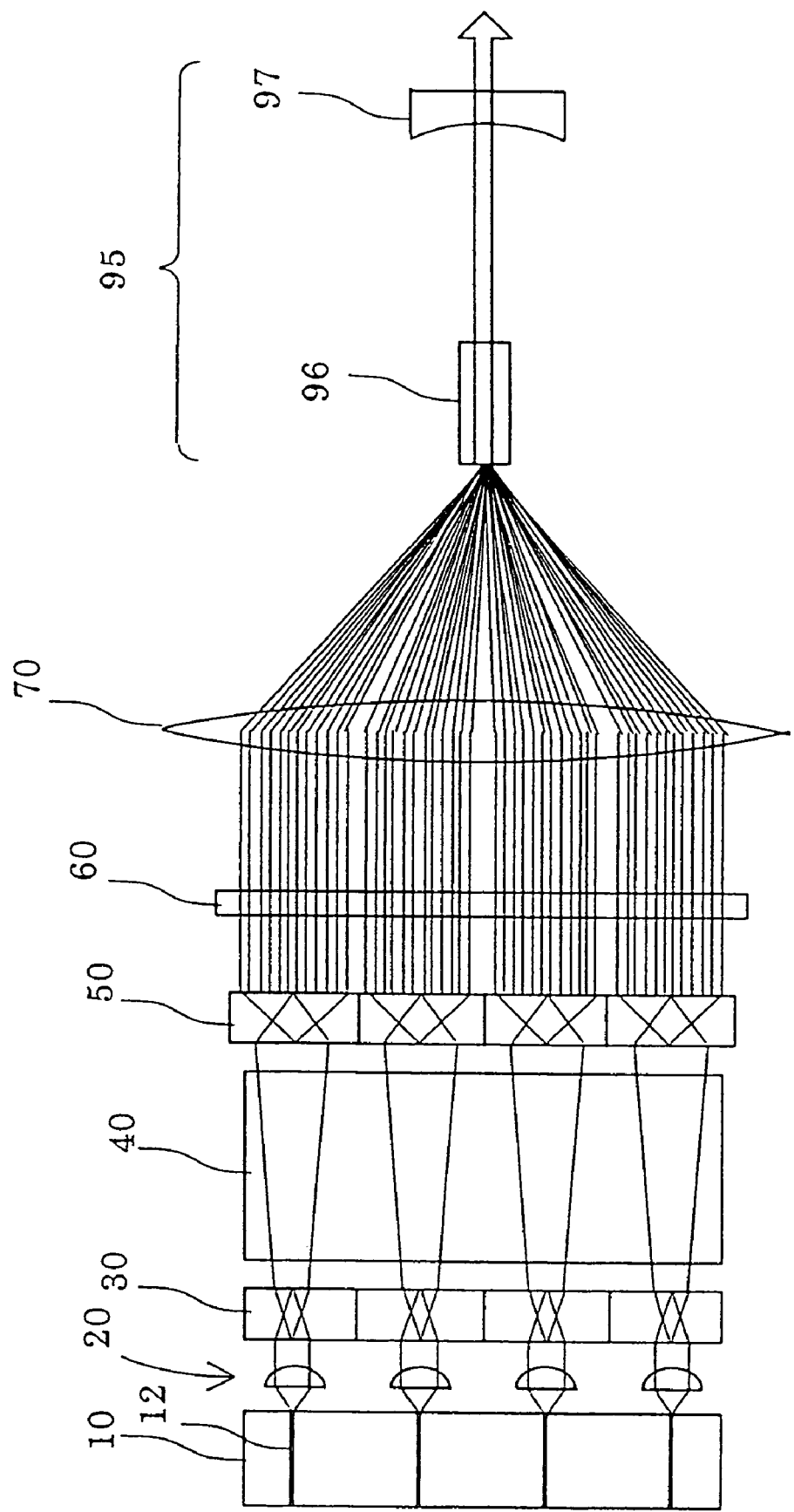
FIG. 39 is an elevation of the block diagram used for explaining the LD pumped solid-state laser device shown in FIG. 38.

FIG. 38 is plane view of a block diagram for explaining a LD pumped solid-state laser device according to the present invention, and FIG. 39 is an elevation thereof. The LD pumped solid-state laser device uses the semiconductor laser device according to the present invention as an exciting light source of the solid-state laser 95. In the conventional semiconductor laser device using the stack array laser diode, the energy concentrated by an optical system is imparted in a relatively large elongated area, and therefore the substantial energy density is not large. Also, an attempt to use this energy efficiently fails to excite other than from the side surfaces of the solid-state laser medium.

In the LD pumped solid-state laser device according to the present invention, the dotted light emitting stripes of the stack array laser diode 10 are collimated in the direction perpendicular to the stripes by a first cylindrical lens array 20 having the short focal length f1. After that, a plurality of the beam columns are converted into a plurality of ladder-shaped columns of laser beams by use of the first beam converter 30, and each beam column is compressed by the beam compressor 40. Also, each beam column is turned by the second beam converter 50, so that the laser beam columns are converted into a form in which all the beams are aligned in parallel arrangement. Next, the ladder-shaped laser beam columns are collimated in horizontal direction by the second cylindrical lens 60 having the long focal length f3, and then energy is converged in a small area on the light receiving surface of a solid-state laser medium element 96 by a focusing lens 70.

With the semiconductor laser device according to the present invention, as described above, energy can be concentrated in a predetermined narrow area by use of different focusing power in vertical direction f2/f1 and horizontal direction f2/f3. The LD pumped solid-state laser device according to the present invention utilizing the semiconductor laser device according to the present invention, therefore, can make the best use of the output of the stack array laser diode 10 on the one hand and can excite the end surface of the solid-state laser 95 at the same time In addition to the normal solid-state laser media such as YAG and YLF, the optical elements including the wavelength conversion element or the Q switching element can be also used.

Also, the exciting light source may enter the solid-state laser medium at the Brewater angle. The solid-state laser medium may be a short-absorption length laser material such as $YVO_4$. The LD pumped solid-state laser device according to the present invention makes it possible to produce the YAG laser output of 100 W using the semiconductor laser power of 300 W.

Figure 40:
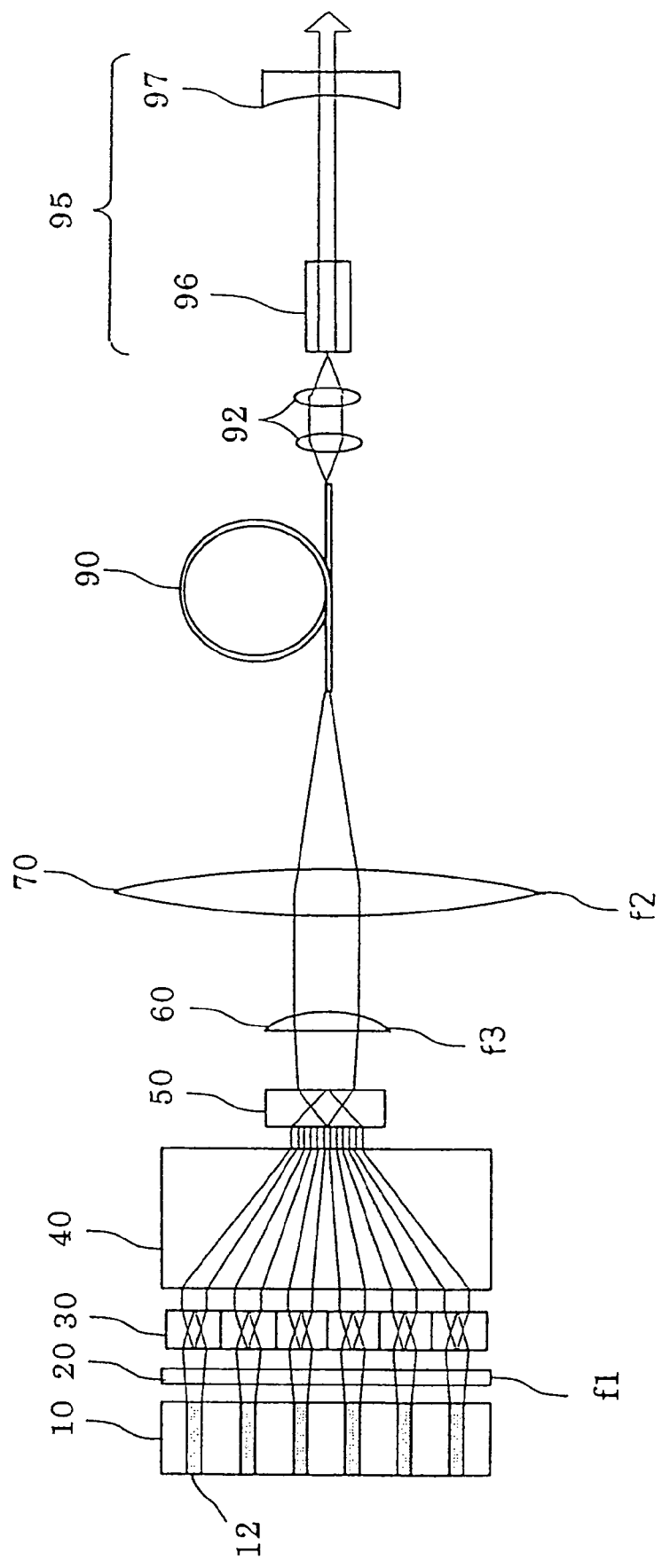
FIG. 40 is a plane view of the block diagram for explaining the optical fiber-led light LD pumped solid-state laser device according to the present invention.
Figure 41:
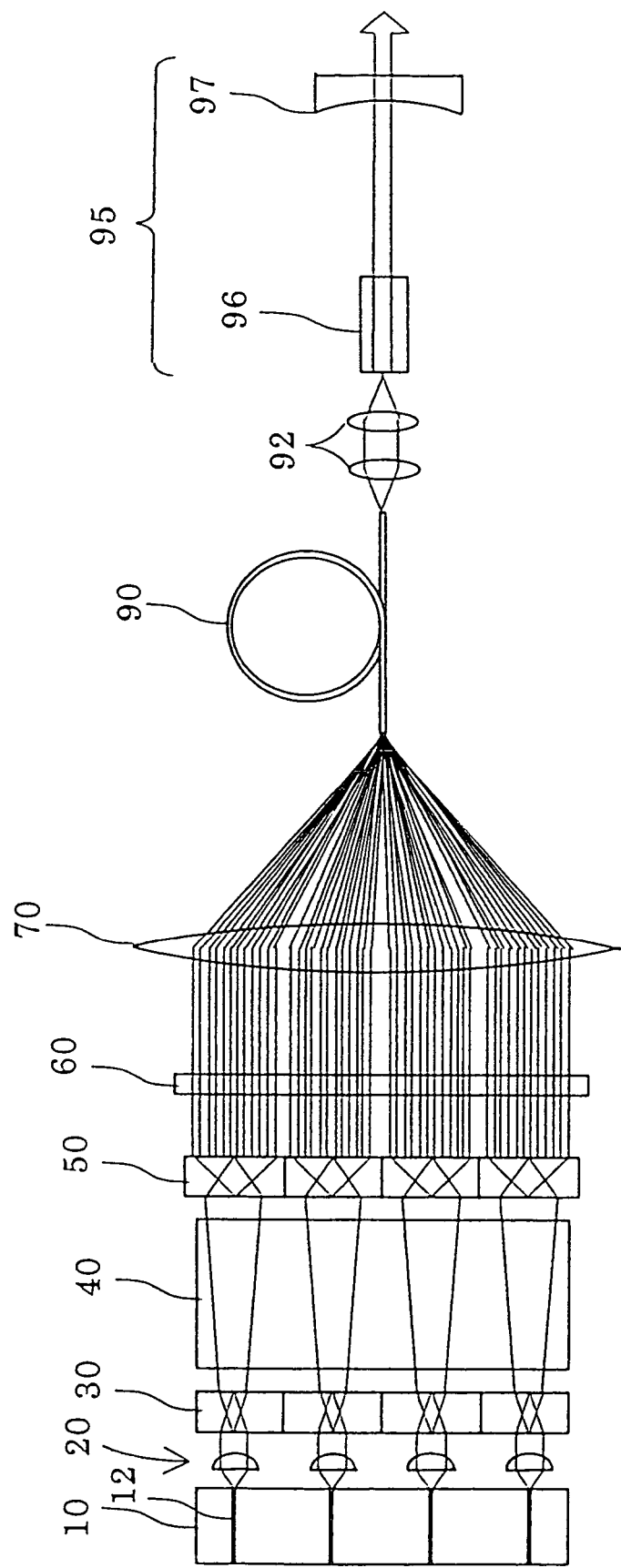
FIG. 41 is an elevation of the block diagram for explaining the optical fiber-led LD pumped solid-state laser device.

FIG. 40 is a plane view of a block diagram for explaining an optical fiber-led LD pumped solid-state laser device according to the present invention, and FIG. 41 is an elevation thereof. The optical fiber-led LD pumped solid-laser laser device conducts the output of the semiconductor laser device according to the present invention by an optical fiber 90 to make up an exciting light source for the solid-state laser 95. The output portion of the optical fiber has an optical system 92 for collimating and refocusing the energy of the laser beam radiated from the end portion.

As described above, the interposition of the flexible optical fiber between the semiconductor laser device portion and the solid-state laser device portion leads to the advantage of a remarkably increased freedom of the device and facilitates the configuration. The optical fiber-led LD pumped solid-state laser device according to the present invention can produce a YAG laser output of 80 W using a semiconductor laser power of 400 W.

The semiconductor laser device according to the present invention can concentrate the laser energy generated by a stack array laser diode in a very small area, and therefore finds satisfactory applications in the fields of laser machining and medicine. Also, the semiconductor laser device which has produced the effect of arranging the emitters of the stack array semiconductor laser substantially in the form of a single ladder-like column using the beam converter according to the invention can concentrate the energy of the stack array semiconductor laser at a very small focal point. Further, the LD pumped solid-state laser device according to the invention makes possible the end surface excitation utilizing a strong semiconductor laser, thereby producing a solid laser output very efficient and high in quality.

The invention claimed is:

1. A semiconductor laser device, comprising:
a stack array laser diode including a plurality of laser beam elements arranged in a plurality of columns in a two-dimensional array in a manner such that each of a plurality of emitters extending in a first direction for emitting laser beams are aligned as a plurality of columns in a direction perpendicular to the first direction;
a first condenser arranged in front of the stack array laser diode for a collimation by refracting each column of the laser beams in a second direction that is substantially perpendicular to the first direction;
a first beam converter arranged in front of the first condenser for receiving the laser beams collimated in the second direction and radiating by converting each group of the laser beams into a substantially ladder-shaped laser beam column that extends in the first direction;
a beam compressor configured to receive a plurality of columns of the substantially ladder-shaped laser beam groups and radiating by converting the columns of the laser beam groups into a plurality of columns of substantially ladder-shaped laser beam groups that are compressed into a form having shorter intervals of ladder steps and extending in the first direction;
a second beam converter arranged in front of the beam compressor for receiving the plurality of the columns of the substantially ladder-shaped laser beam groups extending in the first direction with shortened intervals of the ladder steps, and converting each column of the substantially ladder-shaped laser beam groups extending in the first direction into a corresponding column of substantially ladder-shaped laser beam groups extending in the second direction, wherein all of the laser beams are converted into substantially ladder-shaped laser beam groups that are aligned in the second direction;
a second condenser configured for a parallelization by collimating the substantially ladder-shaped aligned laser beams in the direction substantially perpendicular to the second direction; and
a third condenser configured to condense the laser beams radiated from the second condenser at a focal point.

2. The semiconductor laser device according to claim 1, further comprising a fourth condenser arranged between the first beam converter and the beam compressor for collimating by refracting each column of the laser beams in a second direction substantially perpendicular to the first direction.

3. The semiconductor laser device according to claim 2, wherein the fourth condenser is a one-dimensional array of cylindrical lenses.

4. The semiconductor laser device according to claim 1, further comprising an optical fiber having an end surface arranged in a focal plane of the third condenser.

5. The semiconductor laser device according to claim 1, wherein the first condenser is a one-dimensional array of cylindrical lenses.

6. The semiconductor laser device according to claim 1, wherein the beam compressor is one of an anamorphic prism and a pair of anamorphic prisms.

7. The semiconductor laser device according to claim 1, wherein the first beam converter comprises a plurality of optical elements each including:
i. a light receiving portion for receiving the incident light having a first axis in the cross section thereof perpendicular to the optical axis,
ii. an optical system for turning the first axis of the cross section of the light beam at substantially right angles, and
iii. a light exit portion for emitting the exit light beams passed through the optical system, and
wherein the optical elements are arranged two-dimensionally on the radiation surface of the stack array laser diode so that the light receiving portion and the light exit portion are arranged adjacently to each other two-dimensionally on the same plane as a beam converter.

8. The semiconductor laser device according to claim 7, wherein the optical elements each provide a space defined by reflection surfaces including the first reflection surface vertical and inclined by about 45 degrees with respect to the incident light beams, the second reflection surface being provided parallel to the incident light beams and inclined by about 45 degrees with respect to the horizontal plane, and wherein the third reflection surface are perpendicular to the vertical surface parallel to the incident light beams, parallel to the crossing line between the first reflection surface and the second reflection surface, and inclined by about 45 degrees with respect to the horizontal plane.

9. The semiconductor laser device according to claim 7, wherein second beam converter comprises a plurality of optical elements each including:
i. a light receiving portion for receiving the incident light having a first axis of the cross section thereof perpendicular to the optical axis,
ii. an optical system for turning the first axis of the cross section of the light beam at substantially right angles, and
iii. a light exit portion for emitting the exit light beams passed through the optical system, and
wherein the optical elements are arranged with the light receiving portion and the light exit portion linearly adjacently to each other on the same plane so that the optical elements correspond to the radiation surface of each of a plurality of columns of the substantially ladder-shaped laser beams radiated from the beam compressor with shortened intervals of ladder steps.

10. The semiconductor laser device according to claim 9, wherein the optical element is a prism having a first total reflection surface, a second total reflection surface, a third total reflection surface, a plane of incidence, an exit plane and a coupling surface, wherein the first total reflection surface, the second total reflection surface and the third total reflection surface cross each other at an angle of 60 degrees, the plane of incidence and the exit plane are provided parallel to each other, cross the second total reflection surface at right angles and are inclined by about 45 degrees with respect to the first and third total reflection surfaces, wherein the coupling surface is parallel to the second total reflection surface, and wherein the third total reflection surface, the plane of incidence and the exit plane of a prism are located adjacently to each other on the same plane and coupled with the coupling surface and the second total reflection surface of an adjoining prism, a one-dimensional array of the prisms being used as the second beam converter, the prisms in a two-dimensional array including a parallel of the one-dimensional arrays being used as the first beam converter.

11. The semiconductor laser device according to claim 9, wherein the second beam converter is an optical glass structure including first and second flat surfaces parallel to each other, a third flat surface crossing the first flat surface at an included angle of 135 degrees, and a fourth flat surface having surface portions periodically bent at an angle of 60 degrees and continuously formed in corrugated form with ridges and valleys extending in such a direction as to cross the first flat surface at an angle of $\tan^{-1}(1/\sqrt{2})$, each ridge line and each valley line being parallel to the third flat surface, wherein the first flat surface constitutes a plane of incidence, the second flat surface constitutes an exit plane, that portion of the bent surface forming the fourth surface which crosses the first flat surface at an included angle of 45 degrees constitutes a first reflection surface, another surface portion of the bent surface constitutes a second reflection surface, and the third flat surface constitutes a third reflection surface, and wherein a one-dimensional array of a plurality of the optical glass members arranged in parallel is used as the first beam converter.

12. The semiconductor laser device according to claim 9, wherein the second beam converter is a mirror structure including a first surface crossing a flat surface perpendicular to the optical axis of the incident light at an included angle of 135 degrees, and a second surface having regularly bent surfaces continuously formed in corrugated form with ridges and valleys at a bending angle of 60 degrees and extending in such a direction as to cross the flat surface perpendicular to the optical axis of the incident light at an angle of $\tan^{-1}(1/\sqrt{2})$, each ridge line and each valley line being parallel with the first flat surface, wherein the first flat surface and the second surface are mirror finished, that portion of the bent surface making up the second surface which crosses the flat surface perpendicular to the optical axis of the incident light at an included angle of 45 degrees constitutes a first reflection surface, the other portion of the bent surface constitutes a second reflection surface, and the first flat surface constitutes a third reflection surface, and wherein a one-dimensional array of a plurality of the mirror structures arranged in parallel is used as the first beam converter.

13. The semiconductor laser device according to claim 7, wherein the optical element includes a pair of convex cylindrical lenses arranged in predetermined spaced opposed relation with each other with the axes thereof inclined by about 45 degrees.

14. The semiconductor laser device according to claim 7, wherein the beam converter is a one-dimensional array of a plurality of pairs of the convex cylindrical lenses arranged in predetermined spaced opposed relation with each other with the axes thereof inclined by about 45 degrees.

15. The semiconductor laser device according to claim 7, wherein the optical element is a cylindrical lens having a convex lens portion at each side end surface thereof, and a plurality of the optical elements are coupled to each other at an angle of about 45 degrees to the incident light beams.

16. The semiconductor laser device according to claim 7, wherein the beam converter is a one-dimensional array of a plurality of cylindrical lenses having a convex lens portion at each side end surface thereof and coupled to each other at an angle of about 45 degrees to the incident light beams.

17. The semiconductor laser device according to claim 7, wherein the beam converter is a prism of optical glass having a rectangular cross section, wherein a plurality of cylindrical surfaces inclined by about 45 degrees in approximately the same direction are formed on the plane of incidence and the exit plane, and wherein the light beams entering each cylindrical surface exit with the cross section thereof turned by about 90 degrees.

18. The semiconductor laser device according to claim 7, wherein the optical element is a dove prism having a trapezoidal cross section, and wherein a plurality of the optical elements are arranged at an angle of about 45 degrees.

19. The semiconductor laser device according to claim 7, wherein the optical element includes a pair of optical units arranged in opposed relation to each other with the center axis thereof inclined by about 45 degrees, the power of the optical units being changed by diffraction only in the direction perpendicular to the center axis thereof.

20. The semiconductor laser device according to claim 7, wherein the beam converter includes a pair of binary optic elements arranged on the incidence side and the exit side, respectively, in predetermined spaced opposed relation with each other, wherein the surfaces of the incidence-side binary optic element and the exit-side binary optic element are formed with a plurality of stepped surfaces symmetric about the center axis inclined by about 45 degrees and having the depth changed so as to change the power only in the direction perpendicular to the center axis, and wherein the laser beams incident at each of the axially symmetric stepped surfaces exit with the cross section thereof turned by about 90 degrees.

21. The semiconductor laser device according to claim 7, wherein the optical element includes an optical unit so structured that the refractive index thereof changes continuously and the power of the optical unit is changed only in the direction perpendicular to the direction of the arrangement thereof, the optical unit being arranged at about 45 degrees with respect to a horizontal surface.

22. The semiconductor laser device according to claim 7, wherein the beam converter includes a plurality of one-dimensional graded index lens elements of an optical glass material whose refractive index is highest on the central surface, and lower closer to the side surface thereof, a plurality of the lens units being coupled to each other with the central surface inclined by about 45 degrees to the horizontal surface.

23. The semiconductor laser device according to claim 7, wherein the beam converter includes a plurality of pairs of semicylindrical graded index lens elements inclined by about 45 degrees and arranged in opposed relation to each other in the same direction on the two surfaces of an optical glass plate, the refractive index of the lens element being highest at the center of the semicircle and progressively decreased outward.

24. The semiconductor laser device according to claim 1, wherein second beam converter comprises a plurality of optical elements each including:
   i. a light receiving portion for receiving the incident light having a first axis of the cross section thereof perpendicular to the optical axis,
   ii. an optical system for turning the first axis of the cross section of the light beam at substantially right angles, and
   iii. a light exit portion for emitting the exit light beams passed through the optical system, and wherein the optical elements are arranged with the light receiving portion and the light exit portion linearly adjacently to each other on the same plane so that the optical elements correspond to the radiation surface of each of a plurality of columns of the substantially ladder-shaped laser beams radiated from the beam compressor with shortened intervals of ladder steps.

25. The semiconductor laser device according to claim 24, wherein the optical elements each provide a space defined by reflection surfaces including the first reflection surface vertical and inclined by about 45 degrees with respect to the incident light beams, the second reflection surface being provided parallel to the incident light beams and inclined by about 45 degrees with respect to the horizontal plane, and wherein the third reflection surface are perpendicular to the vertical surface parallel to the incident light beams, parallel to the crossing line between the first reflection surface and the second reflection surface, and inclined by about 45 degrees with respect to the horizontal plane.

26. The semiconductor laser device according to claim 24, wherein the optical element includes a pair of convex cylindrical lenses arranged in predetermined spaced opposed relation with each other with the axes thereof inclined by about 45 degrees.

27. The semiconductor laser device according to claim 24, wherein the beam converter is a one-dimensional array of a plurality of pairs of the convex cylindrical lenses arranged in predetermined spaced opposed relation with each other with the axes thereof inclined by about 45 degrees.

28. The semiconductor laser device according to claim 24, wherein the optical element is a cylindrical lens having a convex lens portion at each side end surface thereof, and a plurality of the optical elements are coupled to each other at an angle of about 45 degrees to the incident light beams.

29. The semiconductor laser device according to claim 24, wherein the beam converter is a one-dimensional array of a plurality of cylindrical lenses having a convex lens portion at each side end surface thereof and coupled to each other at an angle of about 45 degrees to the incident light beams.

30. The semiconductor laser device according to claim 24, wherein the beam converter is a prism of optical glass having a rectangular cross section, wherein a plurality of cylindrical surfaces inclined by about 45 degrees in approximately the same direction are formed on the plane of incidence and the exit plane, and wherein the light beams entering each cylindrical surface exit with the cross section thereof turned by about 90 degrees.

31. The semiconductor laser device according to claim 24, wherein the optical element is a dove prism having a trapezoidal cross section, and wherein a plurality of the optical elements are arranged at an angle of about 45 degrees.

32. The semiconductor laser device according to claim 24, wherein the optical element includes a pair of optical units arranged in opposed relation to each other with the center axis thereof inclined by about 45 degrees, the power of the optical units being changed by diffraction only in the direction perpendicular to the center axis thereof.

33. The semiconductor laser device according to claim 24, wherein the beam converter includes a pair of binary optic elements arranged on the incidence side and the exit side, respectively, in predetermined spaced opposed relation with each other, wherein the surfaces of the incidence-side binary optic element and the exit-side binary optic element are formed with a plurality of stepped surfaces symmetric about the center axis inclined by about 45 degrees and having the depth changed so as to change the power only in the direction perpendicular to the center axis, and wherein the laser beams incident at each of the axially symmetric stepped surfaces exit with the cross section thereof turned by about 90 degrees.

34. The semiconductor laser device according to claim 24, wherein the optical element includes an optical unit so structured that the refractive index thereof changes continuously and the power of the optical unit is changed only in the direction perpendicular to the direction of the arrangement thereof, the optical unit being arranged at about 45 degrees with respect to a horizontal surface.

35. The semiconductor laser device according to claim 24, wherein the beam converter includes a plurality of one-dimensional graded index lens elements of an optical glass material whose refractive index is highest on the central surface, and lower closer to the side surface thereof, a plurality of the lens units being coupled to each other with the central surface inclined by about 45 degrees to the horizontal surface.

36. The semiconductor laser device according to claim 24, wherein the beam converter includes a plurality of pairs of semicylindrical graded index lens elements inclined by about 45 degrees and arranged in opposed relation to each other in the same direction on the two surfaces of an optical glass plate, the refractive index of the lens element being highest at the center of the semicircle and progressively decreased outward.

37. A semiconductor laser device, comprising:
a stack array laser diode including a plurality of laser beam elements arranged in a two-dimensional array, each of the laser beam elements including a plurality of emitters, wherein the emitter are one of:
i. aligned in a first direction in a plurality of columns for radiating laser beams, and
ii. aligned closely to each other in the first direction in a plurality of substantially continuously aligned columns of laser beams so that the columns are radiated as the laser beams;
a first condenser arranged in front of the stack array laser diode for a collimation by refracting each column of the laser beams in a second direction that is substantially perpendicular to the first direction;
a first beam converter arranged in front of the first condenser for dividing the laser beams in each of the columns into laser beam units, a plurality of optical elements being arranged in parallel in each column for bending an axis of a cross section of each of the laser beam units substantially at right angles, the first beam converter receiving the laser beam groups collimated in the second direction, and turning the axis of the cross section of each of the laser beam units for each optical element, thereby radiating the plurality of the divided laser beam units as substantially ladder-shaped laser beams extending in the first direction;
a beam compressor configured to receive the plurality of columns of substantially ladder-shaped laser beams, and converting the laser beams into a plurality of columns of the substantially ladder-shaped laser beams that extend in the first direction with shortened intervals between ladder steps;
a second beam converter arranged in front of the beam compressor for receiving a plurality of columns of substantially ladder-shaped laser beams extending in the first direction with shortened intervals between the ladder steps, and converting each column of the substantially ladder-shaped laser beams extending in the first direction into a corresponding column of the substantially ladder-shaped laser beams extending in the second direction, wherein all of the laser beams are radiated by being converted into an alignment of the substantially ladder-shaped laser beams extending in the second direction;

a second condenser configured for a parallelization by collimating the alignment of the substantially ladder-shaped laser beams in the direction that is substantially perpendicular to the second direction; and a third condenser configured to condense the laser beams radiated from the second condenser at a focal point.

38. The semiconductor laser device according to claim 37, further comprising a fourth condenser arranged between the first beam converter and the beam compressor for collimating by refracting each column of the laser beams in a second direction substantially perpendicular to the first direction.

39. The semiconductor laser device according to claim 38, wherein the fourth condenser is a one-dimensional array of cylindrical lenses.

40. The semiconductor laser device according to claim 37, further comprising an optical fiber having an end surface arranged in a focal plane of the third condenser.

41. The semiconductor laser device according to claim 37, wherein the first condenser is a one-dimensional array of cylindrical lenses.

42. The semiconductor laser device according to claim 37, wherein the beam compressor is one of an anamorphic prism and a pair of anamorphic prisms.

43. The semiconductor laser device according to claim 37, wherein the first beam converter comprises a plurality of optical elements each including:
  i. a light receiving portion for receiving the incident light having a first axis in the cross section thereof perpendicular to the optical axis,
  ii. an optical system for turning the first axis of the cross section of the light beam at substantially right angles, and
  iii. a light exit portion for emitting the exit light beams passed through the optical system, and
  wherein the optical elements are arranged two-dimensionally on the radiation surface of the stack array laser diode so that the light receiving portion and the light exit portion are arranged adjacently to each other two-dimensionally on the same plane as a beam converter.

44. The semiconductor laser device according to claim 43, wherein the optical elements each provide a space defined by reflection surfaces including the first reflection surface vertical and inclined by about 45 degrees with respect to the incident light beams, the second reflection surface being provided parallel to the incident light beams and inclined by about 45 degrees with respect to the horizontal plane, and wherein the third reflection surface are perpendicular to the vertical surface parallel to the incident light beams, parallel to the crossing line between the first reflection surface and the second reflection surface, and inclined by about 45 degrees with respect to the horizontal plane.

45. The semiconductor laser device according to claim 43, wherein second beam converter comprises a plurality of optical elements each including:
  i. a light receiving portion for receiving the incident light having a first axis of the cross section thereof perpendicular to the optical axis,
  ii. an optical system for turning the first axis of the cross section of the light beam at substantially right angles, and
  iii. a light exit portion for emitting the exit light beams passed through the optical system, and
  wherein the optical elements are arranged with the light receiving portion and the light exit portion linearly adjacently to each other on the same plane so that the optical elements correspond to the radiation surface of each of a plurality of columns of the substantially ladder-shaped laser beams radiated from the beam compressor with shortened intervals of ladder steps.

46. The semiconductor laser device according to claim 45, wherein the optical element is a prism having a first total reflection surface, a second total reflection surface, a third total reflection surface, a plane of incidence, an exit plane and a coupling surface, wherein the first total reflection surface, the second total reflection surface and the third total reflection surface cross each other at an angle of 60 degrees, the plane of incidence and the exit plane are provided parallel to each other, cross the second total reflection surface at right angles and are inclined by about 45 degrees with respect to the first and third total reflection surfaces, wherein the coupling surface is parallel to the second total reflection surface, and wherein the third total reflection surface, the plane of incidence and the exit plane of a prism are located adjacently to each other on the same plane and coupled with the coupling surface and the second total reflection surface of an adjoining prism, a one-dimensional array of the prisms being used as the second beam converter, the prisms in a two-dimensional array including a parallel of the one-dimensional arrays being used as the first beam converter.

47. The semiconductor laser device according to claim 45, wherein the second beam converter is an optical glass member including first and second flat surfaces parallel to each other, a third flat surface crossing the first flat surface at an included angle of 135 degrees, and a fourth flat surface having surface portions periodically bent at an angle of 60 degrees and continuously formed in corrugated form with ridges and valleys extending in such a direction as to cross the first flat surface at an angle of $\tan^{-1}(1/\sqrt{2})$, each ridge line and each valley line being parallel to the third flat surface, wherein the first flat surface constitutes a plane of incidence, the second flat surface constitutes an exit plane, that portion of the bent surface forming the fourth surface which crosses the first flat surface at an included angle of 45 degrees constitutes a first reflection surface, another surface portion of the bent surface constitutes a second reflection surface, and the third flat surface constitutes a third reflection surface, and wherein a one-dimensional array of a plurality of the optical glass members arranged in parallel is used as the first beam converter.

48. The semiconductor laser device according to claim 45, wherein the second beam converter is a mirror structure including a first surface crossing a flat surface perpendicular to the optical axis of the incident light at an included angle of 135 degrees, and a second surface having regularly bent surfaces continuously formed in corrugated form with ridges and valleys at a bending angle of 60 degrees and extending in such a direction as to cross the flat surface perpendicular to the optical axis of the incident light at an angle of $\tan^{-1}(1/\sqrt{2})$, each ridge line and each valley line being parallel with the first flat surface, wherein the first flat surface and the second surface are mirror finished, that portion of the bent surface making up the second surface which crosses the flat surface perpendicular to the optical axis of the incident light at an included angle of 45 degrees constitutes a first reflection surface, the other portion of the bent surface constitutes a second reflection surface, and the first flat surface constitutes a third reflection surface, and wherein a one-dimensional array of a plurality of the mirror structures arranged in parallel is used as the first beam converter.

49. The semiconductor laser device according to claim 43, wherein the optical element includes a pair of convex cylindrical lenses arranged in predetermined spaced opposed relation with each other with the axes thereof inclined by about 45 degrees.

50. The semiconductor laser device according to claim 43, wherein the beam converter is a one-dimensional array of a plurality of pairs of the convex cylindrical lenses arranged in predetermined spaced opposed relation with each other with the axes thereof inclined by about 45 degrees.

51. The semiconductor laser device according to claim 43, wherein the optical element is a cylindrical lens having a convex lens portion at each side end surface thereof, and a plurality of the optical elements are coupled to each other at an angle of about 45 degrees to the incident light beams.

52. The semiconductor laser device according to claim 43, wherein the beam converter is a one-dimensional array of a plurality of cylindrical lenses having a convex lens portion at each side end surface thereof and coupled to each other at an angle of about 45 degrees to the incident light beams.

53. The semiconductor laser device according to claim 43, wherein the beam converter is a prism of optical glass having a rectangular cross section, wherein a plurality of cylindrical surfaces inclined by about 45 degrees in approximately the same direction are formed on the plane of incidence and the exit plane, and wherein the light beams entering each cylindrical surface exit with the cross section thereof turned by about 90 degrees.

54. The semiconductor laser device according to claim 43, wherein the optical element is a dove prism having a trapezoidal cross section, and wherein a plurality of the optical elements are arranged at an angle of about 45 degrees.

55. The semiconductor laser device according to claim 43, wherein the optical element includes a pair of optical units arranged in opposed relation to each other with the center axis thereof inclined by about 45 degrees, the power of the optical units being changed by diffraction only in the direction perpendicular to the center axis thereof.

56. The semiconductor laser device according to claim 43, wherein the beam converter includes a pair of binary optic elements arranged on the incidence side and the exit side, respectively, in predetermined spaced opposed relation with each other, wherein the surfaces of the incidence-side binary optic element and the exit-side binary optic element are formed with a plurality of stepped surfaces symmetric about the center axis inclined by about 45 degrees and having the depth changed so as to change the power only in the direction perpendicular to the center axis, and wherein the laser beams incident at each of the axially symmetric stepped surfaces exit with the cross section thereof turned by about 90 degrees.

57. The semiconductor laser device according to claim 43, wherein the optical element includes an optical unit so structured that the refractive index thereof changes continuously and the power of the optical unit is changed only in the direction perpendicular to the direction of the arrangement thereof, the optical unit being arranged at about 45 degrees with respect to a horizontal surface.

58. The semiconductor laser device according to claim 43, wherein the beam converter includes a plurality of one-dimensional graded index lens elements of an optical glass material whose refractive index is highest on the central surface, and lower closer to the side surface thereof, a plurality of the lens units being coupled to each other with the central surface inclined by about 45 degrees to the horizontal surface.

59. The semiconductor laser device according to claim 43, wherein the beam converter includes a plurality of pairs of semicylindrical graded index lens elements inclined by about 45 degrees and arranged in opposed relation to each other in the same direction on the two surfaces of an optical glass plate, the refractive index of the lens element being highest at the center of the semicircle and progressively decreased outward.

60. The semiconductor laser device according to claim 37, wherein second beam converter comprises a plurality of optical elements each including:
    i. a light receiving portion for receiving the incident light having a first axis of the cross section thereof perpendicular to the optical axis,
    ii. an optical system for turning the first axis of the cross section of the light beam at substantially right angles, and
    iii. a light exit portion for emitting the exit light beams passed through the optical system, and
    wherein the optical elements are arranged with the light receiving portion and the light exit portion linearly adjacently to each other on the same plane so that the optical elements correspond to the radiation surface of each of a plurality of columns of the substantially ladder-shaped laser beams radiated from the beam compressor with shortened intervals of ladder steps.

61. The semiconductor laser device according to claim 60, wherein the optical elements each provide a space defined by reflection surfaces including the first reflection surface vertical and inclined by about 45 degrees with respect to the incident light beams, the second reflection surface being provided parallel to the incident light beams and inclined by about 45 degrees with respect to the horizontal plane, and wherein the third reflection surface are perpendicular to the vertical surface parallel to the incident light beams, parallel to the crossing line between the first reflection surface and the second reflection surface, and inclined by about 45 degrees with respect to the horizontal plane.

62. The semiconductor laser device according to claim 60, wherein the optical element includes a pair of convex cylindrical lenses arranged in predetermined spaced opposed relation with each other with the axes thereof inclined by about 45 degrees.

63. The semiconductor laser device according to claim 60, wherein the beam converter is a one-dimensional array of a plurality of pairs of the convex cylindrical lenses arranged in predetermined spaced opposed relation with each other with the axes thereof inclined by about 45 degrees.

64. The semiconductor laser device according to claim 60, wherein the optical element is a cylindrical lens having a convex lens portion at each side end surface thereof, and a plurality of the optical elements are coupled to each other at an angle of about 45 degrees to the incident light beams.

65. The semiconductor laser device according to claim 60, wherein the beam converter is a one-dimensional array of a plurality of cylindrical lenses having a convex lens portion at each side end surface thereof and coupled to each other at an angle of about 45 degrees to the incident light beams.

66. The semiconductor laser device according to claim 60, wherein the beam converter is a prism of optical glass having a rectangular cross section, wherein a plurality of cylindrical surfaces inclined by about 45 degrees in approximately the same direction are formed on the plane of incidence and the exit plane, and wherein the light beams entering each cylindrical surface exit with the cross section thereof turned by about 90 degrees.

67. The semiconductor laser device according to claim 60, wherein the optical element is a dove prism having a trapezoidal cross section, and wherein a plurality of the optical elements are arranged at an angle of about 45 degrees.

68. The semiconductor laser device according to claim 60, wherein the optical element includes a pair of optical units arranged in opposed relation to each other with the center axis thereof inclined by about 45 degrees, the power of the optical units being changed by diffraction only in the direction perpendicular to the center axis thereof.

69. The semiconductor laser device according to claim 60, wherein the beam converter includes a pair of binary optic elements arranged on the incidence side and the exit side, respectively, in predetermined spaced opposed relation with each other, wherein the surfaces of the incidence-side binary optic element and the exit-side binary optic element are formed with a plurality of stepped surfaces symmetric about the center axis inclined by about 45 degrees and having the depth changed so as to change the power only in the direction perpendicular to the center axis, and wherein the laser beams incident at each of the axially symmetric stepped surfaces exit with the cross section thereof turned by about 90 degrees.

70. The semiconductor laser device according to claim 60, wherein the optical element includes an optical unit so structured that the refractive index thereof changes continuously and the power of the optical unit is changed only in the direction perpendicular to the direction of the arrangement thereof, the optical unit being arranged at about 45 degrees with respect to a horizontal surface.

71. The semiconductor laser device according to claim 60, wherein the beam converter includes a plurality of one-dimensional graded index lens elements of an optical glass material whose refractive index is highest on the central surface, and lower closer to the side surface thereof, a plurality of the lens units being coupled to each other with the central surface inclined by about 45 degrees to the horizontal surface.

72. The semiconductor laser device according to claim 60, wherein the beam converter includes a plurality of pairs of semicylindrical graded index lens elements inclined by about 45 degrees and arranged in opposed relation to each other in the same direction on the two surfaces of an optical glass plate, the refractive index of the lens element being highest at the center of the semicircle and progressively decreased outward.

73. A semiconductor laser ("LD") pumped solid-state laser device, comprising:
a semiconductor laser device, comprising:
i. a stack array laser diode including a plurality of laser beam elements arranged in a plurality of columns in a two-dimensional array in a manner such that each of a plurality of emitters extending in a first direction for emitting laser beams are aligned as a plurality of columns in a direction perpendicular to the first direction,
ii. a first condenser arranged in front of the stack array laser diode for a collimation by refracting each column of the laser beams in a second direction that is substantially perpendicular to the first direction,
iii. a first beam converter arranged in front of the first condenser for receiving the laser beams collimated in the second direction and radiating by converting each group of the laser beams into a substantially ladder-shaped laser beam column that extends in the first direction,
iv. a beam compressor configured to receive a plurality of columns of the substantially ladder-shaped laser beam groups and radiating by converting the columns of the laser beam groups into a plurality of columns of substantially ladder-shaped laser beam groups that are compressed into a form having shorter intervals of ladder steps and extending in the first direction,
v. a second beam converter arranged in front of the beam compressor for receiving the plurality of the columns of the substantially ladder-shaped laser beam groups extending in the first direction with shortened intervals of the ladder steps, and converting each column of the substantially ladder-shaped laser beam groups extending in the first direction into a corresponding column of substantially ladder-shaped laser beam groups extending in the second direction, wherein all of the laser beams are converted into substantially ladder-shaped laser beam groups that are aligned in the second direction,
vi. a second condenser configured for a parallelization by collimating the substantially ladder-shaped aligned laser beams in the direction substantially perpendicular to the second direction, and
vii. a third condenser configured to condense the laser beams radiated from the second condenser at a focal point; and
a solid-state laser element having an exciting light receiving surface matched at the focal point of the third condenser.

74. A semiconductor laser ("LD") pumped solid-state laser device, comprising:
a semiconductor laser device, comprising:
i. a stack array laser diode including a plurality of laser beam elements arranged in a two-dimensional array, each of the laser beam elements including a plurality of emitters, wherein the emitter are one of:
a. aligned in a first direction in a plurality of columns for radiating laser beams, and
b. aligned closely to each other in the first direction in a plurality of substantially continuously aligned columns of laser beams so that the columns are radiated as the laser beams,
ii. a first condenser arranged in front of the stack array laser diode for a collimation by refracting each column of the laser beams in a second direction that is substantially perpendicular to the first direction,
iii. a first beam converter arranged in front of the first condenser for dividing the laser beams in each of the columns into laser beam units, a plurality of optical elements being arranged in parallel in each column for bending an axis of a cross section of each of the laser beam units substantially at right angles, the first beam converter receiving the laser beam groups collimated in the second direction, and turning the axis of the cross section of each of the laser beam units for each optical element, thereby radiating the plurality of the divided laser beam units as substantially ladder-shaped laser beams extending in the first direction,
iv. a beam compressor configured to receive the plurality of columns of substantially ladder-shaped laser beams, and converting the laser beams into a plurality of columns of the substantially ladder-shaped laser beams that extend in the first direction with shortened intervals between ladder steps,
v. a second beam converter arranged in front of the beam compressor for receiving a plurality of columns of substantially ladder-shaped laser beams extending in the first direction with shortened intervals between the ladder steps, and converting each column of the substantially ladder-shaped laser beams extending in the first direction into a corresponding column of the substantially ladder-shaped laser beams extending in the second direction, wherein all of the laser beams are radiated by being converted into an alignment of the substantially ladder-shaped laser beams extending in the second direction,
vi. a second condenser configured for a parallelization by collimating the alignment of the substantially ladder-shaped laser beams in the direction that is substantially perpendicular to the second direction, and vii. a third condenser configured to condense the laser beams radiated from the second condenser at a focal point; and a solid-state laser element having an exciting light receiving surface matched at the focal point of the third condenser.

75. A semiconductor laser ("LD") pumped solid-state laser device, comprising:

a semiconductor laser device, comprising:

i. a stack array laser diode including a plurality of laser beam elements arranged in a plurality of columns in a two-dimensional array in a manner such that each of a plurality of emitters extending in a first direction for emitting laser beams are aligned as a plurality of columns in a direction perpendicular to the first direction, ii. a first condenser arranged in front of the stack array laser diode for a collimation by refracting each column of the laser beams in a second direction that is substantially perpendicular to the first direction, iii. a first beam converter arranged in front of the first condenser for receiving the laser beams collimated in the second direction and radiating by converting each group of the laser beams into a substantially ladder-shaped laser beam column that extends in the first direction, iv. a beam compressor configured to receive a plurality of columns of the substantially ladder-shaped laser beam groups and radiating by converting the columns of the laser beam groups into a plurality of columns of substantially ladder-shaped laser beam groups that are compressed into a form having shorter intervals of ladder steps and extending in the first direction, v. a second beam converter arranged in front of the beam compressor for receiving the plurality of the columns of the substantially ladder-shaped laser beam groups extending in the first direction with shortened intervals of the ladder steps, and converting each column of the substantially ladder-shaped laser beam groups extending in the first direction into a corresponding column of substantially ladder-shaped laser beam groups extending in the second direction, wherein all of the laser beams are converted into substantially ladder-shaped laser beam groups that are aligned in the second direction, vi. a second condenser configured for a parallelization by collimating the substantially ladder-shaped aligned laser beams in the direction substantially perpendicular to the second direction, vii. a third condenser configured to condense the laser beams radiated from the second condenser at a focal point, and viii. an optical fiber having an end surface arranged in a focal plane of the third condenser;

an optical system for collimating and condensing the light emitted from the optical fiber at a focal point; and a solid-state laser element having an exciting light receiving surface matched at the focal point.

76. A semiconductor laser ("LD") pumped solid-state laser device, comprising:

a semiconductor laser device, comprising:

i. a stack array laser diode including a plurality of laser beam elements arranged in a two-dimensional array, each of the laser beam elements including a plurality of emitters, wherein the emitter are one of:

a. aligned in a first direction in a plurality of columns for radiating laser beams, and b. aligned closely to each other in the first direction in a plurality of substantially continuously aligned columns of laser beams so that the columns are radiated as the laser beams, ii. a first condenser arranged in front of the stack array laser diode for a collimation by refracting each column of the laser beams in a second direction that is substantially perpendicular to the first direction, iii. a first beam converter arranged in front of the first condenser for dividing the laser beams in each of the columns into laser beam units, a plurality of optical elements being arranged in parallel in each column for bending an axis of a cross section of each of the laser beam units substantially at right angles, the first beam converter receiving the laser beam groups collimated in the second direction, and turning the axis of the cross section of each of the laser beam units for each optical element, thereby radiating the plurality of the divided laser beam units as substantially ladder-shaped laser beams extending in the first direction, iv. a beam compressor configured to receive the plurality of columns of substantially ladder-shaped laser beams, and converting the laser beams into a plurality of columns of the substantially ladder-shaped laser beams that extend in the first direction with shortened intervals between ladder steps, v. a second beam converter arranged in front of the beam compressor for receiving a plurality of columns of substantially ladder-shaped laser beams extending in the first direction with shortened intervals between the ladder steps, and converting each column of the substantially ladder-shaped laser beams extending in the first direction into a corresponding column of the substantially ladder-shaped laser beams extending in the second direction, wherein all of the laser beams are radiated by being converted into an alignment of the substantially ladder-shaped laser beams extending in the second direction, vi. a second condenser configured for a parallelization by collimating the alignment of the substantially ladder-shaped laser beams in the direction that is substantially perpendicular to the second direction, vii. a third condenser configured to condense the laser beams radiated from the second condenser at a focal point, and viii. an optical fiber having an end surface arranged in a focal plane of the third condenser;

an optical system for collimating and condensing the light emitted from the optical fiber at a focal point; and a solid-state laser element having an exciting light receiving surface matched at the focal point.

77. A semiconductor laser device, comprising a two-dimensional semiconductor laser source, a first condenser, a first beam converter, a beam compressor, a second beam converter, a second condenser, and a focusing lens;

wherein said two-dimensional semiconductor laser source is configured to stack a plurality of linear array semiconductor lasers for emitting a two-dimensional laser beam group which includes a plurality of linear array semiconductor laser beams having aligned dashed line segments, said first condenser collimates said two-dimensional laser beam group from said two-dimensional array semiconductor laser source by refracting each array of said two-dimensional laser beam group in a substantially perpendicular direction to linear array direction, said first beam converter receives said collimated two-dimensional laser beam group and converts into a two-dimensional laser beam group in which laser beam segments of each array are aligned in parallel by rotating each segment, by about 90 degrees, of each array of the laser beam group, said beam compressor receives the converted two-dimensional laser beam group and emits a compressed converted two-dimensional laser beam group in which each segment intervals of each array of the laser beam group compressed into shorter intervals, said second beam converter receives said compressed converted two-dimensional laser beam group and converts into a single laser beam group aligned in parallel within a single column in a substantially perpendicular to said array direction by rotating each row, by about 90 degrees, of the laser beams aligned in the array direction of the two-dimensional laser beam group, said second condenser collimates said laser beam group emitted from said second beam converter in the array direction, and said focusing lens is configured to be a third condenser for condensing the laser beams emitted from said second condenser at a focal point.

78. A semiconductor laser device, comprising a two-dimensional semiconductor laser source, a first condenser, a first beam converter, a beam compressor, a second beam converter, a second condenser, and a focusing lens;

wherein said two-dimensional semiconductor laser source is configured to stack a plurality of linear array semiconductor lasers for emitting a two-dimensional laser beam group which includes a plurality of linear array semiconductor laser beams having aligned continuous elements or quasi-continuous elements, said first condenser collimates said two-dimensional laser beam group from said two-dimensional array semiconductor laser source by refracting each array of said two-dimensional laser beam group in a substantially perpendicular direction to linear array direction, said first beam converter receives said collimated two-dimensional laser beam group and converts into a two-dimensional laser beam group in which laser beam segments of each array are aligned in parallel by rotating each segment, by about 90 degrees, of each array of the laser beam group, said beam compressor receives the converted two-dimensional laser beam group and emits a compressed converted two-dimensional laser beam group in which each segment intervals of each array of the laser beam group compressed into shorter intervals, said second beam converter receives said compressed converted two-dimensional laser beam group and converts into a single laser beam group aligned in parallel within a single column in a substantially perpendicular to said array direction by rotating each row, by about 90 degrees, of the laser beams aligned in the array direction of the two-dimensional laser beam group, said second condenser collimates said laser beam group emitted from said second beam converter in the array direction, and said focusing lens is configured to be a third condenser for condensing the laser beams emitted from said second condenser at a focal point.

* * * * *